(12) United States Patent
Kodama et al.

(10) Patent No.: US 7,181,307 B2
(45) Date of Patent: Feb. 20, 2007

(54) ELECTRONIC CIRCUIT COMPONENT MOUNTING SYSTEM, MOUNTING CONTROL PROGRAM, AND SYSTEM TO PREVENT ERRONEOUS SETTING OF ELECTRONIC CIRCUIT COMPONENTS

(75) Inventors: Seigo Kodama, Aichi-ken (JP); Masayuki Tashiro, Nishio (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 647 days.

(21) Appl. No.: 10/388,704

(22) Filed: Mar. 17, 2003

(65) Prior Publication Data
US 2004/0080897 A1   Apr. 29, 2004

(30) Foreign Application Priority Data
Mar. 18, 2002   (JP) .............................. 2002-074768

(51) Int. Cl.
*G06F 19/00*   (2006.01)
(52) U.S. Cl. ......................................... 700/121; 700/95
(58) Field of Classification Search ............. 700/95.97, 700/121, 241, 242; 29/740, 832
See application file for complete search history.

(56) References Cited

U.S. PATENT DOCUMENTS 5,926,950 A * 7/1999 Asai et al. ..................... 29/832
6,088,911 A * 7/2000 Isogai et al. ................... 29/740
6,256,869 B1 * 7/2001 Asai et al. ..................... 29/740
6,971,161 B1 * 12/2005 Maenishi et al. ............. 29/832

FOREIGN PATENT DOCUMENTS

| JP | A 6-224594 | 8/1994 |
|---|---|---|
| JP | A 2002-512733 | 4/2002 |
| JP | B2 3326840 | 7/2002 |
| JP | A 2002-223100 | 8/2002 |
| JP | B2 3335675 | 8/2002 |

* cited by examiner

*Primary Examiner*—Albert W. Paladini
*Assistant Examiner*—Chad Rapp
(74) *Attorney, Agent, or Firm*—Oliff & Berridge, PLC

(57) ABSTRACT

An electronic component mounting system including an electronic component mounter and a control device for controlling the mounter. When the control device detects an exhaust component during a series of component mounting operations, the control device checks a memory to determine whether the exhausted component belongs to an electronic component group consisting of a plurality of mutually substitutable components, and if the exhausted component belongs to the group, the control device designates one of the mutually substitutable components as a substitute component for the exhausted component, and controls the mounter to receive the substitute component from another component supplying device different from the supplying device for the exhausted component, and to mount it on a circuit substrate. This system assures improved efficiency of operation of the system by eliminating an interruption of the mounting operation for loading the supplying device with the exhausted components.

25 Claims, 24 Drawing Sheets

FIG. 7

MOUNTING PROGRAM

| ORDER OF MOUNTING | X | Y | Q | COMPONENTS | SLOT NUMBER |
|---|---|---|---|---|---|
| SQ1: | X1, | Y1, | | PART DATA 1 | 1 |
| SQ2: | X2, | Y2, | | ELECTRONIC CIRCUIT COMPONENT GROUP I | 2, 3 |
| SQ3: | X3, | Y3, | | PART DATA 2 | 4 |
| ⋮ | ⋮ | ⋮ | ⋮ | ⋮ | ⋮ |

FIG. 8

ELECTRONIC CIRCUIT COMPONENT SETTING DATA

| FEEDER SETTING POSITION (SLOT NUMBER) | FEEDER | ELECTRONIC CIRCUIT COMPONENT |
|---|---|---|
| 1 | F A | PART ID1 |
| 2 | | ELECTRONIC CIRCUIT COMPONENT GROUP I |
| | F A | PART ID2 |
| | F B | PART ID3 |
| | F B | PART ID4 |
| | ⋮ | ⋮ |
| 3 | | ELECTRONIC CIRCUIT COMPONENT GROUP I |
| | F A | PART ID2 |
| | F B | PART ID3 |
| | F B | PART ID4 |
| | ⋮ | ⋮ |
| 4 | F D | PART ID7 |
| ⋮ | ⋮ | ⋮ |

FIG. 13

ELECTRONIC CIRCUIT COMPONENT GROUP DATA PORTION

ELECTRONIC CIRCUIT COMPONENT GROUP I

|  | EFFECTIVE TERM OF USE | PRIORITY ORDER |
|---|---|---|
| ELECTRONIC CIRCUIT COMPONENT 1 | | |
| ELECTRONIC CIRCUIT COMPONENT 2 | | |
| ⋮ | ⋮ | ⋮ |

ELECTRONIC CIRCUIT COMPONENT GROUP II

|  | EFFECTIVE TERM OF USE | PRIORITY ORDER |
|---|---|---|
| ELECTRONIC CIRCUIT COMPONENT N+1 | | |
| ELECTRONIC CIRCUIT COMPONENT N+2 | | |
| ⋮ | ⋮ | ⋮ |

ELECTRONIC CIRCUIT COMPONENT GROUP DATA PORTION

ELECTRONIC CIRCUIT COMPONENT GROUP I

|  | ORDER OF USE | PRIORITY ORDER |
|---|---|---|
| ELECTRONIC CIRCUIT COMPONENT 1 |  |  |
| ELECTRONIC CIRCUIT COMPONENT 2 |  |  |
| ⋮ | ⋮ | ⋮ |

ELECTRONIC CIRCUIT COMPONENT GROUP II

|  | ORDER OF USE | PRIORITY ORDER |
|---|---|---|
| ELECTRONIC CIRCUIT COMPONENT N+1 |  |  |
| ELECTRONIC CIRCUIT COMPONENT N+2 |  |  |
| ⋮ | ⋮ | ⋮ |

⋮

ELECTRONIC CIRCUIT COMPONENT MOUNTING SYSTEM, MOUNTING CONTROL PROGRAM, AND SYSTEM TO PREVENT ERRONEOUS SETTING OF ELECTRONIC CIRCUIT COMPONENTS

BACKGROUND OF THE INVENTION

1. Technical Field

The present invention relates to an electronic circuit component mounting system, an electronic circuit component mounting program, an electronic circuit component mounting program processing system, a mounting-program-related-data preparing program, a system to prevent erroneous setting of electronic circuit components on component setting portions, and a system to prevent erroneous setting of the electronic circuit components on a component supply device, and more particularly to utilization of electronic circuit components of a plurality of kinds that are mutually substitutable.

2. Related Art

Electronic circuit components are components to be mounted on a circuit substrate such as a printed-wiring board, to form electronic circuits. To mount the electronic circuit components on the circuit substrate, an operation to mount the electronic circuit components is performed according to a mounting program, which has been prepared so as to indicate the electronic components to be respectively mounted at a plurality of mounting positions on the circuit substrate. At this time, the electronic circuit components are considered to be of different kinds, if those electronic circuits components are different from each other in at least one of their characteristics such as electric properties, manufacturer, shape and dimensions. For instance, the electronic circuit components of a plurality of kinds having different shapes and dimensions are treated as different kinds of electronic circuit components, even if those electronic circuit components have the same electric properties and are mutually substitutable as electronic circuit components that can be used on the circuit substrate, without any problem. This treatment is inconvenient. Where an electronic circuit component to be mounted at a certain mounting position is out of stock while electronic circuit components of other kinds that are substitutable for the electronic circuit component out of stock are in stock, for example, the electronic circuit components of those other kinds in stock can be mounted on the circuit substrate, only after the mounting program is modified to change the kind of the electronic component to be mounted at the mounting position in question. This modification is cumbersome and requires considerable knowledge and time.

On the other hand, an electronic circuit component mounting system disclosed in JP-A-6-224594 is arranged to input data indicative of a plurality of combinations of electronic circuit components, so that a selected one of different kinds of electronic circuit components can be mounted at each mounting position. That is, the electronic circuit component mounting system is arranged to store a plurality of data sets indicative of respective different kinds of electronic circuit components that can be mounted at each of the mounting positions on the circuit substrate, so that an appropriate one of the data sets is selectively used according to the kind of the electronic circuit component to be mounted. This arrangement permits mutual substitution of the electronic components without interruption of the mounting operation to change the mounting program.

SUMMARY OF THE INVENTION

However, the electronic circuit component mounting system described in the above-identified publication requires a cumbersome operation to input a plurality of combinations of the electronic circuit components.

The present invention was made in the light of the background art described above. It is an object of the present invention to facilitate utilization of electronic circuit components of a plurality of kinds that are mutually substitutable. This object can be achieved according to any one of the following modes of the present invention in the form of an electronic circuit component mounting system, an electronic circuit component mounting control program, an electronic circuit component mounting program processing system, a mounting-program-related-data preparing method, a mounting-program-related-data preparing program, a system to prevent erroneous setting of electronic circuit components on component setting portions, a system to prevent erroneous setting of the electronic circuit components on component supply devices, a program to prevent erroneous setting of the electronic circuit components on the component setting portions, and a program to prevent erroneous setting of the electronic circuit components on the component supply devices. Each of these modes is numbered like the appended claims and depends from the other mode or modes, where appropriate, for easier understanding of the present invention. It is to be understood that the present invention is not limited to technical features or any combinations thereof which will be described. It is to be further understood that a plurality of elements or features included in any one of the following modes of the invention are not necessarily provided all together, and that the invention may be embodied with selected at least one of the elements or features described with respect to the same mode.

(1) An electronic circuit component mounting system comprising:

a substrate holding device for holding a circuit substrate;

a component supply device for supplying electronic circuit components;

a mounting device for receiving the electronic circuit components from the component supply device and mounting the electronic circuit components on the circuit substrate held by the substrate holding device;

a component-group memory for storing group data indicative of at least one electronic-circuit-component group each consisting of a plurality of different electronic circuit components;

a program memory for storing a mounting program which correlates each of a plurality of mounting positions on the above-indicated circuit substrate, with a corresponding one of the electronic circuit components to be respectively mounted at the mounting positions, or one of the above-indicated at least one electronic-circuit-component group; and a control device for controlling the above-indicated mounting device, according to the above-indicated mounting program, to mount the above-indicated corresponding one electronic circuit component at each mounting position correlated with the above-indicated corresponding one electronic circuit component, and to mount one of the different electronic circuit components belonging to the above-indicated one electronic-circuit-component group, at each mounting position correlated with the above-indicated one electronic-circuit-component group.

Examples of the circuit substrate include: printed-wiring board on which no electric components have been mounted; a printed-wiring board on which electric components have been mounted at a portion of a printed wiring; a printed-circuit board with electric components being already mounted on one of its opposite surfaces and soldered for electric connection; and a small-sized circuit substrate on which a small number of electric components are to be mounted.

Examples of the mounting device include: (a) a device including a plurality of component mounting heads or component holding devices and arranged to turn those component mounting devices about a common axis of turning, by a component-holding-device moving device in the form of a component-holding-device turning device, for thereby stopping the component-holding devices at a plurality of stop positions one after another, to receive electric components from an electric-component supply device and mounting the electric components on the circuit substrate; (b) a device including at least one component-holding device and arranged to move the component-holding device in a plane of movement parallel to a surface of the circuit substrate, in a direction having components of two mutually perpendicular directions, by a component-holding-device moving device, to desired positions in the plane of movement for receiving and mounting the electric components; and (c) a device including at least one component-holding device and arranged to linearly move the component-holding device in a plane of movement parallel to a surface of the circuit substrate, in one of two mutually perpendicular directions, by a component-holding-device moving device.

Where the mounting device is of the type (a), the substrate holding device is translated by a substrate-holding-device moving device, in a plane of movement parallel to a surface of the circuit substrate, in a direction having components of two mutually perpendicular directions, and the electric-component supply device has a plurality of feeders set on a movable table, which is moved by a movable-table moving device along a line along which component supply portions of the plurality of feeders are arranged. Where the mounting device is of the type (b), the substrate holding device and the electric-component supply device are fixedly disposed so as to be stationary. Where the mounting device is of the type (c), the substrate holding device is linearly moved by a substrate-holding-device moving device in the plane of movement parallel to the surface of the circuit substrate, in the other of the two mutually perpendicular directions, which is different from the direction in which the component-holding device is moved. The component supply device may be fixedly disposed such that its component supply portions are stationary in an area of movement of the component-holding device, or may be provided with the feeders set on the movable table, which is moved by the movable-table moving device along the line along which the component supply portions are arranged.

Where the mounting device is moved in a plane of movement or along a straight line, the mounting device may be given another motion. For example, the mounting device includes a rotary table (e.g., intermittently rotating table) which carries a plurality of component-holding devices and which is rotatable. This rotary table is moved in a plane of movement in direction having components of two mutually perpendicular directions, so that the rotary table is given a composite motion consisting of a rotary motion and a translating motion to permit the component-holding devices to the mounting positions on the circuit substrate at which the electric components are to be mounted. In this instance, the axis of rotation of the rotary table may be perpendicular to or inclined with respect to the plane of movement. A component-receiving position of the rotary table at which the component-holding devices receive the electric components, and a component-mounting position of the rotary table at which the component-holding devices mount the electric components on the printed board may be the same or different from each other.

The component-group memory may be a memory which stores all of the electronic-circuit-component groups, or only some of the electronic-circuit-component groups. Alternatively, the component-group memory may consist of a plurality of memories which store the respective electronic-circuit-component groups and cooperate to store all of the groups.

The mounting program is prepared so as to correlate one of the at least one electronic-circuit-component group with each of at least one or all of the mounting positions on the circuit substrate.

The plurality of different electronic circuit components belonging to the same group are mutually substitutable electronic circuit components. Any one of the mutually substitutable electronic circuit components can be mounted at the same mounting position, without a problem with an electronic circuit formed by that component. A representative example of a group of mutually substitutable electronic circuit components is a group of electronic circuit components which have substantially the same electrical characteristic (electric rating). However, electronic circuit components having relatively wide ranges of tolerance of the electrical characteristic may also be considered to be a group of mutually substitutable electronic circuit components. The electronic circuit components having the same electrical characteristic may be manufactured by different manufacturers and may have different shapes, sizes or types of packaging. Although these electronic circuit components are different in kind from each other, these different kinds of electronic circuit components are substitutable for each other and are considered to belong to the same group. Further, electronic circuit components having a relatively wide range of tolerance of the electrical characteristic may include a plurality of different kinds of components which have different electrical characteristics but constitute a group of mutually substitutable electronic circuit components.

Therefore, when the electronic circuit components are mounted on the circuit substrate according to the mounting program, any one of the different electronic circuit components belonging to a given electronic-circuit-component group can be mounted at the mounting position correlated with that group. According to the mounting program stored in the program memory and the data of the electronic-circuit-component group or groups stored in the component-group memory, the control device can control the mounting device so as to mount one of the electronic circuit components belonging to the group at the mounting position correlated with that group. Where the mounting program is prepared such that some of the mounting positions are correlated with the respective electronic circuit components, while each of the other of the mounting positions is correlated with one electronic-circuit-component group, all of the mounting positions are correlated with the respective electronic circuit components or respective electronic-circuit-component groups, in the same manner, and the control device controls the mounting device according to the correlating data. Accordingly, the electronic circuit components are mounted at the respective mounting positions which are partly correlated with the electronic-circuit-component group or groups and partly correlated with the electronic circuit components, without requiring the operator to take a special care or perform a special operation.

The mounting program which correlates some of the mounting positions with one electronic-circuit-component group or groups permits any one of the plurality of electronic circuit components belonging to the group, to be mounted at each of those mounting positions, so that it is not necessary to prepare a plurality of different mounting programs corresponding to the respective electronic circuit components of a group, which are selectively mounted at each of at least one of the mounting positions. Namely, only one mounting program and the group data are sufficient to permit mounting of a selected one of the plurality of electronic circuit components, and permit utilization of a plurality of mutually substitutable electronic circuit components, without reduction of the mounting efficiency due to a need of changing the mounting program, or a considerable effort to prepare a plurality of different mounting programs.

It is obvious that the invention according to the present mode (1) can be practiced where the same one electronic circuit component does not belong to a plurality of different electronic-circuit-component groups. However, it will also be understood that the invention according to the present mode can be practiced also where the same electronic circuit component belongs to a plurality of different electronic-circuit-component groups. Namely, the electronic circuit components of one group may be different from the electronic circuit components of another group, depending upon the electronic circuit to be formed, or depending upon the mounting positions of the electronic circuit components. In this case, the same one electronic circuit component belongs to a plurality of different electronic-circuit-component groups. In this case, too, the mounting program according to the present mode (1) is prepared such that some of the mounting positions are correlated with the respective different electronic-circuit-component groups, so that any one of the electronic circuit components of each group is mounted at the mounting position correlated with that group. Thus, even if the same component belongs to the plurality of electronic-circuit-component groups, there is not a possibility of mounting of an electronic circuit component that should not be mounted at the mounting position in question.

A care should be taken, however, where a process of preparing mounting-program-related data in the form of substitution design data which will be described includes a step of determining an electronic-circuit-component group on the basis of an electronic circuit component, as in a case wherein data of that electronic circuit component are converted into data of the electronic-circuit-component data, where the electronic circuit component which is correlated with the corresponding mounting position by CAD data belongs to the group. If the same electronic circuit component corresponds to a plurality of electronic-circuit-component groups, an inadequate electronic circuit component may be subsequently mounted on the basis of the electronic-circuit-component group data, if an inadequate one of the electronic-circuit-component groups is selected. Where the preparation of the substitution design data includes the step of determining the electronic-circuit-component group on the basis of the electronic circuit component, therefore, it is necessary to determine the plurality of electronic-circuit-component groups, so as to prevent the same one electronic circuit component from belonging to the plurality of electronic-circuit-component groups.

(2) The electronic circuit component mounting system according to the above mode (1), wherein the above-indicated control device includes a mounted-component selecting portion operable when each one of the plurality of mounting positions is correlated with one of the above-indicated at least one electronic-circuit-component group, the mounted-component selecting portion selecting, as a mounted electronic circuit component to be mounted at the above-indicated one mounting position, one of the plurality of different electronic circuit components belonging to the above-indicated one electronic-circuit-component group, according to a predetermined rule.

In the invention according to the present mode (2), one of the plurality of different electronic circuit components belonging to the same one group is automatically selected according to the predetermined rule.

The selection of the mounted electronic circuit component may be made prior to the initiation of a series of component mounting operation or during the component mounting operation. In the former case, the mounting program may be changed so as to correlate each selected mounted electronic circuit component with the corresponding mounting position, or a data set indicative of each selected mounted electronic circuit component may be prepared for each mounting position correlated with any electronic-circuit-component group, without changing the mounting program per se. Where the mounting program is changed, the original mounting program prior to the selection of the mounted electronic circuit component or components may be retained even after the original mounting program has been changed. In this case, the original mounting program can be repeatedly used.

(3) The electronic circuit component mounting system according to the above mode (2), wherein the above-indicated component-group memory stores data indicative of an order of priority of the plurality of different electronic circuit components belonging to each of the above-indicated at least one electronic-circuit-component group, and the above-indicated mounted-component selecting portion selects the different electronic circuit components of each group, as the above-indicated mounted electronic circuit component, in the order of priority.

The order of priority may change during the mounting of the electronic circuit components, or may be fixed at least from the moments of initiation and termination of the series of component mounting operation. The order of priority is determined by various factors. For example, the priority is increased with an increase in the degree of similarity of the shape, dimensions, electrical characteristics, etc. of the electronic circuit components to those required at the mounting position in question, or with a decrease in the cost of manufacture of the components.

(4) The electronic circuit component mounting system according to the above mode (2) or (3), wherein the above-indicated component-group memory stores data indicative of an effective term of use of each of the plurality of different electronic circuit components belong to each of the above-indicated at least one electronic-circuit-component group, and the above-indicated mounted-component selecting portion includes:
  a present-time obtaining portion for obtaining a present time; and
  a component-mounting inhibiting portion for inhibiting mounting of any one of the different electronic circuit components of the above-indicated each electronic-circuit component group the effective term of which has expired prior to the present time obtained by the above-indicated present-time obtaining portion.

According to the present mode of the invention, the electronic circuit component whose effective term of use has expired is prevented from being mounted at the corresponding mounting position, to avoid a problem caused by the mounting of this component.

(5) The electronic circuit component mounting system according to any one of the above modes (2)–(4), wherein the above-indicated component-group memory stores data indicative of identification numbers of the plurality of different electronic circuit components belonging to each of the above-indicated at least one electronic-circuit-component group, and the above-indicated mounted-component selecting portion includes:

a mounting-inhibiting-number obtaining portion for obtaining a mounting-inhibiting number which is the identification number of each electronic circuit component of the above-indicated each electronic-circuit component group, which is not presently permitted to be mounted at the corresponding mounting position; and a component-mounting inhibiting portion for inhibiting mounting of a mounting-inhibited component of the above-indicated each electronic-circuit-component group which has the mounting-inhibiting number obtained by the above-indicated mounting-inhibiting-number obtaining portion.

For example, the control device receives a mounting-permitting threshold number from a host computer, and obtains the mounting-inhibiting numbers which are the identification numbers of the electronic circuit components that are smaller or larger than the mounting-permitting threshold number. The mounting of the electronic circuit components whose identification numbers are other than those mounting-inhibiting numbers is permitted. In this respect, the electronic circuit component mounting system according to the present mode of the invention can be considered to include a mounting-permitting-number obtaining portion as well as the mounting-inhibiting-number obtaining portion.

(6) The electronic circuit component mounting system according to any one of the above modes (2)–(5), wherein the above-indicated component supply device includes:

a plurality of feeders each accommodating a multiplicity of electronic circuit components of one kind and arranged to feed these electronic circuit components to a predetermined fixed component supply portion;

a table on which the feeders are set such that the component supply portions of the feeders are arranged along a line; and a table drive device for moving the table in a direction parallel to the above-indicated line, to position the component supply portion of each of the plurality of feeders to a predetermined component supply position, and wherein the above-indicated mounted-component selecting portion includes a proximity-component selecting portion for selecting, as the above-indicated mounted electronic circuit component, one of the plurality of different electronic circuit components belonging to the above-indicated one electronic-circuit-component group, which is to be supplied from the feeder that is presently located nearest to the component supply position.

Where some of the plurality of different electronic circuit components belonging to the group in question are set on the table, one of the components on the table which is to be supplied from the feeder presently located nearest to the component supply position is selected as the mounted electronic circuit component. Where only one of the different electronic circuit components is set on the table, this component on the table is selected as the electronic circuit component to be supplied from the feeder located nearest to the component supply position, that is, as the mounted electronic circuit component.

The present mode of the invention is particularly preferable where one of the electronic circuit components of the group is selected during the operation to mount the electronic circuit components on the circuit substrate. The feeder presently located nearest to the component supply position may be the feeder accommodating the electronic circuit component which is originally assigned to be mounted at the mounting position correlated with the electronic-circuit-component group in question, or the feeder accommodating the electronic circuit component which is originally assigned to be mounted at another mounting position (correlated with another electronic-circuit-component group or one of the electronic circuit components).

The mounted electronic circuit component may be selected from all of the electronic circuit components which include at least two of the plurality of different electronic circuit components which belong to the electronic-circuit-component group in question and which are set in the component supply device. Alternatively, the mounted electronic circuit component may be selected from only the different electronic circuit components belonging to the electronic-circuit-component group. In the latter case, the electronic circuit components which belong to the electronic-circuit-component group and which are set in the component supply device are considered to be the electronic circuit components exclusively provided as substitute components.

The present mode of the invention makes it possible to reduce a required distance of movement of the table to supply the electronic circuit component to be mounted at the mounting position correlated with the electronic-circuit-component group in question, resulting in a shortened mounting cycle time and an improvement in the mounting efficiency.

(7) The electronic circuit component mounting system according to any one of the above modes (2)–(5), wherein the above-indicated component supply device includes:

a plurality of feeders each accommodating a multiplicity of electronic circuit components of one kind and arranged to feed these electronic circuit components to a predetermined fixed component supply portion; and a table which is fixedly disposed and on which the feeders are set such that the component supply portions of the feeders are arranged along a line, and wherein the above-indicated mounted-component selecting portion includes a last-supplied-component-dependent selecting portion for selecting, as the above-indicated mounted electronic circuit component, one of the plurality of different electronic circuit components belonging to the above-indicated one electronic-circuit-component group, which is to be supplied from the feeder that is presently located nearest to the feeder from which the last electronic component was supplied.

The present mode of the invention makes it possible to reduce a required distance of movement of the mounting device to receive from the component supply device one of the electronic circuit components belonging to the electronic-circuit-component group, resulting in an improvement in the efficiency of mounting of the electronic circuit components, where the plurality of feeders are set on the table in the order in which the electronic circuit components to be supplied from those feeders are to be mounted on the circuit board, and where the electronic circuit components are mounted at the respective mounting positions on the circuit substrate, in the order of arrangement of the mounting positions on the circuit substrate.

(8) The electronic circuit component mounting system according to any one of the above modes (2)–(5), wherein the above-indicated component supply device includes a plurality of component supplying devices each accommodating a multiplicity of electronic circuit components of one kind and arranged to feed these electronic circuit components one after another, and the above-indicated mounted-component selecting portion includes an available-component selecting portion for selecting, as the above-indicated mounted electronic circuit component, one of the plurality of different electronic circuit components belonging to each of the above-indicated at least one electronic-circuit-component group, which can be actually supplied from a corresponding one of the above-indicated plurality of component supplying devices.

The component supplying devices indicated above may be a plurality of feeders each accommodating a multiplicity of electronic circuit components of one kind and arranged to feed these electronic circuit components to a predetermined fixed component supply portion, or a plurality of trays each having a multiplicity of two-dimensionally arranged component accommodating recesses accommodating respective electronic circuit components and arranged such that the electronic circuit components are supplied directly from the respective component accommodating recesses.

All of the plurality of different electronic circuit components belonging to the same electronic-circuit-component group may be accommodated in the respective component supplying devices of the same kind. Alternatively, those electronic circuit components of the group may be accommodated in the component supplying devices of different kinds.

The electronic circuit component "that can be actually supplied" is interpreted to mean the electronic circuit component corresponding to the component supplying device which is actually set in the component supply device, or the above-indicated electronic circuit component which has not been exhausted in the component supplying device in question.

(9) The electronic circuit component mounting system according to any one of the above modes (2)–(7), wherein the above-indicated component supply device includes a plurality of component supplying devices each accommodating a multiplicity of electronic circuit components of one kind and arranged to feed these electronic circuit components one after another, and the above-indicated mounted-component selecting portion includes a largest-storage-component selecting portion for selecting, as the above-indicated mounted electronic circuit component, one of the plurality of different electronic circuit components belonging to each of the above-indicated at least one electronic-circuit-component group, which is actually accommodated by a largest number in a corresponding one of the above-indicated plurality of component supplying devices.

The present mode of the invention prevents early exhaustion of the electronic circuit components whose numbers of storage are comparatively small, due to the supplying of these components before the electronic circuit components whose number of storage are comparatively large.

(10) An electronic circuit component mounting system comprising:
a substrate holding device for holding a circuit substrate;
a component supply device for supplying electronic circuit components of a plurality of kinds;
a mounting device for receiving the electronic circuit components from the component supply device and mounting the electronic circuit components on the circuit substrate held by the above-indicated substrate holding device;
a program memory for storing a mounting program which correlates each of a plurality of mounting positions on the above-indicated circuit substrate, with a corresponding one of the electronic circuit components of the above-indicated plurality of kinds to be respectively mounted at the mounting positions;
a component-group memory for storing group data indicative of at least one electronic-circuit-component group each consisting of a plurality of mutually substitutable different electronic circuit components; and
a control device for controlling the above-indicated mounting device, according to the above-indicated mounting program, to mount the above-indicated corresponding one electronic circuit component at each mounting position correlated with the above-indicted corresponding one electronic circuit component, and if the above-indicated corresponding one electronic circuit component is absent in the above-indicated component supply device and if the above-indicated corresponding one electronic circuit component belongs to any one of the above-indicated at least one electronic-circuit-component group, controlling the mounting device to mount, at the mounting position correlated with the above-indicated corresponding one electronic circuit component, one of the mutually substitutable different electronic circuit components of the above-indicated one electronic-circuit-component group, if the above-indicated one of the mutually substitutable different electronic circuit components is actually present in the above-indicated component supply device.

The above-described case "if the above-indicated corresponding one electronic circuit component is absent in the above-indicated component supply device" includes both a case where the electronic circuit component correlated with the mounting position in question was accommodated in the component supply device but has been exhausted or considered to have been exhausted (this case being referred to as "exhaustion of the component"), and a case where the electronic circuit component correlated with the mounting position in question was originally not accommodated in the component supply device, while only the electronic circuit components substitutable for the correlated component are accommodated in the component supply device (this case being referred to as "intentional absence of the component"). In either of these cases, the electronic circuit components substitutable for the correlated component are accommodated in the component supply device, so that one of the substitutable components is supplied in place of the correlated component, and is mounted without a problem.

If there are available a plurality of components substitutable for the correlated component, one of those substitutable components is selected as the mounted electronic circuit components, according to any one of the predetermined rules as described above with respect to the above modes (2) through (9), or a combination of those rules.

The substitutable component may be the electronic circuit component correlated with any one of the mounting positions, or the electronic circuit component which is provided exclusively as a substitute component. In the former case, the substitutable component is supplied from a component supplying device set on the component supply device for the purpose of accommodating the electronic circuit component which is to be mounted at another mounting position. In the latter case, the substitute component is selected as one of the mutually substitutable different electronic circuit components of the group to which the electronic circuit component correlated with the mounting position in question belongs, in the case where the correlated electronic circuit component is out of stock, for example. In this case, this substitute component is accommodated in a component supplying device of the component supply device.

The group data stored in the component-group memory permit a determination as to whether the correlated electronic circuit component absent in the component supply device belongs to the electronic-circuit-component group in question. If this component belongs to the electronic-circuit-component group, the mounting device is controlled to mount one of the substitutable components of the group. By utilizing the group data indicative of electronic-circuit-component group stored in the component-group memory, one of the electronic circuit components belonging to the electronic-circuit-component group can be mounted on the circuit substrate, without having to change the mounting program, even in the absence of the originally specified electronic circuit component. Accordingly, the operation to mount the electronic circuit components on the circuit substrate can be continuously performed even in the case of the "exhaustion of the component", or can be initiated even in the case of the "intentional absence".

(11) The electronic circuit component mounting system according to the above mode (10), wherein the above-indicated control device includes a substitute-component designating portion operable prior to initiation of a series of component mounting operations on a plurality of circuit substrates, to determine whether the electronic circuit component correlated with each of the above-indicated plurality of mounting positions is present in the above-indicated component supply device, the substitute-component designating portion being operable, if the electronic circuit component correlated with any one of the mounting positions is absent in the component supply device and belongs to any one of the above-indicated electronic-circuit-component group, to designate, as a substitute component for the electronic circuit component correlated with the above-indicated one mounting position, one of the other mutually substitutable different electronic circuit components of the one electronic-circuit-component group, which is actually present in the above-indicated component supply device.

The substitute-component designating portion in the present mode of the invention is effective in the case of the "intentional absence of the component" described above. For example, the substitute-component designating portion is arranged to temporarily change the mounting program so as to correlate the substitute component with a non-accommodated component which is correlated with one of the mounting positions but is not accommodated in the component supply device. Alternatively, the substitute-component designating portion is arranged to store in a memory data correlating the non-accommodated component and the substitute component, so that the substitute component is mounted at the mounting position correlated with the non-accommodated component.

(12) The electronic circuit component mounting system according to the above mode (10) or (11), wherein the above-indicated control device includes:

a component-exhaustion detecting portion operable during a series of component mounting operation on a plurality of circuit substrates, to detect exhaustion of the electronic circuit component correlated with each of the above-indicated plurality of mounting positions in the above-indicated component supply device; and a substitute-component designating portion operable, if the exhaustion of the electronic circuit component correlated with any one of the mounting positions is detected by the above-indicated component-exhaustion detecting portion and if the exhausted electronic circuit component belongs to an one of the above-indicated at least one electronic-circuit-component group, to designate, as a substitute component for the electronic circuit component correlated with the above-indicated one mounting position, one of the mutually substitutable different electronic circuit components of the above-indicated one electronic-circuit-component group, which is actually present in the above-indicated component supply device.

The component-exhaustion detecting portion and the substitute-component designating portion in the present mode of the invention are effective in the case of the "exhaustion of the component" described above. The description regarding the substitute-component designating portion with respect to the above mode (11) applies to the substitute-component designating portion in the present mode.

(13) The electronic circuit component mounting system according to any one of the above modes (1)–(12), wherein the above-indicated control device includes data indicative of a mounted-component memory for storing a mounted electronic circuit component which is one of the electronic circuit components belonging to each of the above-indicated at least one electronic-circuit-component group and which is to be actually mounted by the above-indicated mounting device.

The "mounted-component memory" described above preferably stores the above-indicated "one of the electronic circuit components which is to be actually mounted" in relation to at least one of the mounting position at which that electronic circuit component is to be mounted, and the electronic-circuit-component group to which that electronic circuit component belongs. In this case, the electronic circuit component actually mounted on the circuit board can be easily recognized in relation to the corresponding mounting position and electronic-circuit-component group, at a later point of time, from the information in the mounted-component memory, which is outputted by an output device, for example, indicated on a display or printed by a printer.

Where specific codes are assigned to printed-wiring boards, the electronic circuit components to be mounted are desirably stored in relation to this code. In this case, the electronic circuit components actually mounted on each of the printed-wiring boards can be recognized, so that the administration of the printed-wiring boards can be facilitated. The present mode is particularly advantageous where the electronic circuit components to be actually mounted on the printed-wiring boards are changed during a series of component mounting operation on the printed-wiring boards.

(14) An electronic circuit component mounting control program executed by a computer constituting a principal part of a control device of an electronic circuit component mounting system including a substrate holding device for holding a circuit substrate, a component supply device for supplying electronic circuit components, and a mounting device controlled by the control device to receive the electronic circuit components from the component supply device and mount the electronic circuit components on the circuit substrate held by the above-indicted substrate holding device, the control program comprising:
  a mounting-program reading step of sequentially reading out, one after another from a program memory, portions of a mounting program respectively corresponding to a plurality of mounting positions on the circuit substrate, the mounting program correlating each of the mounting positions with a corresponding one of the electronic circuit components to be respectively mounted at the mounting positions, or one of at least one electronic-circuit-component group each consisting of a plurality of different electronic circuit components; and
  a mounting control step implemented when the mounting position corresponding to one of the portions of the mounting program which has been read out in the mounting-program reading step is correlated with the above-indicated one electronic-circuit-component group, to refer to a component-group memory storing data of the above-indicated at least one electronic-circuit-component group, and control the above-indicated mounting device to receive from the above-indicated component supply device one of the plurality of different electronic circuit components belonging to the above-indicated one electronic-circuit-component group in the component-group memory, and mount the above-indicated one electronic circuit component on the circuit substrate held by the above-indicated substrate holding device.

The feature described above with respect to any one of the above modes (2)–(9) and (13) is applicable to the electronic circuit component mounting control program according to the present mode of the invention.

The advantages described above with respect to the above mode (1) are obtained where the electronic circuit components are mounted on the circuit substrate according to the program described with respect to the present mode.

(15) An electronic circuit component mounting control program executed by a computer constituting a principal part of a control device of an electronic circuit component mounting system including a substrate holding device for holding a circuit substrate, a component supply device for supplying electronic circuit components, and a mounting device controlled by the control device to receive the electronic circuit components from the component supply device and mount the electronic circuit components on the circuit substrate held by the above-indicated substrate holding device, the control program comprising:
  a mounting-program reading step of reading out, one after another from a program memory, portions of a mounting program respectively corresponding to a plurality of mounting positions on the circuit substrate, the mounting program correlating each of the mounting positions with a corresponding one of the electronic circuit components to be respectively mounted at the mounting positions; and
  a mounting control step implemented when the electronic circuit component correlated with the mounting position corresponding to one of the portions of the mounting program which has been read out in the mounting-program reading step is present in the above-indicated component supply device, to control the above-indicated mounting device to receive the electronic circuit component in question from the above-indicated component supply device and mount the electronic circuit component in question on the circuit substrate held by the above-indicated substrate holding device, and when the electronic circuit component in question is absent in the above-indicated component supply device, to refer to a component-group memory storing data of at least one electronic-circuit-component group each consisting of a plurality of different electronic circuit components, and if the electronic circuit component absent in the above-indicated component supply device belongs to any one of the above-indicated at least one electronic-circuit-component group in the component-group memory, to control the above-indicated mounting device to receive from the component supply device one of the different electronic circuit components of the above-indicated one electronic-circuit-component group which is present in the above-indicated component supply device, and mount the above-indicated one electronic circuit component on the circuit substrate held by the above-indicated substrate holding device.

The feature described above with respect to any one of the above modes (11)–(13) is applicable to the electronic circuit component mounting control program according to the present mode of the invention.

The advantages described above with respect to the above mode (10) are obtained where the electronic circuit components are mounted on the circuit substrate according to the program described with respect to the present mode.

(16) An electronic-circuit-component-mounting-program-related-data processing system for processing a mounting-program-related data relating to a mounting program for controlling an operation of an electronic circuit component mounting system wherein electronic circuit components supplied from a component supply device are received by a mounting device, and mounted by the above-indicated mounting device on a circuit substrate held by a substrate holding device, the electronic-circuit-component-mounting-program-related-data processing system comprising:
  a component-group memory for storing group data indicative of at least one electronic-circuit-component group each consisting of a plurality of different electronic circuit components;
  a related-data memory for storing mounting-program-related data which correlate each of a plurality of mounting positions on the circuit substrate, with a corresponding one of the electronic circuit components to be respectively mounted at the mounting positions, or one of the above-indicated at least one electronic-circuit-component group; and
  a processing portion for processing the mounting-program-related data, such that the above-indicated corresponding one electronic circuit component is mounted at each mounting position correlated with the above-indicated corresponding one electronic circuit component, and one of the different electronic circuit components belonging to the above-indicated one electronic-circuit-component group is mounted at each mounting position correlated with the above-indicated one electronic-circuit-component group.

The mounting-program-related data may be a mounting program per se, or data on which the mounting program is prepared.

The electronic-circuit-component-mounting-program-related-data processing system may constitute a part of an electronic circuit component mounting system including a component supply device, a mounting device and a substrate holding device. Alternatively, the present processing system may be a part of a system not including the component supply device, mounting device and substrate holding device.

Where the mounting-program-related-data processing system is constituted by a computer, the system may be constituted by one computer or a plurality of computers. Where the mounting-program-related-data processing system is constituted by one computer, a computer for controlling an electronic circuit component mounting machine may constitute the mounting-program-related-data processing system, or alternatively, a computer connected to that computer may constitute the mounting-program-related-data processing system, for example.

Where the processing system is a part of a system not including the component supply device, mounting device and substrate holding device, the mounting-program-related data are processed by the processing system, such that one of the electronic circuit components belonging to an electronic-circuit-component group is mounted. For example, the processed mounting-program-related data are stored in a recording medium such that the data are readable by a computer of a control device of the electronic circuit component mounting machine. Alternatively, the processed mounting-program-related data are transmitted through an information transmitting line to the computer of the control device of the electronic circuit component mounting machine.

The feature described above with respect to any one of the above modes (2)–(9) and (13) is applicable to the electronic-circuit-component-mounting-program-related-data processing system described with respect to the present mode of the invention.

(17) A mounting-program-related-data preparing method for preparing a mounting-program-related data relating to a mounting program executed by a computer which constitutes a principal part of a control device of an electronic circuit component mounting system including a substrate holding device for holding a circuit substrate, a component supply device for supplying electronic circuit components, and a mounting device controlled by the control device to receive the electronic circuit components from the component supply device and mount the electronic circuit components on the circuit substrate held by the above-indicated substrate holding device, the mounting-program-related-data preparing method comprising:

an original-data storing step of storing in an original-data memory original data which correlate each of a plurality of mounting positions on the above-indicated circuit substrate, with a corresponding one of a electronic circuit components of the above-indicated plurality of kinds to be respectively mounted at the mounting positions;

an electronic-circuit-component-group storing step of storing in a component-group data group data indicative of at least one electronic-circuit-component group each consisting of the plurality of mutually substitutable different electronic circuit components; and a replacing step of determining whether each of the electronic circuit components of the above-indicated original data stored in the above-indicated original-data memory belongs to any one of the above-indicated at least one electronic-circuit-component group stored in the above-indicated component-group data, and when the electronic circuit component in question belongs to any one of the above-indicated at least one electronic-circuit-component group, replacing this electronic circuit component with the electronic-circuit-component group to which the electronic circuit component in question belongs, whereby the above-indicated original data are replaced by substitution data wherein each electronic circuit component of the above-indicated original data which belongs to any one of the above-indicated least one electronic-circuit component group of the above-indicated group data is correlated with the electronic-circuit-component group to which the above-indicated each electronic circuit component belongs.

At least one of the three steps of the present mounting-program-related-data preparing method may be performed by the operator, or all of these three steps may be automatically performed.

The "original data" described above may be design data of a printed-circuit board which are prepared by CAD, or may be an original mounting program prepared on the basis of the design data. In the former case, substitution design data are prepared as the mounting-program-related data. In the latter case, substitution mounting program are prepared as a mounting program per se. The substitution mounting program is prepared by preparing the mounting program on the basis of the substitution design data. The mounting-program-related data "described above may be the mounting program per se, or may be data on which the mounting program is prepared.

In any case, the mounting-program-related data prepared according to the present mode of the invention are used to prepare a mounting program which correlates each of the plurality of mounting positions on the circuit substrate, with the corresponding one of the plurality of electronic circuit components to be respectively mounted on the mounting positions, or one of the at least one electronic-circuit-component group. The prepared mounting program can be used to mount the electronic circuit components on the circuit substrate, in the electronic circuit component mounting system described with respect to any one of the above modes (1)–(9) and (13).

(18) A mounting-program-related-data preparing program for a computer to prepare a mounting-program-related data relating to a mounting program executed by a control device of an electronic circuit component mounting system including a substrate holding device for holding a circuit substrate, a component supply device for supplying electronic circuit components, and a mounting device controlled by the control device to receive the electronic circuit components from the component supply device and mount the electronic circuit components on the circuit substrate held by the above-indicated substrate holding device, the mounting-program-related-data preparing program comprising:

an original-data reading step of reading out, one after another from an original-data memory, portions of original data respectively corresponding to a plurality of mounting positions on the circuit substrate, the original data correlating each of the mounting positions with a corresponding one of the electronic circuit components to be respectively mounted at the mounting positions; and a replacing step implemented when the electronic circuit component correlated with the mounting position corresponding to one of the portions of the original data which has been read in the above-indicated original-data reading step belongs to any one of at least one electronic-circuit-component group each memorized in a component-group memory and consisting of a plurality of mutually substitutable different electronic circuit components, to replace the electronic circuit component correlated with the mounting position in question, with the above-indicated one electronic-circuit component group, whereby the above-indicated original data are replaced by substitution data wherein each electronic circuit component of the above-indicated original data which belongs to any one of the above-indicated at least one electronic-circuit-component group is correlated with the electronic-circuit-component group to which the above-indicated each electronic circuit component belongs.

(19) An erroneous component setting preventing system for preventing erroneous setting of electronic circuit components of various kinds at a plurality of setting portions of a component supply device wherein a plurality of component supplying devices each accommodating electronic circuit components of one kind are set on the above-indicated plurality of setting portions, the erroneous component setting preventing system comprising:

a component-group memory for storing at least one electronic-circuit-component group each consisting of a plurality of different electronic circuit components;

a setting-data memory for storing setting data which correlate each of setting-portion identification codes respectively identifying the above-indicated plurality of setting portions, with a corresponding one of component identification codes respectively identifying the electronic circuit components to be respectively mounted at the setting portions, or one of at least one component-group identification code respectively identifying the above-indicated at least one electronic-circuit-component group;

an identification-code obtaining portion operable when each of the above-indicated plurality of component supplying devices is set at a corresponding one of the above-indicated plurality of setting portions, to obtain the component identification code of the electronic circuit component set in each component supplying device and the setting-portion identification code of the corresponding setting portion; and a determining portion for comparing the component identification code and the setting-portion identification code which have been obtained by the above-indicated identification-code obtaining portion, with a corresponding one of portions of the above-indicated setting data, and if the corresponding one portion of the setting data includes the component identification code and the setting-portion identification code, preparing comparison-result information indicating whether those component identification code and setting-portion identification codes included in the above-indicated corresponding one portion are coincident with the component identification code and setting-portion identification codes which have been obtained by the above-indicated identification-code obtaining portion, and if the corresponding one portion includes the component-group identification code and the setting-portion identification code, referring to the above-indicated component-group memory, and preparing comparison-result information indicating whether the obtained component identification code is coincident with the component identification code identifying any one of the electronic circuit components belonging to the electronic-circuit-component group identified by the component-group identification code included in the corresponding one portion, while the obtained setting-portion identification code is coincident with the setting-portion identification code included in the corresponding one portion.

For example, the identification codes are constituted by one-dimensional or two-dimensional codes such as bar codes, or alphabetic or other letters, numerals, symbols or graphic figures, or any combination thereof.

For example, the component identification codes and the setting-portion identification codes are obtained automatically or manually by the operator with a reading device, or by the operator with an input device. Alternatively, those codes are obtained by recognition of the codes on the basis of their images taken by a camera or other imaging device.

The identification codes may be indirectly obtained, rather than directly obtained by a reading operation as described above. For instance, the component identification codes may be indirectly obtained via supplying-device identification codes identifying the component supplying devices in which the electronic circuit components are set. When the component supplying devices are loaded with the electronic circuit components, the component identification codes and the supplying-device identification codes are both obtained by reading operations, for example. When the component supplying devices loaded with the electronic circuit components are set at the setting portions, the supplying-device identification codes and the setting-portion identification codes are obtained by reading operations, for example. The component identification codes already obtained together with the supplying-device identification codes are correlated with the respective setting-portion identification codes. Thus, the component identification codes and the setting-portion identification codes may be obtained. At this time, erroneous setting of the electronic circuit components in the component supplying devices may be prevented, and only the component identification codes and supplying-device identification codes may be obtained, as in a system described below with respect to the following mode of the invention.

The setting-data memory may be a memory provided exclusively to store the setting data, or may be a portion of a memory provided to store the setting data and any other kind of data.

Where the mounting program provided to mount the electronic circuit components on the circuit substrate correlate some of the mounting positions with respective electronic-circuit-component groups, each of the setting portions at which the electronic circuit components to be mounted at those mounting positions may be correlated with any one of the electronic circuit components belonging to the corresponding electronic-circuit-component group. In the present mode of the invention, the setting of any one of the electronic circuit components of the electronic-circuit-component group at the setting portion correlated with that group is not determined to be erroneous, so that the efficiency of the component mounting operation is improved.

Where only the electronic circuit component is correlated with the setting portion, the setting at this setting portion of any electronic circuit component other than the correlated component is determined to be erroneous even if the component other than the correlated component belongs to the electronic-circuit-component group and is substitutable for the correlated component. In this case, it is necessary to take a suitable treatment, for example, to set the correlated component at the setting portion in question, or change the setting data accordingly. The present mode of the invention does not require such a time-consuming treatment, and utilizes the data of the at least one electronic-circuit-component group, for permitting any one of the electronic circuit components belonging to the appropriate electronic-circuit-component group, to be set at the setting portion in question, while preventing erroneous setting of the electronic circuit components at the setting portions.

The feature described above with respect to any one of the above modes (1)–(18) may be provided together with the feature described with respect to any one of the modes (19)–(22).

(20) An erroneous component setting preventing system for preventing erroneous setting of electronic circuit components of a plurality of kinds on a plurality of component supplying devices, respectively, the erroneous component setting preventing system comprising:

a component-group memory for storing at least one electronic-circuit-component group each consisting of a plurality of different electronic circuit components;

a setting-data memory for storing setting data which correlate each of component identification codes respectively identifying a plurality of electronic circuit components with a corresponding one of supplying-device identification codes respectively identifying the component supplying devices in which the electronic circuit components are to be set, or correlate each of at least one component-group identification code respectively identifying the above-indicated at least one electronic-circuit-component group each consisting of the plurality of different electronic circuit components, with at least one of the supplying-device identification codes which identifies at least one of the component supplying devices in which the electronic-circuit components belonging to the electronic-circuit-component group identified by each component-group identification code are to be set;

a setting-portion identification-code obtaining portion for obtaining the setting-portion identification codes identifying the setting portions at which the above-indicated plurality of electronic circuit components and the component supplying devices are assigned to be set;

a component-identification-code/supplying-device-identification-code obtaining portion operable when each electronic circuit component is set at each component supplying device, to obtain the component identification code identifying the electronic circuit component and the supplying-device identification code identifying the component supplying device; and a determining portion for comparing the component identification code and the supplying-device identification code which have been obtained by the component-identification-code/supplying-device-identification-code obtaining portion, with a corresponding one of portions of the setting data, and if the corresponding one portion of the setting data includes the component identification code and the supplying-device identification code, preparing comparison-result information indicating whether those component identification code and supplying-device identification code are coincident with the component identification code and supplying-device identification code which have been obtained, and if the corresponding one portion includes the component-group identification code and the supplying-device identification code, referring to the above-indicated component-group memory, and preparing comparison-result information indicating whether the obtained component identification code is coincident with the component identification code identifying any one of the electronic circuit components belonging to the electronic-circuit-component group identified by the component-group identification code in the above-indicated corresponding one portion, while the obtained supplying-device identification code is coincident with the supplying-device identification code identifying the component supplying device in which the above-indicated any one of the electronic circuit components is to be set.

In each component supplying device for supplying the electronic component to be mounted at the mounting position correlated with any electronic-circuit-component group, any one of the electronic circuit components belonging to that electronic-circuit-component group may be set. In the present mode of the invention, the setting in this component supplying device of any one of the components belonging to the electronic-circuit-component group in question is not determined to be erroneous. Accordingly, the electronic circuit components can be set in the component supplying devices with a high degree of efficiency, without erroneous setting of the electronic circuit components in the component supplying devices.

(21) An erroneous component setting preventing program executed by a computer to prevent erroneous setting of electronic circuit components of various kinds at a plurality of setting portions of a component supply device wherein a plurality of component supplying devices each accommodating electronic circuits components of one kind are set on the above-indicated plurality of setting portions, the erroneous component setting preventing program comprising:

an identification-code obtaining step implemented when each of the above-indicated plurality of component supplying devices is set at a corresponding one of the above-indicated plurality of setting portions, to obtain a component identification code as identification data identifying the electronic circuit component set in the above-indicated each component supplying device and a setting-portion identification code as identification data identifying the corresponding one setting portion; and a determining step of referring to setting data which are stored in a setting-data memory and which correlate the setting-portion identification code identifying each of the above-indicated plurality of setting portions, with the component identification code identifying the electronic circuit component to be set in the above-indicated each setting portion, or a component-group identification code identifying an electronic-circuit-component group consisting of a plurality of different electronic circuit components, and if the setting-portion identification code obtained in the above-indicated identification-code obtaining step is correlated with the component identification code by the above-indicated setting data, preparing comparison-result information indicating whether the component identification code correlated is coincident with the obtained component identification code, and if the setting-portion identification code obtained in the above-indicated identification-code obtaining step is correlated with the component-group identification code by the above-indicated setting data, referring to a component-group memory storing data of the above-indicated electronic-circuit-component group, and preparing comparison-result information indicating whether the component identification code obtained in the above-indicated identification-code obtaining step is coincident with the component identification code identifying any one of the electronic circuit components belonging to the electronic-circuit-component group which is correlated with the above-indicated setting-portion identification code by the above-indicated setting data.

(22) An erroneous component setting preventing program executed by a computer to prevent erroneous setting of electronic circuit components of a plurality of kinds in a plurality of component supplying devices, respectively, the erroneous component setting preventing program comprising:

a setting-portion-identification-code obtaining step of obtaining setting-portion identification codes respectively identifying the setting portions at which the above-indicated plurality of electronic circuit components and the above-indicated plurality of component supplying devices are assigned to be set;

a component-identification-code/supplying-device-identification-code obtaining step implemented when each of the plurality of electronic circuit components is set at the corresponding component supplying device, to obtain the component identification code identifying the electronic circuit component and the supplying-device identification code identifying the corresponding component supplying device; and a determining step of referring to setting data which are stored in a setting-data memory and which correlate each of the component identification codes respectively identifying the above-indicated plurality of electronic circuit components with a corresponding one of the supplying-device identification codes respectively identifying the component supplying devices in which the electronic circuit components are to be set, or correlate each of at least one component-group identification code respectively identifying at least one electronic-circuit-component group each consisting of a plurality of different electronic circuit components, with at least one of the supplying-device identification codes which identifies at least one of the component supplying devices in which at least one of the electronic-circuit-components belonging to the electronic-circuit-component group identified by the above-indicated each component-group identification code is to be set, and if a corresponding portion of the above-indicated setting data which corresponds to the electronic circuit component that is being set includes the component identification code and the supplying-device identification code, preparing comparison-result information indicating whether the component identification code and the supplying-device identification code which have been obtained in the above-indicated component-identification-code/supplying-device-identification-code obtaining step are coincident with the component identification code and the supplying-device identification code which are included in the corresponding portion of the above-indicated setting data, and if the corresponding portion of the above-indicated setting data include the component-group identification code and the at least one supplying-device identification code, referring to a component-group memory storing data correlating each of the at least one electronic-circuit-component group with the plurality of different electronic circuit components of said each group, and preparing comparison-result information indicating whether the component identification code obtained in the above-indicated component-identification-code/supplying-device-identification-code obtaining step is coincident with the component identification code identifying any one of the electronic circuit components belonging to the electronic-circuit-component group identified by the component-group identification code included in the corresponding portion of the above-indicated setting data, while the supplying-device identification code obtained in the above-indicated component-identification-code/supplying-device-identification-code obtaining portion is coincident with the supplying-device identification code included in the above-indicated corresponding portion.

The setting data correlate the component identification codes identifying the plurality of setting portions of the component supply device with the component identification codes and the supplying-device identification codes, or correlate the component identification codes with the component-group identification codes and the supplying-device identification codes. The operation to set each electronic circuit component in the corresponding component supplying device is performed by designating, with the setting-portion identification codes, the setting portions at which the respective electronic circuit components and the component supplying devices are assigned to be set. Each of the portions of the setting data which correspond to the designated setting portions is the corresponding portion described above. This is also true in the above mode (20).

(23) Mounting-program-related data stored in a memory such that the stored mounting-program-related data are readable by a computer, wherein data sets indicative of selected ones of a plurality of mounting positions on a circuit substrate are correlated with respective data sets indicative of a plurality of kinds of electronic circuit components to be mounted at the selected ones of the mounting positions, and wherein each of at least one data set indicative of at least one of the above-indicated plurality of mounting positions which is other than the above-indicated selected ones is correlated with a data set indicative of an electronic-circuit-component group consisting of a plurality of electronic circuit components that are permitted to be mounted at a corresponding one of the above-indicated at least one mounting position.

The mounting-program-related data may be a mounting program per se, or data from which the mounting program are prepared.

(24) Electronic-circuit-component-group data stored in a memory such that the stored electronic-circuit-component-group data are readable by a computer, wherein data sets respectively indicative of a plurality of electronic-circuit-component groups are correlated with respective data sets respectively indicative of a plurality of electronic circuit components belonging to each of the electronic-circuit-component groups.

The electronic-circuit-component-group data are used, for example, together with auxiliary data for determining one of the plurality of electronic circuit components belonging to one electronic-circuit-component group, when the data set indicative of the electronic-circuit-component group in the mounting-program-related data of the above mode (23) is substituted for the data set indicative of the electronic circuit component, by the computer. Examples of the auxiliary data have been described with respect to the above modes (2)–(9).

(25) A recording medium storing a program as defined in any one of the above modes (14), (15), (18), (21) and (22) such that the program is readable by a computer.

The recording medium is preferably a recording medium of a removably installable type removably installed in a computer, such as a ROM cassette, or a recording medium of a readable type readable by a reading device provided in a computer, such as a magnetic tape, a magnetic disc and a magneto-optical disc. However, the recording medium may be a ROM or any other medium incorporated in a computer such that the medium is not removable from the computer.

BRIEF DESCRIPTION OF THE DRAWINGS

FIG. 7 is a view showing a portion of a mounting program prepared by the above-indicated mounting program preparing computer.

FIG. 8 is a view showing a portion of setting data prepared by the above-indicated mounting program preparing computer.

FIG. 13 is a view showing electronic-circuit-component-group data stored in a parts library of an electronic circuit component mounting system according to another embodiment of this invention.

FIG. 15 is a view showing an electronic-circuit-component-group data stored in a parts library of an electronic circuit component mounting system according to a further embodiment of the present invention.

DETAILED DESCRIPTION OF PREFERRED EMBODIMENTS OF THE INVENTION

Figure 1:
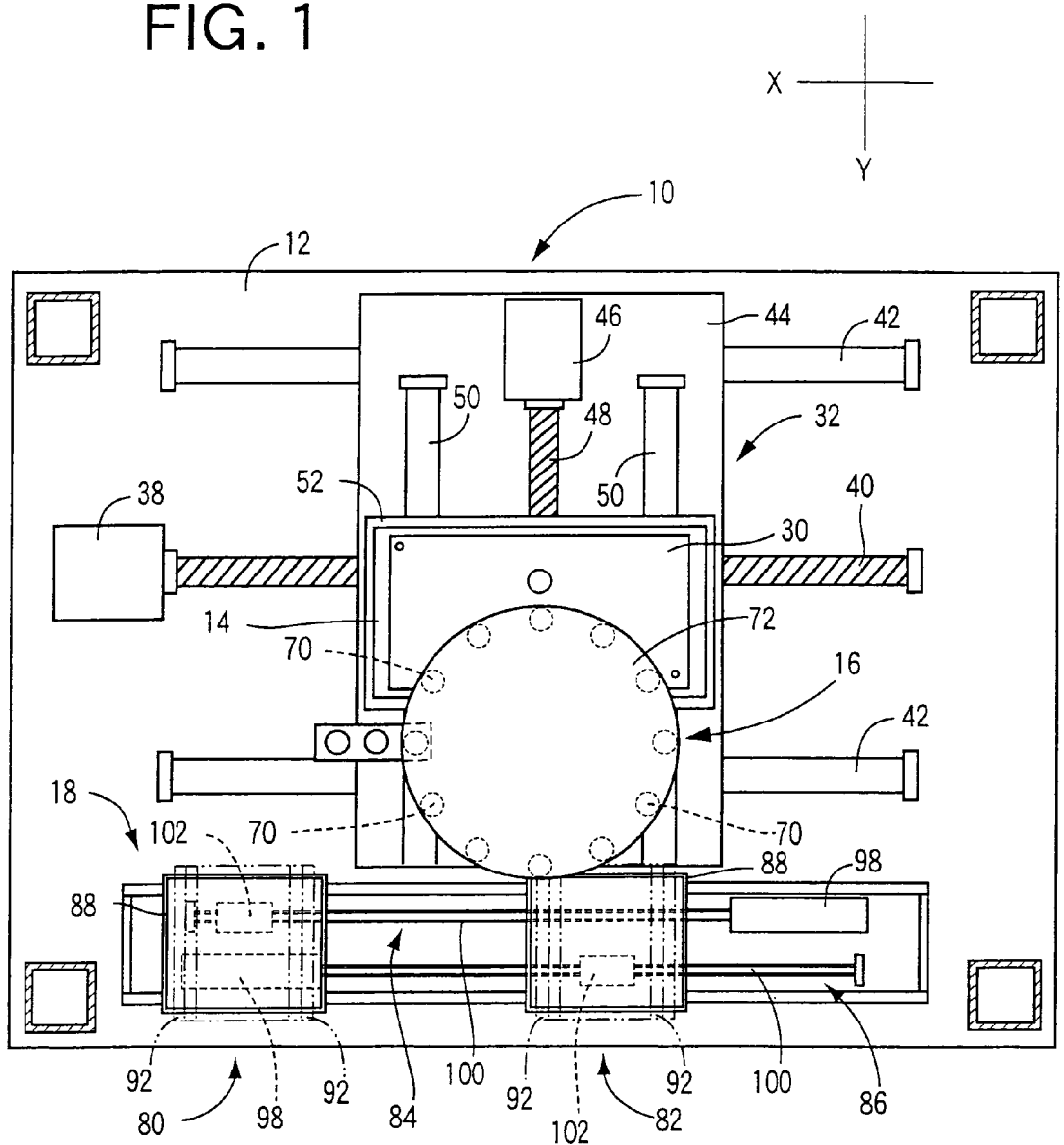
FIG. 1 is a plan view schematically showing a mounting machine of an electronic circuit component mounting system according to one embodiment of this invention.

The embodiments of the present invention will be described in detail, referring to the drawings.

In FIG. 1, there is schematically shown an electronic circuit component mounting machine (hereinafter referred to simply as "mounting machine") 10 of an electronic circuit component mounting system according to one embodiment of this invention.

A wiring-board holding device 14 is provided to move a printed-wiring board to a desired position in an xy coordinate system, with an XY table 32 functioning as a device for moving a circuit-substrate holding device that holds and moves a printed-wiring board. The xy table 32 is constructed so as to include an x-axis slide drive motor 38, a y-axis slide drive motor 46, ballscrews 40, 48 and guide rails 42, 50.

A mounting device 16 is constructed so as to include a plurality of component mounting heads 70 held by an intermittent rotary body 72 such that the component mounting heads 70 are equally spaced apart from each other, and an intermittent rotary drive motor 74 for driving the intermittent rotary body 72. The plurality of component mounting heads 70 are arranged to receive electronic circuit components from a component supply device 18 at a component-receiving position, and mount the electronic circuit components on the printed-wiring board 30, at a component-mounting position.

The component supply device 18 is provided with two component supply tables 80, 82, and table drive devices 84, 86 for moving those component supply tables 80, 82. Each of the component supply tables 80, 82 includes a table 88 movable in an X-axis direction, and a plurality of feeders 92 mounted on the table to feed the electronic circuit components. Each of the table drive devices 84, 86 is constructed so as to include a table drive motor 98 provided as a drive source for moving the table, and a ballscrew 100 and a nut 102. In this arrangement, each of the plurality of feeders 92 is positioned such that the component supply portion of each feeder 92 is located at a predetermined component supply position.

The component mounting head 70 located at the component-receiving position is located right above the component supply portion of the feeder 92 located at the component supply position.

Figure 2:
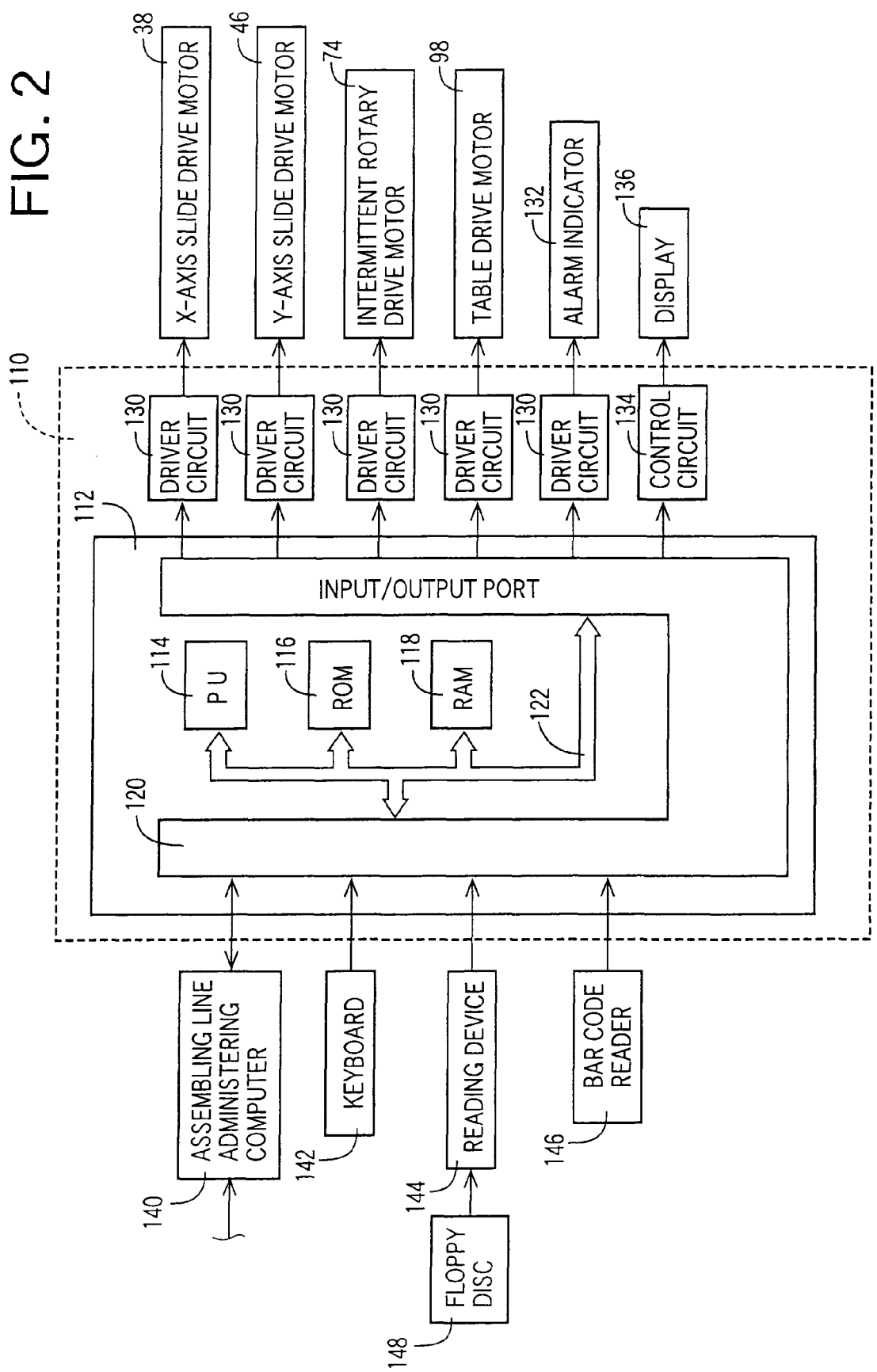
FIG. 2 is a block diagram schematically showing a control device of the above-indicated electronic circuit component mounting system.

The mounting device 16, etc. are controlled by a control device 110 shown in FIG. 2. The control device 110 is principally constituted by a mounting control computer 112, which includes a PU (processing unit) 114, a ROM 116, a RAM 118, and an input/output port 120 that are interconnected to each other by a bus line 122.

To the input/output port 120, there are connected through driver circuits 130 various actuators such as the X-axis slide drive motor 38, etc., and an alarm indicator 132. A display 136 is also connected to the input/output port 120 through a control circuit 134. In the present embodiment, servomotors are used for the various motors serving as the drive sources such as the X-axis slide drive motor 38. The servomotors are rotary electric motors the operating angles of which can be accurately controlled. Stepping motors may be used in place of the servomotors. The operating angles of the X-axis slide drive motor 38 and the other motors are detected by encoders, which are not shown, and the motors such as the motor 38 are controlled on the basis of the detected operating angles. The alarm indicator 132, which may be a buzzer, for example, is arranged to inform the operator with a sound. The alarm indicator 132 constitutes an alarming device, while the display 136 constitutes an indicating device.

To the input/output port 120, there are connected an assembling line administering computer 140, various detectors not shown, a keyboard 142 constituting an input device, a reading device 144, etc. A bar code reader 146 may be connected to the input/output port 120. The reading device 144 is loaded with a magnetic recording medium in the form of a floppy disc used as one kind of a recording medium, and is operable to read out data stored in the floppy disc and transfer the data to the computer 112, so that the data are stored in the RAM 118.

The bar code reader 146 is used to read a bar code provided for the electronic circuit components and a bar code provided for the feeders 92. The bar code is used as one kind of an identification code that identifies the members carrying those identification codes, as distinguished from the other members. The bar codes may be a one-dimensional bar code as a one-dimensional code, or a two-dimensional bar code as a two-dimensional code.

The bar code provided as the component identification code identifying the electronic circuit components include part ID, and data indicative of manufacturers, electrical ratings, types of packaging, and dates of manufacture of the electronic circuit components. The part ID includes information capable of identifying the electronic circuit component in question from the other electronic circuit components, for example, names or serial numbers of the components. The data indicative of the types of packaging include data indicating whether the components are supplied from a carrier tape such as a paper tape or an embossed tape, or from a bulk feeder, or whether the components are supplied by a feeder or a tray that accommodates the components. The data indicative of the types of packaging also include data indicative of the attitude or orientation of each component accommodated in the feeder or tray. The bar code for the electronic circuit components are provided on reels or casings that accommodate the carrier tape or the components.

The bar codes provided for the feeders 92 include data identifying the feeders 92, such as data indicative of the types, serial numbers, sizes and component-holding types of the feeders 92. The types of the feeders 92 include a carrier-tape feeding type and a bulk feeding type, for example. The serial numbers are assigned to the respective feeders 92. The sizes of the feeders 92 are indicated by the width, feeding pitch, etc. of the carrier tape, where the feeders 92 are of the carrier-tape feeding type. The component-holding types include the paper-tape type and the embossed-tape type.

Both of the bar code provided for the electronic circuit components, and the bar code provided for the feeders 92 include various kinds of data, either a portion or an entirety of the data may be used as the identification code. For instance, only the part ID may be used as the identification code for the electronic circuit components, and only the serial number code for the component supply device may be used as the identification code for the feeders 92. The part ID data are provided together with the bar code, on the reels, etc. which hold the carrier tapes.

Figure 11:
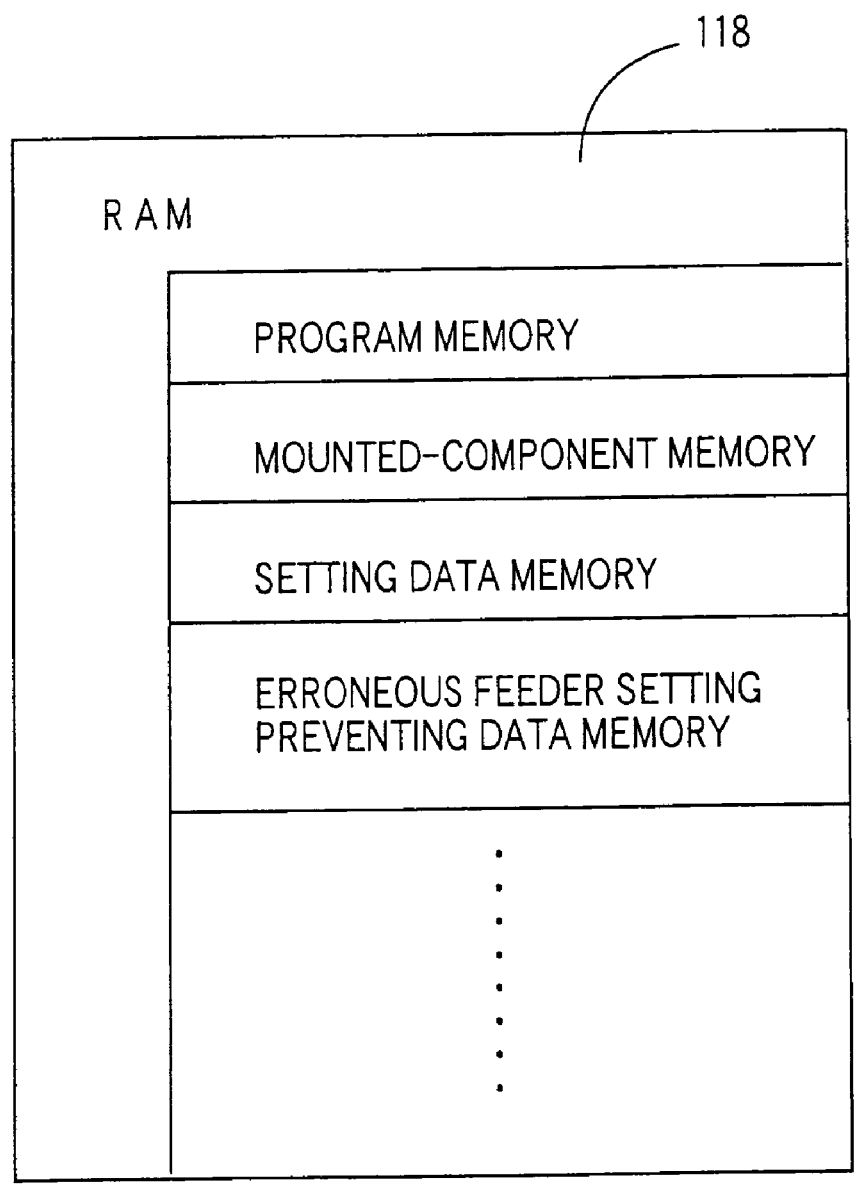
FIG. 11 is a view schematically showing an arrangement of the RAM of the mounting control computer of the above-indicated mounting machine.

The assembling line administering computer 140 is a computer assigned to administer or control an assembling line which is provided with a plurality of working machines including the mounting machine 10 and which is arranged to mount the electronic circuit components on the printed-wiring board 30. The assembling line administering computer 140 has programs and data relating to each of the systems of the assembling line, which are supplied to those systems. In the present embodiment, the assembling line includes a plurality of mounting machines which include the mounting machine 10. These mounting machines are supplied with mounting programs, which are stored in a program memory (shown in FIG. 11) provided in the RAM 18.

The mounting program is prepared so as to indicate one of a plurality of electronic circuit components or one of a plurality of groups of electronic circuit components, which is to be mounted at each of a plurality of mounting positions on the printed-wiring board 30, by the mounting machine 10. The groups of electronic circuit components will be described later.

Figure 3:
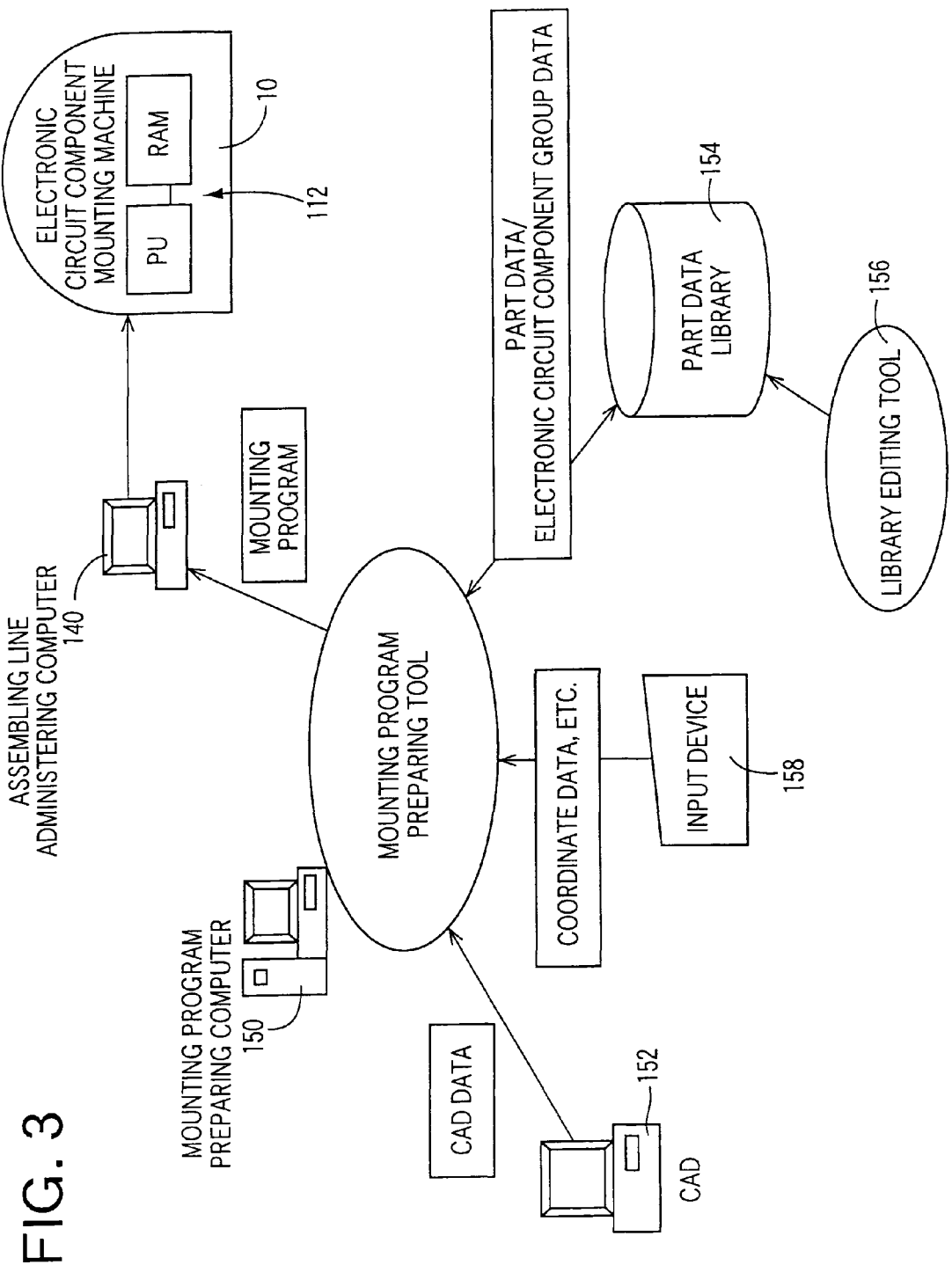
FIG. 3 is a view schematically showing an assembling line administering computer, a mounting program preparing computer, etc. that are connected to a computer which constitutes a major portion of the above-indicated control device.

In the present embodiment, the mounting program is prepared by a mounting program preparing computer 150 (shown in FIG. 3), and is supplied to the assembling line administering computer 140 which is connected to the mounting program preparing computer 150. To the mounting program preparing computer 150, there are connected a CAD 152, a part data library 154, and an input device 158, as shown in FIG. 3. In the present embodiment, the electronic circuit component mounting system includes the mounting machine 10, control device 110, assembling line administering computer 140, mounting program preparing computer 150, part data library and input device 158.

The CAD 152 is assigned to design circuits and printed-wiring boards, and prepare CAD data for printed circuit boards of different kinds. The printed circuits boards are the printed-wiring boards on which electronic circuit components have been mounted and soldered to the printed wirings. The CAD data are used to determine the coordinate values of the mounting positions at which the electronic circuit components are to be mounted, the electronic circuit components to be mounted at the respective mounting positions, and the attitudes of the electronic circuit components as mounted. The electronic circuit components are identified by the part ID data. The CAD data may be prepared by a CAD operator, who enters the coordinate data of the component mounting positions and the part ID data through the input device 158. For instance, the input device 158 may include a keyboard.

Figure 4A:
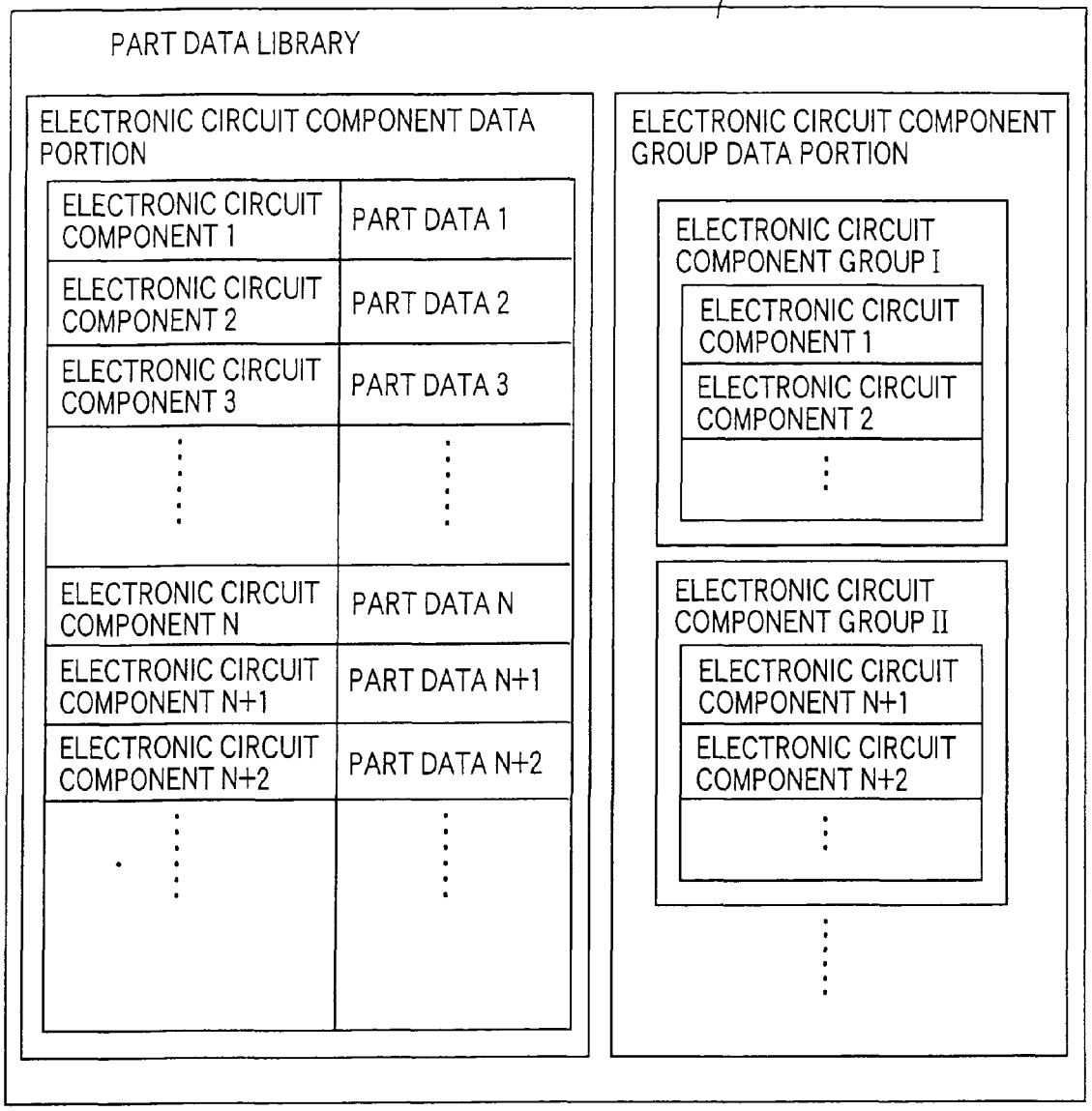
FIGS. 4A and 4B are views schematically showing a part data library and an arrangement of part data stored in the library, which are connected to the above-indicated mounting program preparing computer.
Figure 4B:
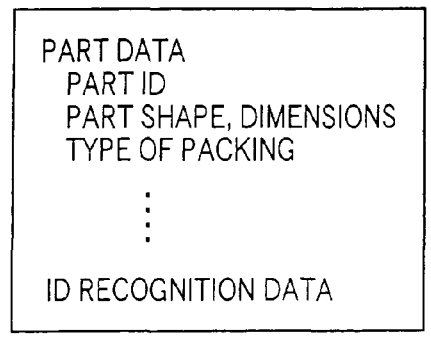

The part data library 154 is provided, for example, as one kind of an external memory device, which may be a magnetic disc, for instance and which constitutes a recording medium. The part data library 154 stores part data and electronic-circuit-component-group data, as shown in FIG. 4A. The part data are provided for each of the plurality of kinds of electronic circuit components, and include the part ID data, part shapes and dimensions, type of packaging, and ID recognition data, as shown in FIG. 4B. For example, the ID recognition data may take the form of a bar code including the same kinds of data as the bar code which is provided for the electronic circuit components and which include the part ID data and the data indicative of the manufacturers and dates of manufacture of the components. The part ID data are stored in relation to the component identification data, or any other data which identify the electronic circuit components.

Each of the groups of electronic circuit components consists of a plurality of mutually substitutable electronic circuit components. The electronic-circuit-component-group data stored in the part data library 154 represent at least one group each consisting of those electronic circuit components. The mutually substitutable electronic circuit components are interpreted to mean components any one of which can be mounted at the appropriate mounting position, without any problem with an electronic circuit to be formed by the component in question and other components mounted at the appropriate mounting position. A representative example of a group of mutually substitutable electronic circuit components is a group of electronic circuit components which have substantially the same electrical characteristic (rating). However, electronic circuit components having relatively wide ranges of tolerance of the electrical characteristic may also be considered to be a group of mutually substitutable electronic circuit components. For instance, a group of mutually substitutable electronic components may consist of electronic circuit components which have the same electric characteristic, but which are manufactured by different manufactures and have different shapes, sizes or types of packaging, namely, may consist of electronic circuit components of different kinds distinguished from each other by respective part ID data. In the present embodiment, the electronic-circuit-component-group data are prepared such that any kind of electronic circuit component does not belong to two or more groups of electronic circuit components represented by the prepared data.

Each of at least one group of mutually substitutable electronic circuit components is represented or identified by an identification code in the form of a component-group identification code. For example, this component-group identification code consists of data capable of identifying the group by its name, serial number, etc. For instance, the part data library 154 stores a component-group identification code in the form of the group number identifying each group of mutually substitutable electronic circuit components, and the part ID data sets identifying the mutually substitutable electronic circuit components of each group. The data stored in the part data library 154 are prepared by an operator, who enters necessary data through a library editing tool 156.

There will be described an operation of the mounting program preparing computer 150 to prepare the mounting program.

Figure 5:
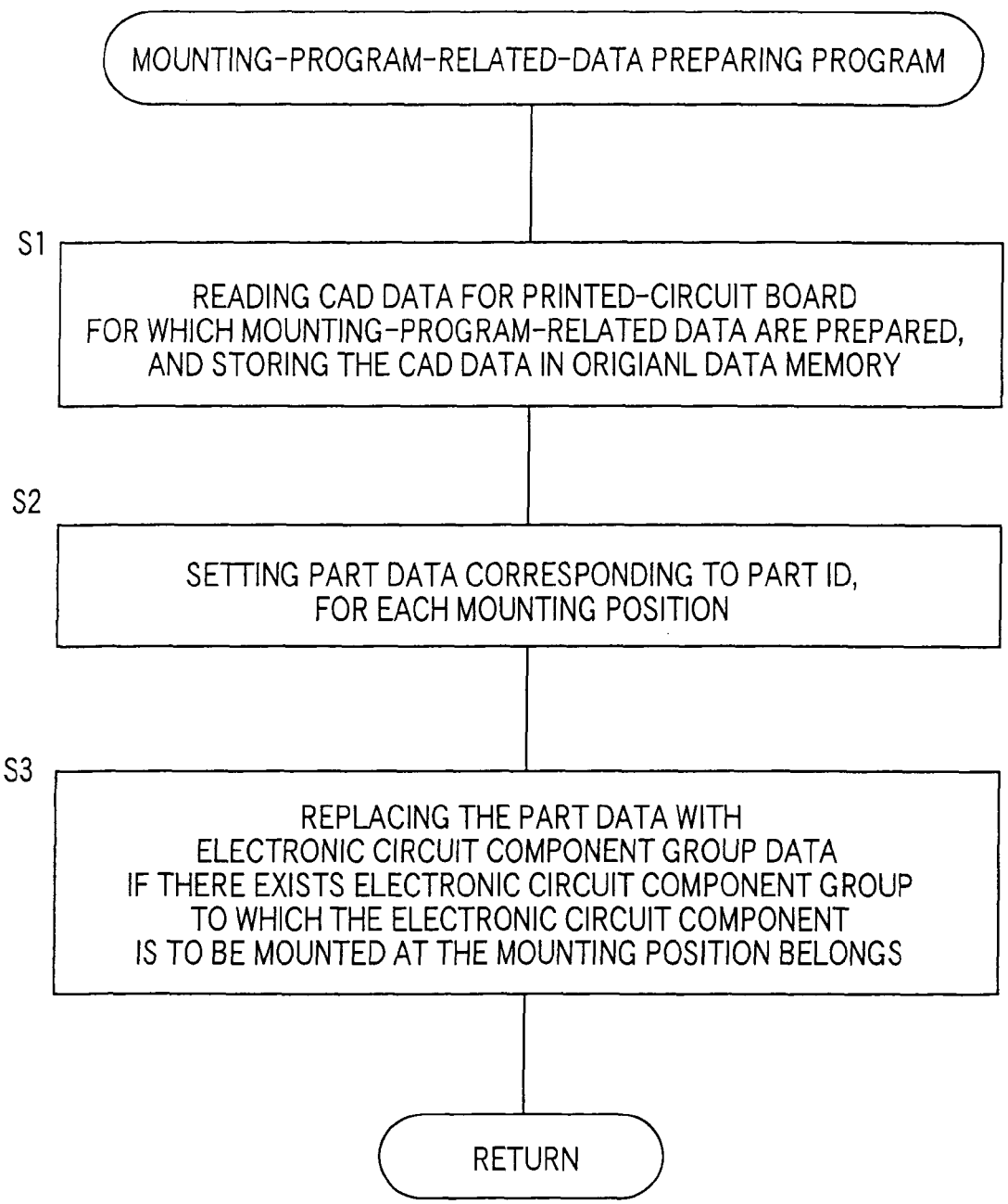
FIG. 5 is a flow chart illustrating a mounting-program-related-data preparing program stored in a program memory of a RAM of the above-indicated mounting program preparing computer.
Figure 6:
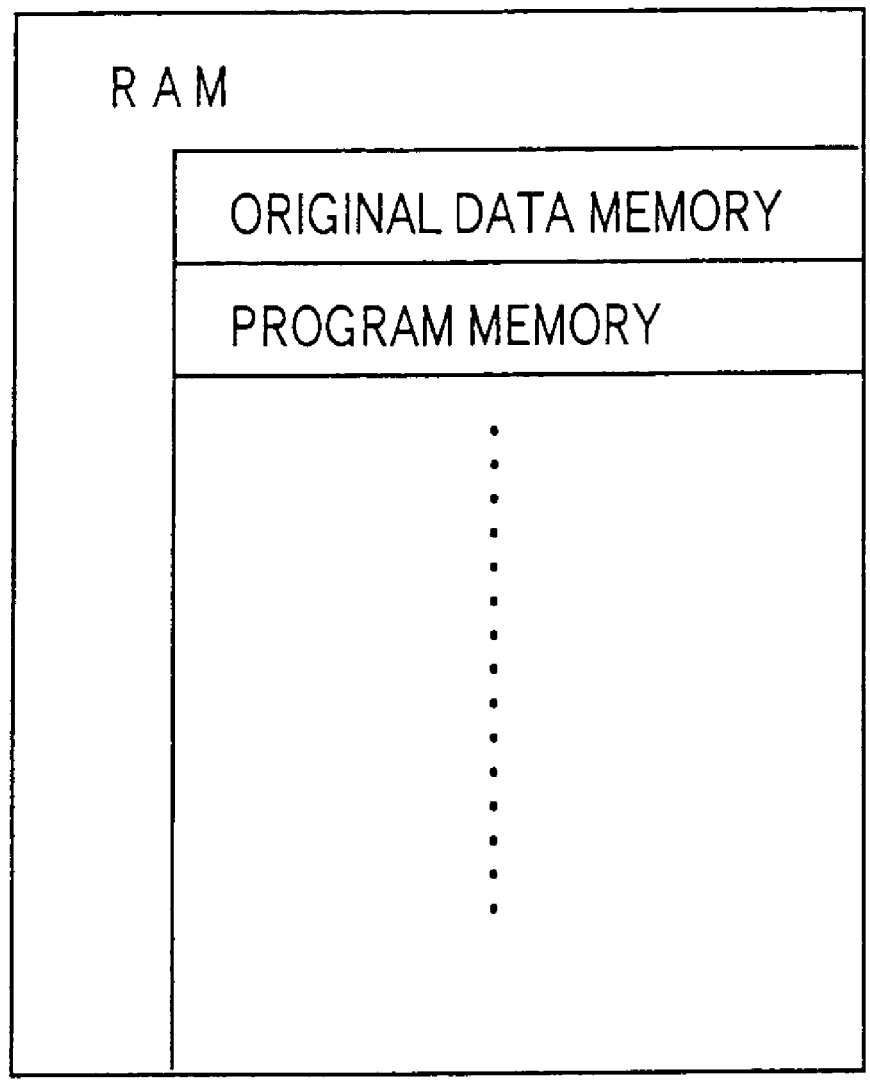
FIG. 6 is a view schematically showing an arrangement of the RAM of the above-indicated mounting program preparing computer.

In the program memory of the RAM (shown in FIG. 6) of the mounting program preparing computer 150, there is stored a mounting-program-related-data preparing program indicated in FIG. 5, which is used to automatically prepare the program that is executed in each of the plurality of mounting machines of the electronic circuit component mounting line, for mounting the electronic circuit components.

To prepare the mounting program, mounting-program-related data are initially prepared by the mounting program preparing computer 150, according to the mounting-program-related-data preparing program. In the present embodiment, the mounting-program-related data are prepared on the basis of original data in the form of design data for the printed-circuit board, namely, the CAD data prepared by the CAD 152.

The CAD data are prepared to indicate a relationship between each of all mounting positions on the printed-circuit board and the electronic circuit component which is to be mounted at each mounting positions. The CAD data also indicate the attitudes or orientations of the electronic circuit components. The CAD data as the original data are processed into data indicative of an electronic circuit component or a group of electronic circuit components, which is to be mounted at each of the mounting positions on the printed-wiring board 30. In the present embodiment, the thus obtained data are the mounting-program-related data on which the mounting program is to be prepared.

The mounting-program-related-data preparing program is initiated with step 1 (hereinafter abbreviated as "S1": the other steps being similarly abbreviated) to read out from the CAD 152 the CAD data prepared for the printed-circuit board for which the mounting-program-related data are to be prepared. The CAD data read out from the CAD 152 are stored in an original data memory (shown in FIG. 6) of the RAM of the computer 150.

Then, S2 is implemented to set part data for each of all the mounting positions. That is, the mounting positions represented by the CAD data stored in the original data memory are read out one after another. On the basis of the part ID data sets corresponding to the read-out mounting positions, the part data sets including the same part ID data set are read out from the part data library 154, and are stored in the original data memory in place of the part ID data sets. Thus, the part ID data sets of the CAD data stored in the original data memory are replaced by the part data sets. However, the part data sets may be stored in another memory other than the original data memory, together with the mounting positions. In this case, the entirety of the original CAD data remain in the original data memory.

In S3 implemented next, some of the part data sets which have been substituted for the part ID data sets and which are referred to as primary substitution design data are replaced with the appropriate electronic-circuit-component-group data, under a predetermined condition. Each of the part data sets substituted for the part ID data sets includes the part ID data set as well as the other kinds of data. If this part ID data set included in the part data set in question is included in any one of the electronic-circuit-component groups stored in the part data library 154, the part data set in question is replaced with the corresponding electronic-circuit-component-group. The processing of the primary substitution design data in S3 is effected for each of the mounting positions which are read out one after another from the original data memory, as in the processing in S2. Thus, the mounting-program-related data in the form of secondary substitution design data are prepared by implementing the above-indicated process steps for all of the mounting positions on the printed-circuit board. The secondary substitution design data prepared on the basis of the CAD data include data other than the part data and the electronic-circuit-component-group-number data. In the present embodiment, the secondary substitution design data including the electronic-circuit-component-group data are obtained by implementing S3, in addition to S1 and S2 which are implemented according to the conventional program. However, the secondary substitution design data may be prepared by replacing the part ID data with the part data, and replacing the part data with the corresponding electronic-circuit-component-group number if necessary, each time the portion of the CAD data corresponding to each of the mounting positions is read out from the original data memory.

The secondary substitution design data which have been prepared are allocated to the individual mounting machines which are included in the assembling line, to mount the electronic circuit components at the respective mounting positions on the circuit substrate. Namely, the mounting program is prepared as partly shown in FIG. 7, and the prepared mounting program is supplied to each mounting machine. In the mounting machine 10, for example, the mounting program is stored in a program memory of the RAM 118 (shown in FIG. 11). According to the mounting program, each of the mounting positions is correlated with the electronic circuit component to be mounted at that mounting position, or the group of electronic circuit components one of which is to be mounted at the mounting position. Further, the mounting program indicates the order in which the electronic circuit components are to be mounted on the printed-wiring board 30, the positions on the table 88 at which the electronic circuit components corresponding to the respective component mounting positions are located, the angular positions (indicated at Q in FIG. 7) in which the electronic circuit components are to be mounted, and so forth. The table 88 has a plurality of slots as component setting portions, which are given respective numbers. In the mounting program, the feeder mounting positions on the table 88 are designated by their slot numbers, which are provided on the table 88. That is, the present embodiment uses the slot numbers as an identification code identifying the feeder mounting positions on the table 88.

On the basis of the mounting program, setting data are automatically prepared, as shown in FIG. 8. In the present embodiment, the setting data are prepared so as to correlate the setting positions of the electronic circuit components, the electronic circuit components to be mounted at their setting positions, and the feeders 92 (from which the electronic circuit components are supplied) with each other. For each mounting position corresponding to the electronic circuit component which belongs to an electronic-circuit-component group, these mounting position and electronic-circuit-component group are correlated with at least one feeder 92 from which one of the electronic circuit components of that group is supplied. The mounting positions, the electronic circuit components, the electronic-circuit-component groups, and the feeders 92 are correlated with each other, with the appropriate identification codes. In the present embodiment, the setting data are prepared by the mounting program preparing computer 150, and are supplied to the mounting control computer 112 and stored in a setting data memory of its RAM 118. In the present embodiment, the setting data and the mounting program are supplied to the mounting control computer 112, by copying, so that the original mounting program and setting data remain in the mounting program preparing computer 112, permitting repetitive use of the mounting program and setting data for mounting the electronic circuit components on the same printed-wiring board 30.

In the present embodiment, the identification code used in the setting data to identify the setting positions, feeders 92 and electronic circuit components enable the operator of the assembling line to identify the setting positions, feeders 92 and electronic circuit components by visual inspection of the identification code, when the operator selects the feeders 92 and electronic circuit components, and sets the selected feeders 92 at the appropriate feeder setting positions on the tables 88. To this end, the setting data use the slot numbers identifying the feeder setting positions, the part ID data identifying the electronic circuit components, the group numbers identifying the electronic-circuit-component groups, and a feeder type code identifying the types of the feeders 92. In the present setting data, the slot numbers serve as an identification code identifying the feeder setting positions, and the part ID data serve as an identification code identifying the electronic circuit components. Further, the feeder type code serves as an identification code identifying the type of the component supply device, and the group number serves as an identification code identifying the electronic-circuit-component groups.

Where the feeders 92 are arranged to feed a carrier tape in the present embodiment, the types of the feeders 92 are represented by the width dimension and feeding pitch of the carrier tape. The type of each feeder 92 is automatically determined by the kind of the electronic circuit components accommodated in the carrier tape. That is, the width and feeding pitch of the specific kind of the electronic circuit component accommodated in the carrier tape are obtained on the basis of the part data prepared for that kind of the electronic circuit component, so that the type of the feeder 92 used is obtained by the width and feeding pitch.

Since the mounting positions are correlated with the respective electronic circuit components, it is possible to correlate the part ID data sets for those electronic circuit components, the feeder setting positions and the feeder type codes of the feeders 92 for feeding the electronic circuit components, with each other. Where the specific mounting position is correlated with the specific electronic-circuit-component group, the group number is correlated with the corresponding feeder setting position or positions, and the component identification codes, for example, part ID data sets respectively identifying the kinds of a plurality of electronic circuit components belonging to the above-indicated group. Further, the feeder type codes of the feeders 92 for the respective kinds of electronic circuit components are correlated with the part ID data sets. Thus, the electronic-circuit-component-group number is correlated with the feeder type code identifying the type of each of at least one feeder 92 which is loaded with the electronic circuit components of the group.

In the present embodiment, each electronic-circuit-component group is correlated to a plurality of feeder setting positions at which the respective feeders 92 for supplying a selected one of the respective electronic circuit components of the group are set. The same group of electronic circuit components may be correlated to a plurality of mounting positions, so that if the selected kind of the electronic circuit component of the group is supplied by one feeder 92 for the different mounting positions, there may arise insufficiency in the number of that kind of the electronic circuit component to be supplied from that one feeder 92. The number of the feeders 92 corresponding to one electronic-circuit-component group is determined by taking into account the kinds of the electronic circuit components to be mounted on the printed-wiring board 30, the number of the feeders that can be set on the tables 88, the number of the electronic circuit components belonging to the group, etc. The feeders 92 correlated to the same group of electronic circuit components are disposed adjacent to each other on the tables 88, for example.

The same kind of electronic circuit components may be supplied from a plurality of feeders 92, and a plurality of feeders 92 may be used to supply respective different kinds of electronic circuit components. According to the mounting program in the present embodiment, the different mounting positions are correlated to the same feeder setting position, where the same group of electronic circuit components is correlated to the different mounting positions. The two or more feeders 92 for supplying the same kind of electronic circuit components are used in a predetermined order such that after all of the electronic circuit components of the same have been supplied from one of those feeders 92, the next feeder 92 is used to supply the same kind of electronic circuit components. For instance, the feeders 92 are used in the order of their slot numbers. Where the two or ore feeders 92 are of different types, the feeders 92 are used in a predetermined order, which is determined according to a predetermined rule. Where the same group of electronic circuit components is correlated to a plurality of mounting positions, the feeders 92 located at the different feeder setting positions may be used for mounting the electronic components at the respective different mounting positions.

The order of mounting of the electronic components and the feeder setting positions are determined so as to minimize the distances of movements of the printed-wiring board 30 and the distances of movements of the tables 88 during the mounting of the electronic circuit components, and to minimize the overall time required for mounting the electronic circuit components. These determinations are made by taking into account the case where the same group of electronic circuit components is correlated to a plurality of mounting positions, and the case where the same feeder 92 is used to supply the electronic components for the different mounting positions. To allocate the electronic circuit components to the different mounting machines, a simulation of the mounting operations of the mounting machines may or may not be performed to optimize the actual mounting operations so as to minimize the overall mounting time. This simulation to optimize the actual mounting operations does not significantly relate to the present invention, and will not be further described.

In the mounting machine 10, the feeders 92 holding the electronic circuit components are set on the tables 88, according to the setting data which have been received from the mounting program preparing computer 150 through the assembling line administering computer 140, and the electronic circuit components are mounted on the printed-wiring board 30, according to the setting program, more precisely, according to an electronic circuit component mounting control program executed by the computer 112. The electronic circuit component mounting control program is stored in a floppy disc 148 such that the program is readable by a reading device 146 and is stored in the program memory of the RAM 118.

The setting data are displayed on the display 136, as indicated in FIG. 8. According to the displayed setting data, the operator first loads the feeders 92 with the appropriate kinds of electronic circuit components, and then mounts the feeders 92 loaded with the electronic circuit components on the tables 88. Where the specific feeder setting position is correlated with any group of electronic circuit components, the operator selects one of the kinds of the electronic circuit components of that group which is to be supplied from the table 88, according to the setting data displayed on the display 136, and loads the corresponding feeder 92 with the selected kind of electronic circuit components.

The present embodiment is arranged to check whether the plurality of feeders 92 have been correctly loaded with the appropriate kinds of electronic circuit components, by the operator, for preventing erroneous setting of the electronic circuit components on the feeders 92 or erroneous setting of the feeders 92 on the tables 88. The prevention of the erroneous setting of the electronic circuit components on the feeder 92 is effected according to an erroneous component setting preventing program illustrated in FIG. 9. This erroneous component setting preventing program and an erroneous feeder setting preventing program illustrated in FIG. 10 are stored in the floppy disc 148, like the electronic circuit component mounting control program. Those programs are readable by the reading device 144 and are stored in the program memory of the RAM 118. The two programs may be stored in the same floppy disc or respective floppy discs.

Figure 9:
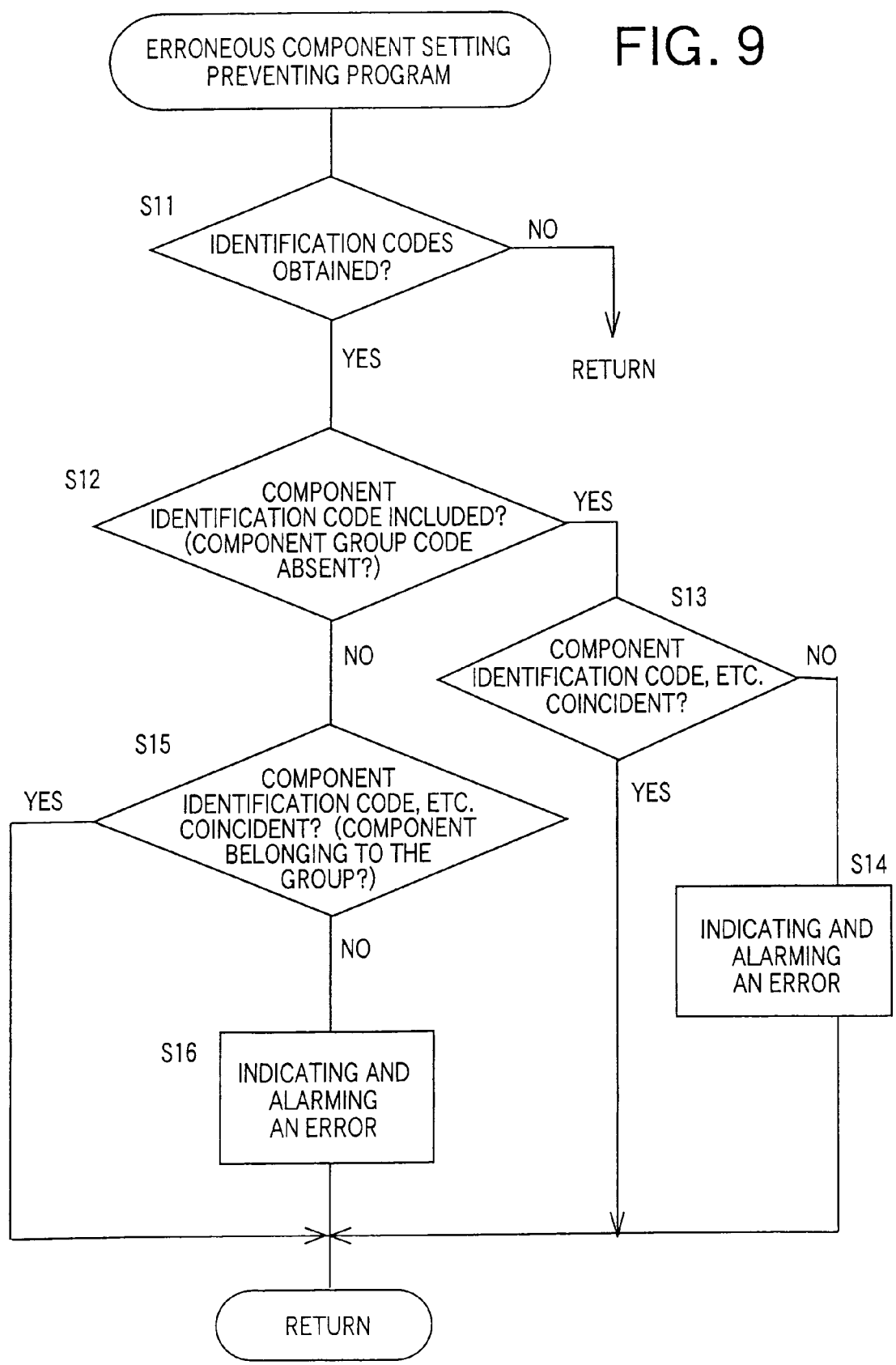
FIG. 9 is a flow chart illustrating an erroneous component setting preventing program stored in the RAM of the above-indicated mounting program preparing computer.
Figure 10:
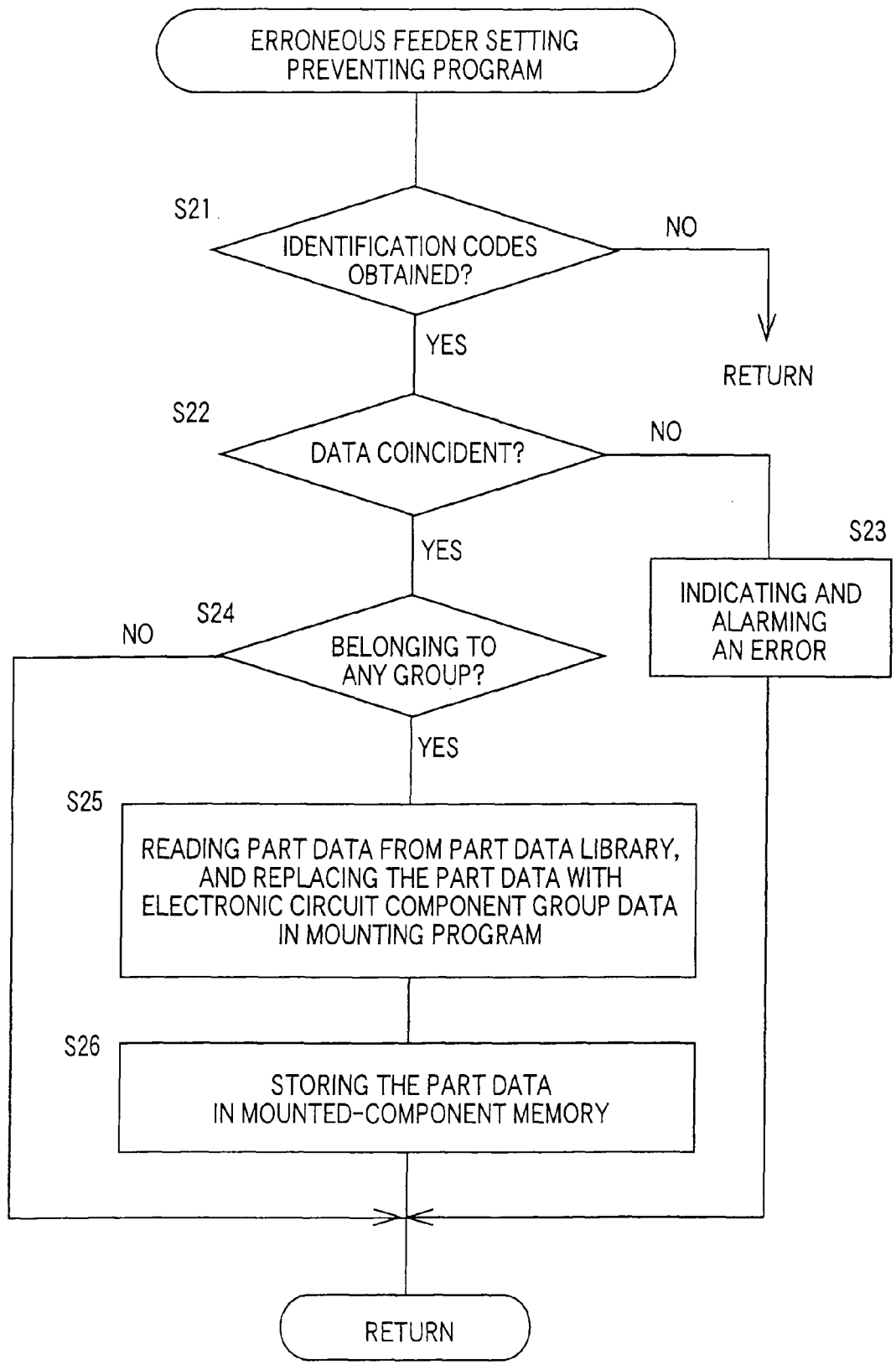
FIG. 10 is a flow chart illustrating an erroneous feeder setting preventing program stored in a RAM of a mounting control computer of the above-indicated mounting machine.

The erroneous component setting preventing program illustrated in FIG. 9 is executed when each feeder 92 is loaded with the electronic circuit components. The operator loads the feeder 92 with the electronic circuit components, according to the setting data displayed on the display 136. Namely, the operator selects the kind of the electronic circuit components according to the part ID data, selects the type of the feeder 92 according to the feeder type code, and loads the selected type of the feeder 92 with the electronic circuit components of the selected kind. At this time, the operator enters the feeder setting position (slot number) into the mounting control computer 112, and operates the bar code reader 146 to read the bar code provided on the selected type of the feeder 92 and the bar code provided for the selected kind of the electronic circuit components.

S11 of the erroneous component setting preventing routine is implemented to determine whether the slot number, part ID data, and feeder type code have been obtained, respectively as an identification code identifying the feeder setting position, an identification code identifying the electronic circuit component and an identification code identifying the type of the feeder 92. As a result of entry of the slot number corresponding to the feeder setting position on the table 88, and as a result of reading of the bar codes for the selected type of the feeder 92 and the selected kind of the electronic circuit components, the slot number, part ID data and feeder type code have been obtained, so that an affirmative decision (YES) is obtained, and the control flow goes to S12.

S12 is provided to determine whether a portion of the setting data which corresponds to the slot number obtained in S11 has been prepared so as to correlate the part ID data and the feeder type code with each other, namely, whether the portion of the setting data corresponding to the entered slot number includes only the part ID data and the corresponding feeder type code (whether only the part ID data are correlated with the slot number obtained together with the feeder type code, but is not correlated to the electronic-circuit-component-group number). If the relevant portion of the setting data includes only the part ID data and the corresponding feeder type code, an affirmative decision (YES) is obtained in S12, and the control flow goes to S13 to determine whether the part ID data and the feeder type code obtained in S11 are coincident with the part ID data and feeder type code included in the relevant portion of the setting data. That is, the obtained part ID data and feeder type code are compared with the portion of the setting data which corresponds to the slot number entered. If the obtained part ID data and feeder type code are coincident with the part ID data and feeder type code included in the portion of the setting data corresponding to the entered slot number, this means that the selected feeder 92 has been loaded with the selected kind of the electronic circuit components, without an error. In this case, an affirmative decision (YES) is obtained in S13, and the execution of the program is terminated.

If the obtained part ID and feeder type code are not coincident with those of the setting data, a negative decision (NO) is obtained in S13, and S14 is implemented to activate the display 136 to indicate an occurrence of an error and activate the alarm indicator 132 to inform the operator of the error. The indication and alarming of this error are one example of utilization of a result of the comparison of the obtained part ID data and feeder type code with the part ID data and feeder type code included in the relevant portion of the setting data. At this time, the display 136 indicates not only the content of the error, but also the feeder type code, part ID data and slot number which are associated with the error. For example, the display 136 indicates both the obtained part ID data and feeder type code, and those of the setting data. Accordingly, the operator can re-load the feeder 92 with the electronic circuit components of the correct kind and take any other appropriate actions to remote the error, according to the indication and alarming of the error, whereby the feeder 92 is prevented from being kept loaded with the wrong kind of electronic circuit components.

Where the relevant portion of the setting data includes the number of a group of mutually substitutable electronic circuit components, which is correlated with the feeder type code, a negative decision (NO) is obtained in S12, and S15 is implemented to determine whether the obtained part ID data and feeder type code are coincident with the part ID data of any one of the kinds of the electronic circuit components of the group and the corresponding feeder type code, which are included in the relevant portion of the setting data.

In the setting data, the electronic-circuit-component-group number is related to the corresponding slot number, which is correlated to the part ID data sets identifying the kinds of the electronic circuit components belonging to the group, and each of the part ID data sets is correlated to the feeder type code. The obtained part ID data and feeder type code are compared with the part ID data sets of the group of the setting data, which group corresponds to the entered slot number, to determine whether the obtained part ID data and feeder type code are coincident with the part ID data set of any one of the kinds of the electronic circuit components of the group, and the corresponding feeder type code. Namely, a determination is made as to whether the obtained part data are coincident with the part ID data set of any one of the electronic circuit components belonging to the group specified by the group number included in the relevant portion of the setting data, and as to whether the obtained feeder type code is coincident with the feeder type code of the setting data which corresponds to the part ID data set of the above-indicated one kind of the electronic circuit component of the group. If the obtained part ID data and feeder type data are coincident with those of the setting data, an affirmative decision (YES) is obtained in S15, and the execution of the program is terminated.

If the obtained part ID data and feeder type data are not coincident with those of the relevant portion of the setting data including the electronic-circuit-component-group number, this means an error regarding at least one of the kind of the electronic circuit components set in the feeder 92, and the type of the feeder 92. In this case, a negative decision (NO) is obtained in S15, and S16 is implemented to indicate and alarm the error, for instance, to indicate the slot number, part ID data and feeder type code associated with the error, as in S14, and the number of the group of the electronic circuit components, if necessary. According to the indication and alarming of the error, the operator can re-load the correct type of feeder 92 with the correct kind of the electronic circuit components. The feeders 92 which have been correctly loaded with the electronic circuit components are mounted and positioned on the tables 88, in the predetermined order (in the order of the slot numbers).

Erroneous feeder setting preventing data for preventing erroneous setting of the feeders 92 on the tables 88 are prepared on the basis of the entered slot numbers and the read bar codes of the feeders 92, and are stored in an erroneous feeder setting preventing data memory of the RAM 118. In the present embodiment, the erroneous feeder setting preventing data include a feeder specifying code and the slot number which are correlated with each other. The feeder specifying code is a combination of the type and serial number of the feeder. The two or more feeders 92 of the same kind may be loaded with respective different kinds of electronic circuit components. To distinguish the feeders 92 of the same type loaded with the different kinds of electronic circuit components from each other, both of the feeder type code and the slot number are required. To prevent the erroneous setting of the feeders 92 on the tables 88, a component supply device identification code in the form of the above-indicated feeder specifying code is used.

When the feeders 92 loaded with the electronic circuit components are set according to the setting data, the feeders 92 are checked for erroneous setting, by reference to the setting data. Where a specific mounting position is correlated to a specific group of electronic circuit components, and where the setting position of the feeder 92 used to supply the kind of the electronic component to be mounted at the mounting position is correlated with the above-indicated group of electronic circuit components, the number of the group is correlated to the feeder type code of at least one feeder 92 provided to supply the electronic circuit components belonging to the group in question. Therefore, the feeder 92 loaded with one of the kinds of the electronic components of the group, which one kind is selected by the operator, is considered to correspond to that group, irrespective of the kind of the components which is selected by the operator. In this case, it is not determined that the feeder 92 has been erroneously positioned. In the present embodiment, the setting data include the part ID data sets identifying the kinds of the electronic circuit components belong to the group identified by the group number correlated to each feeder mounting position. In this respect, the setting data memory is considered to be a memory storing group data which indicate the electronic-circuit-component group or groups and which are used to check the feeders for erroneous setting.

When the feeders loaded with the electronic circuit components are mounted on the tables 88, the erroneous feeder setting preventing program illustrated in FIG. 10 is executed, to prevent erroneous setting of the feeders 92 on the table 88 and consequent erroneous setting of the electronic circuit components on the tables 88. Thus, the erroneous setting of the feeders 92 loaded with the electronic circuit components is prevented, so that the feeders 92 are positioned at the predetermined positions on the tables 88, whereby the electronic circuit components of the different kinds are positioned or set at the predetermined positions.

The feeders 92 loaded with the appropriate electronic circuit components are mounted on the tables 88 in the predetermined order, such that the feeders 92 are positioned at the predetermined feeder setting positions. When the operator mounts each feeder 92 on the tables 88, the operator manipulates the keyboard 142 to enter the slot number corresponding to the setting position of the feeder 92, and operates the bar code reader 146 to read the bar code provided on the feeder 92.

In the erroneous feeder setting preventing program, S21 is implemented to determine whether the identification codes have been obtained, that is, whether the slot number has been entered and the bar code of the feeder 92 has been read in. If the identification codes have been obtained, an affirmative decision (YES) is obtained in S21, and S22 is implemented to determine whether a combination of the obtained slot number and feeder specifying code is correct. This determination is made by reference to the erroneous feeder setting preventing data, by determining whether the combination of the obtained slot number and feeder specifying code is coincident with the combination of the slot number and feeder specifying code which are included in the erroneous feeder setting preventing data. If the obtained combination is not coincident with the combination of the erroneous feeder setting preventing data, this means that at least one of the setting position and the feeder 92 itself is erroneous. In this case, a negative decision (NO) is obtained in S22, and S23 is implemented to indicate and alarm the error. For instance, the display 136 indicates the slot number and the feeder specifying code associated with the error. According to this indication, the operator re-mounts the correct feeder 92 at the correct feeder setting position on the table 88.

Where the correct feeder 92 has been mounted at the correct feeder setting position on the table 88, an affirmative decision (YES) is obtained in S22, and S24 is implemented to determine whether the kind of the electronic circuit components with which the feeder 92 has been loaded belongs to any electronic-circuit-component group, that is, whether the portion of the setting data corresponding to the entered slot number include any group number. If the kind of the electronic circuit components does not belong to any group, namely, if any group number is not correlated with the entered slot number, in the setting data, a negative decision (NO) is obtained in S24, and the execution of the program is terminated.

If the kind of the electronic circuit components of the feeder 92 belongs to any electronic-circuit-component group, an affirmative decision (YES) is obtained in S24, and S25 is implemented to read out from the part data library 154 the part data identifying the kind of the electronic circuit components of the feeder 92 mounted on the table 88, and replace the part data with the electronic-circuit-component-group data in the mounting program. The group data are stored in place of the part data, in relation to the feeder setting position. Each mounting position correlated with the feeder setting position at which the feeder 92 loaded with one of the electronic circuit components of the group is set is correlated with that group. In S25, the data (serial number) of the electronic-circuit-component group in question are substituted for the part data which identify one of the electronic circuit components of the group and with which the feeder 92 has been actually loaded. Then, S26 is implemented to store in a mounted-component memory the part data identifying the kind of the electronic circuit components (mounted electronic circuit components) to be actually mounted) with which the feeder 92 has been loaded and which are to be actually mounted. In the set-component memory, the part data are stored in relation to the feeder setting position and the number of the electronic-circuit-component group. The execution of the program is then terminated.

As described above, the part ID data are obtained when each feeder 92 is loaded with the electronic circuit components of the appropriate kind, and the feeder specifying code and the slot number are obtained when that feeder 92 is mounted on the table 88. Thus, the part ID data and the slot number are obtained, as the codes identifying the kind of the components and the feeder setting position. Further, the determination is made as to whether the obtained part ID data and feeder type code are coincident with the part ID data and feeder type code included in the relevant portion of the setting data. On the basis of the obtained slot number and feeder specifying code and the erroneous feeder setting preventing data, the determination is made as to whether the correct feeder 92 has been mounted at the correct slot number. This latter determination is equivalent to a determination on the basis of the code identifying the component supply device, as to whether the obtained part ID and slot number are coincident with the part ID and slot number which are correlated with each other by the setting data. The situation is the same where the slot number is correlated with a group of electronic circuit components. In the present embodiment, the prevention of the erroneous setting of the electronic circuit components on the tables 88 is achieved indirectly.

As described above, the electronic circuit components are positioned on the tables 88, while verifying that the electronic circuit components of the predetermined kind are positioned at the predetermined feeder setting position. Thus, it is possible to prevent positioning of the electronic circuit component of a wrong kind at each feeder setting position, for preventing mounting of the wrong electronic components at the mounting positions. Further, the data identifying the kinds of the electronic circuit components to be actually supplied by the component supply device 18 are stored, and the data identifying the kind of the electronic component to be mounted at each mounting position correlated to any group of electronic circuit components are also stored. The final mounting program is prepared on the basis of all of the part data, namely, the part data set for all of the mounting positions. The final mounting program includes data indicative of the angular positions in which the electronic circuit components are mounted on the printed-wiring board 30, with the predetermined attitudes, and data indicative of the lowered positions at which the suction nozzles receive the electronic circuit components by suction. The mounting program is prepared in the same manner as in the case of preparation according to part data, and a further description in this respect will not be provided. For the electronic circuit components not belonging any groups of mutually substitutable components, the final mounting program may be prepared on the basis of the part data included in the mounting program supplied from the assembling line control computer 140. For the electronic circuit components belonging any groups, the final mounting program may be prepared after the kinds of the electronic circuit components to be mounted are determined.

The thus prepared mounting program is executed by the mounting control computer 112 according to the electronic component mounting control program, so that the mounting device 16 is controlled by the control device 110, according to the data sets for the respective mounting positions while those data sets are read out one after another, whereby the electronic circuit components are mounted on the printed-wiring board 30. During the mounting operation, the tables 88 are moved by the table drive device 84, 86 so that the feeder 92 for the electronic component to be mounted is moved to the component supply position at which the component mounting head 70 located at the component-receiving position receives the electronic circuit component, and the printed-wiring board 30 is moved by the XY table 32 to align the mounting position on the board 30 with the component mounting position of the mounting head 16 at which the mounting head 16 holding the electronic circuit component transfers the electronic circuit component onto the printed-wiring board 30. The kind of the electronic circuit component to be mounted at the mounting position is identified by the part data set which is included in the mounting program and which is correlated to that mounting position. Where the mounting position is correlated to any group of electronic circuit components, a selected one of the kinds of these components of the group is mounted at the mounting position.

Since a desired group of electronic circuit components may be correlated with desired mounting positions, as described above, any one of the plurality of components of that group may be mounted at those mounting positions, so that the efficiency of mounting of the electronic circuit components can be improved. For example, where the electronic circuit component to be usually mounted at a given mounting position is out of stock, the operator selects one of the electronic circuit components of any group to which the component out of stock belongs, provided the above-indicated one of the components of the group is in stock, and the operator positions the selected electronic circuit component on the table 88. Since this selected component belongs to the group, the positioning of this selected component on the table 88 is permitted, so that the component is mounted on the printed-wiring board 30. Accordingly, it is not necessary to interrupt the mounting operation until the stock of the original electronic circuit component is replenished, or until the mounting program is modified so as to substitute the selected one of the components of the group for the original component. Accordingly, the efficiency of mounting of the electronic circuit components is improved. In addition, the present arrangement permits the use of the electronic circuit components which are in stock in an excessively large amount, and makes it possible to reduce the stock of those components.

It will be understood from the foregoing description of the present embodiment that the part data library 154 and the setting data memory constitute a component-group memory, while the program memory of the RAM 118 constitutes a related-data memory, and that S1 of the mounting-program-related-data preparing program constitutes an original-data reading step, while S3 constitutes a replacing step. It will also be understood that a portion of the control device 110 assigned to implement S25 constitutes a processing portion. In the present embodiment, the electronic circuit component mounting program processing system constitutes a portion of the electronic circuit component mounting system. It will further be understood that the keyboard 142 constitutes a setting-portion identification-code obtaining portion, and the bar code reader 146 constitutes a component-identification-code/supplying-device-identification-code obtaining portion, while a portion assigned to implement S13 and S15 constitutes a determining portion, while a portion of the control device assigned to implement S22 constitutes a determining portion for preventing erroneous setting of the feeders 92 on the tables 88.

In the embodiment described above, the feeders 92 are provided with the bar codes, which are read to obtain data identifying the feeders 92. This arrangement makes it possible to monitor the number of the electronic circuit components presently left in each of the feeders 92. If this monitoring is not necessary, it is not necessary to obtain the data identifying the feeders 92, and it is possible to effect only the determination as to whether the electronic circuit components have been set at the predetermined setting positions on the tables 88, in order to prevent erroneous setting of the electronic circuit components on the tables 88. This embodiment will be described by reference to FIG. 12.

In the present embodiment, the setting data are prepared so as to correlate each setting position with an electronic circuit component or a group of electronic circuit components. For each group of electronic circuit components, the setting data include part ID data sets identifying the respective components belonging to the group.

Before the feeders 92 are set on the tables 88, the operator loads each feeder 92 with the electronic circuit components. According to the setting data, the operator sets the necessary electronic circuit components in the appropriate feeders 92. Where a certain setting position is correlated with a group of electronic circuit components, the operator selects one of the kinds of the components of the group, and loads the feeder 92 with the components of the selected kind. The loading of each feeder 92 with the electronic circuit components may be implemented upon setting of the feeder on the table 88, or prior to this setting. The feeder 92 is arranged to accommodate the electronic circuit components and feed them one after another to its component supply portion. A code identifying the feeder 92 is not obtained. When the operator sets the feeder 92 on the table 88 according to the part ID data identifying the kind of the electronic circuit components accommodated in the feeder 92, the operator first manipulates the keyboard 142 to enter data indicative of the setting position at which the feeder 92 loaded with the components is to be set, more specifically, a setting-portion identification code identifying the setting position, in this specific example, the serial number of the slot in the table 88. Then, the operator operates the bar code reader 146 to read the bar code provided for the kind of the electronic circuit components in the feeder 92. Thus, the component identification code identifying the kind of the electronic circuit components accommodated in the feeder 92, and the component-setting-portion identification code identifying the slot are obtained.

Figure 12:
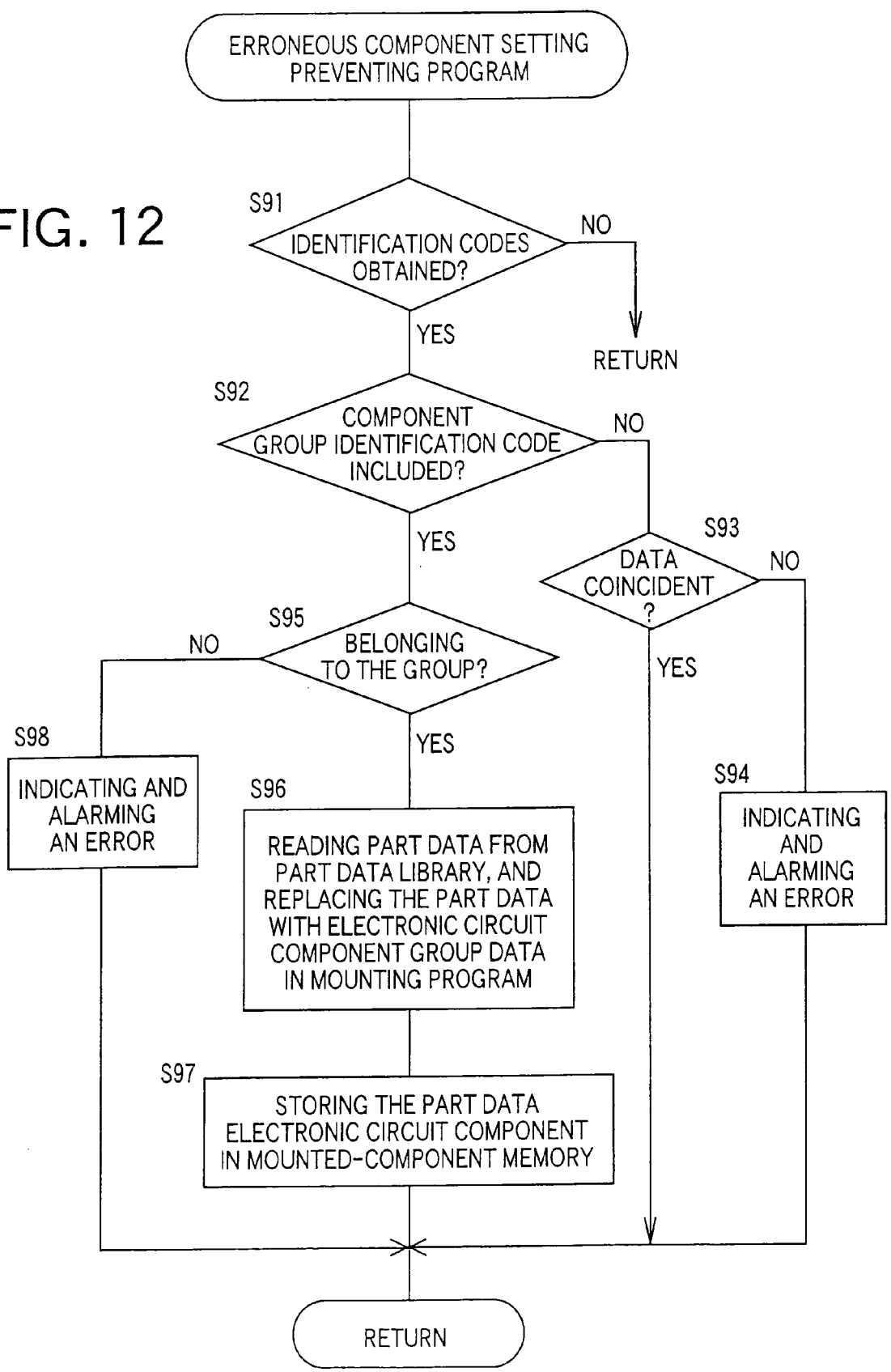
FIG. 12 is a flow chart illustrating an erroneous component setting preventing program stored in a RAM of a mounting control computer of an electronic circuit component mounting system according to another embodiment of the present invention.

In S91 of an erroneous component setting preventing program illustrated in FIG. 12, a determination as to whether the identification codes have been obtained is made. If the slot number has been entered and the bar code of the electronic circuit component has been read, an affirmative decision (YES) is obtained in S91, and S92 is implemented to determine whether a portion of the setting data which corresponds to the entered slot number include an electronic-circuit-component-group number. To this end, the obtained part ID data and slot number are compared with the corresponding portion of the setting data, to determine whether the obtained slot number is correlated with the part ID data in the setting data. If the corresponding portion of the setting data include the part ID data and slot number (namely, include only the part ID data and do not include any group number of electronic circuit component correlated with the entered slot number), a negative decision (NO) is obtained in S92, and S93 is implemented to determine whether the part ID data and slot number included in the corresponding portion of the setting data are coincident with the obtained part ID data and slot number, that is, whether the part ID data correlated with the obtained slot number in the setting data are coincident with the obtained part ID data. If the coincident is obtained, this means that the feeder loaded with the electronic circuit components of the kind in question is set at the correct setting position, without erroneous setting. In this case, an affirmative decision (YES) is obtained in S93, and the execution of the program is terminated.

If the coincidence is not determined, a negative decision (NO) is obtained in S93, and S94 is implemented to activate the display 136 to indicate an occurrence of an error and activate the alarm indicator 132 to inform the operator of the error. The indication and alarming of this error are one example of utilization of a result of the comparison of the obtained slot number and part ID data with the slot number and part ID data included in the relevant portion of the setting data. At this time, the display 136 also indicates a cause of the error, the content of the error, and the slot number associated the error. According to the indication and alarming of the error, the operator takes a suitable measure, for example, changes the kind of the electronic circuit components.

Where the relevant portion of the setting data includes the number of a group of electronic circuit components, which is correlated with the obtained slot number, a affirmative decision (YES) is obtained in S92, and S95 is implemented to determine whether the obtained part ID data and slot number are coincident with the part ID data of any one of the kinds of the electronic circuit components of the group and the corresponding slot number, which are included in the relevant portion of the setting data stored in the setting data memory. Namely, a determination is made in S95 as to whether the obtained part ID data set are coincident with any one of the part ID data sets in the setting data, which part ID data sets identify the electronic circuit components of the group identified by the number correlated to the entered slot number. If the coincidence is obtained, an affirmative decision (YES) is obtained in S95, and S96 and S97 similar to the S25 and S26 described above are implemented. If the coincidence is not obtained, S98 is implemented to indicate and alarm an occurrence of an error.

In the present embodiment, S91 constitutes an identification-code obtaining step, and S93 and S95 constitute a determining step. Further, the keyboard 142 and the bar code reader 146 constitute an identification-code obtaining portion, and a portion assigned to implement S93 and S95 constitutes a determining portion, while a portion assigned to implement S96 constitutes a processing portion. In the setting data, each group of electronic circuit components are correlated with the electronic circuit components belonging to that group, and the setting data memory also constitutes the component-group memory.

Figure 14:
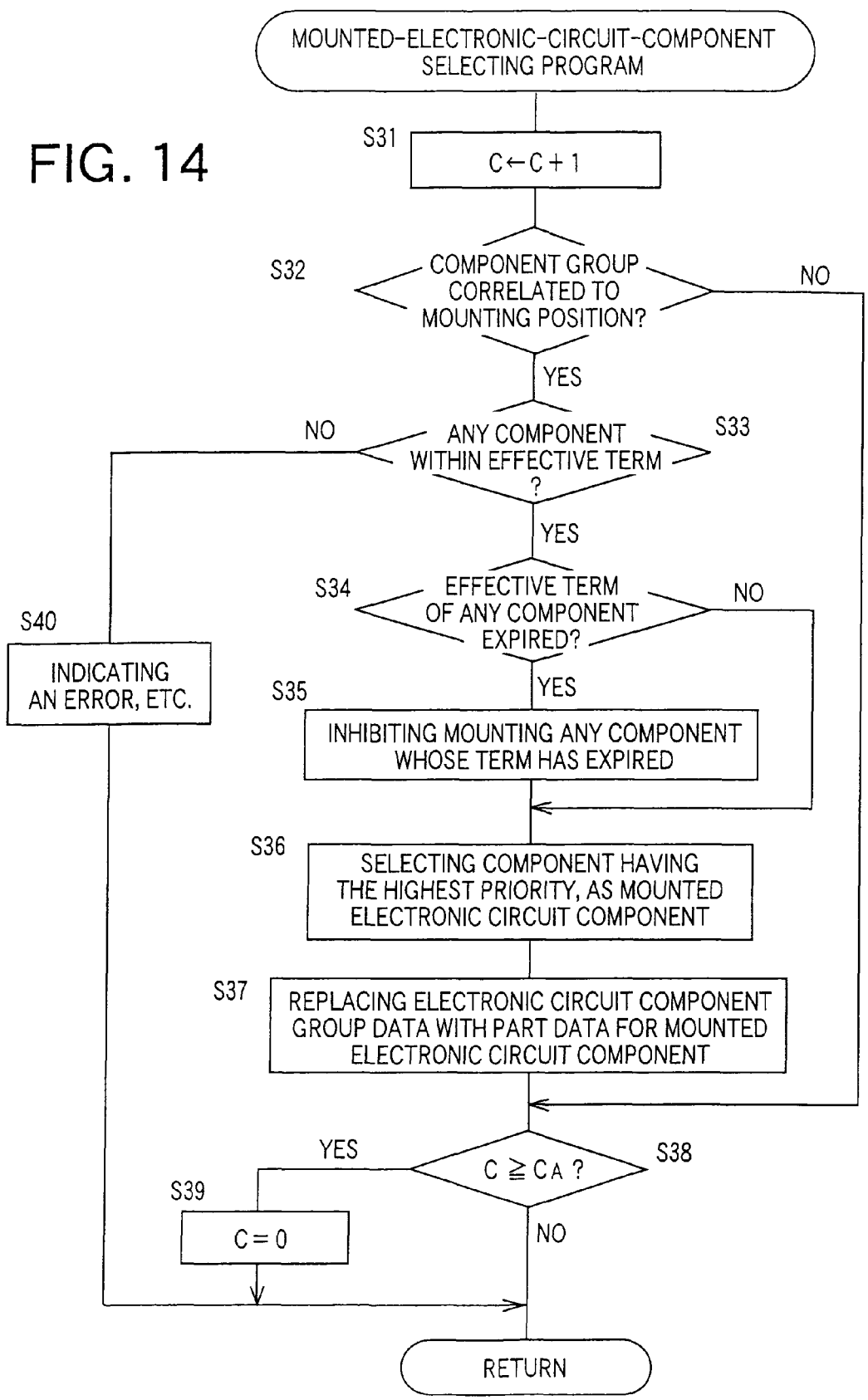
FIG. 14 is a flow chart illustrating a mounted-electronic-circuit-component selecting program executed according to the electronic-circuit-component-group data shown in FIG. 13.

In each of the embodiments described above, the operator selects one of the kinds of the electronic circuit components of a group, which is to be mounted on the printed-wiring board 30. However, the kind of the components to be mounted may be automatically selected according to a predetermined rule. An embodiment according to this modification will be described by reference to FIGS. 13 and 14.

In the present embodiment, the part data library 154 include not only the part data for a plurality of kinds of electronic circuit components, and electronic-circuit-component-group data, but also the part ID data for the electronic components belonging to each group, and data indicative of conditions of use of the electronic circuit components of the groups, namely, order of priority of use and effective term of use. Those data are entered through the keyboard 142 by a person responsible for preparation of the part data.

The mounting program preparing computer 150 prepares the secondary substitution design data on the basis of original design data supplied from the CAD 152, as in the preceding embodiments, and then prepares the mounting program for each of the plurality of mounting machines of the electronic circuit component assembling line, which are assigned to respective sets of electronic circuit components that cooperate to form an entire batch of components to be mounted on the printed-wiring board 30. The thus prepared mounting programs are stored in the program memory provided in the RAM of the mounting program preparing computer 150. For each of at least one group of electronic circuit components which is correlated to a corresponding one of the mounting positions in the prepared mounting positions, one of the different kinds of components belonging to each group is selected according to the predetermined rule, according to a mounted-electronic-circuit-component selecting program illustrated in FIG. 14. This mounted-electronic-circuit-component selecting program is stored in the program memory of the RAM of the computer 150.

The mounted-electronic-circuit-component selecting program is formulated to sequentially read out from the mounting program the mounting positions and data sets correlated with the respective mounting positions, in the order in which the data sets are stored. Where a certain data set is correlated with a group of electronic circuit components, one of these electronic circuit components is selected on the basis of the effective terms of use and the order of priority of use of the components. Namely, of the electronic circuit components of the group whose effective terms of use have not been reached, one of those components which has the highest priority of use is selected as the electronic circuit component to be mounted. To this end, S31 of the mounted-electronic-circuit-component selecting program is implemented to increment a count C of a counter provided to count the number of the mounting positions. This counter is reset to "0" in an initializing operation (not shown), so that the count C is incremented to "1" when S31 is implemented for the first time.

Then, S32 is implemented to determine whether any group of electronic circuit components is correlated with the mounting position represented by the count C, in the mounting program. If any group of electronic circuit components is not correlated with this mounting position, a negative decision (NO) is obtained in S32, and the control flow goes to S38 while skipping S33 through S37, to determine whether the present program has been executed for all of the mounting positions on the printed-wiring board 30, that is, whether the count C has increased to a predetermined value CA which represents the total number of the mounting positions on the printed-wiring board 30. If an negative decision (NO) is obtained in S38, one cycle of execution of the program is terminated.

If the mounting position in question is correlated with any group of electronic circuit components, an affirmative decision (YES) is obtained in S32, the control flow goes to S33 to determine whether the group of electronic circuit components which is correlated with the mounting position represented by the count C includes any component whose effective term has not been reached. To this end, the effective terms of the plurality of electronic circuit components belonging to the group correlated with the relevant mounting position are read out from the part data library 154, and compared with the present time, which is obtained by a clock (not shown) incorporated in the computer 150, for example. If the effective terms of all of the electronic circuit components of the group in question have already expired, that is, if the group does not have any effective electronic circuit components, a negative decision (NO) is obtained in S33, and S40 is implemented to indicate and alarm an occurrence of an error, that is, informing the operator that the group does not include any electronic circuit component whose effective term has not been reached. S40 is further arranged to inhibit the mounting of any electronic circuit components whose effective terms have expired. For example, mounting-inhibiting data indicative of the expiration of the effective terms are correlated with part ID data sets in the part data and component group data, which data sets correspond to the components whose effective terms have been reached.

If the group includes any electronic circuit components whose effective terms have not expired, an affirmative decision (YES) is obtained in S33, and S34 is implemented to determine whether the group includes any electronic circuit component whose effective term has expired. If the group includes any electronic circuit component whose term has expired, an affirmative decision (YES) is obtained in S34, and S35 is implemented to inhibit the mounting of this component, by assigning the mounting-inhibiting data to the corresponding part ID data set.

Then, S36 is implemented to select, as the mounted electronic circuit component, one of the effective electronic circuit components which has the highest priority of use. If the group includes only one effective electronic circuit component, this component is determined as the mounted electronic circuit component. If the group includes a plurality of effective electronic circuit components, one of these components which has the highest priority of use is determined as the mounted electronic circuit component.

The order of priority of use of each electronic circuit component is determined on the basis of the cost or the electric characteristic of each component. Where the order of priority of use is determined on the basis of the cost, the priority of use is increased with a decrease in the cost. Where the order of priority of use is determined on the basis of the electric characteristic, the priority of use is increased with an increase in the capability of the components to achieve the function to be achieved at the mounting position in question. The order of priority of use may be determined on the basis of both the cost and the electric characteristic of the components. Then, S37 is implemented to read from the part data library 154 the part ID data set identifying the selected electronic circuit component, and to substitute the read-out part ID data set for the electronic-circuit-component-group data, in the secondary substitution design data.

The negative decision (NO) is obtained in S38, and S31 through S37 are repeated implemented, until the mounted-electronic-circuit-component selecting program is executed for all of the mounting positions on the printed-wiring board 30. When the mounted-electronic-circuit-component selecting program has been executed for all of the mounting positions, an affirmative decision (YES) is obtained in S38, and S39 is implemented to reset the count C to "0".

In the present embodiment, the mounting program wherein one of the electronic circuit components of each group is selected as the component to be mounted on the printed-wiring board 30 is supplied from the mounting program preparing computer 150 to the mounting control computer 112 through the assembling line administering computer 140. In this mounting program, all of the mounting positions are correlated with the respective part ID data sets, and the setting data are formulated such that each mounting position is correlated with the corresponding feeder 92 and the corresponding kind of electronic circuit component. According to the setting data, the operator loads each feeder 92 with the corresponding kind of electronic circuit components, and sets the thus loaded feeders 92 on the tables 88.

In the present embodiment, the control device of the electronic circuit component mounting system includes the mounting program preparing computer 150 as well as the mounting control computer 112. A portion of the control device assigned to implement S33 constitutes a present-time obtaining portion arranged to read the present time, and a portion of the control device assigned to implement S35 and S40 constitutes a component-mounting inhibiting portion arranged to inhibit the mounting of the components whose effective terms have expired. Further, a portion of the control device assigned to implement S36 constitutes a priority-order selecting portion, while a portion of the control device assigned to implement S37 constitutes a processing portion. The program memory of the mounting program preparing computer 150 constitutes the related-data memory.

The selection of one of the electronic circuit components of each group which is to be mounted on the printed-wiring board 30 may be effected after the secondary substitution design data are prepared and before the mounting program is prepared. In this case, the mounting program is prepared after the selection of the components to be mounted.

In each of the embodiments described above, the mounting program preparing computer 150 is connected to the mounting control computer 112 through the assembling line administering computer 140, and the mounting program preparing computer 150 functions as one element of the electronic circuit component mounting system. However, it is not essential to connect the mounting program preparing computer 150 to the mounting control computer 112. In the preceding embodiments wherein one of the electronic circuit components belonging to each group is selected as the component to be mounted by the mounting device 16, the mounting program and setting data indicative of the selected electronic circuit components and the order of mounting of the components may be stored in a recording medium in the form of a floppy disc, so that the mounting control computer 112 is loaded with this floppy disc, to perform the operation to mount the electronic circuit components on the printed-wiring board 30, without direct connection of the mounting control computer 122 to the mounting program preparing computer 150 and the part data library 154. In this case, the mounting program preparing computer 150 and the part data library 154 constitute the processing system, which does not include the electronic circuit component mounting machines. Further, a portion of the processing system assigned to select the mounted electronic circuit component according to the predetermined rule determined by the mounting program preparing computer 150 constitutes the mounted-component selecting portion, and a portion of the processing system assigned to substitute the part data of the selected component for the relevant electronic-circuit-component-group data constitutes the processing portion.

Figure 16:
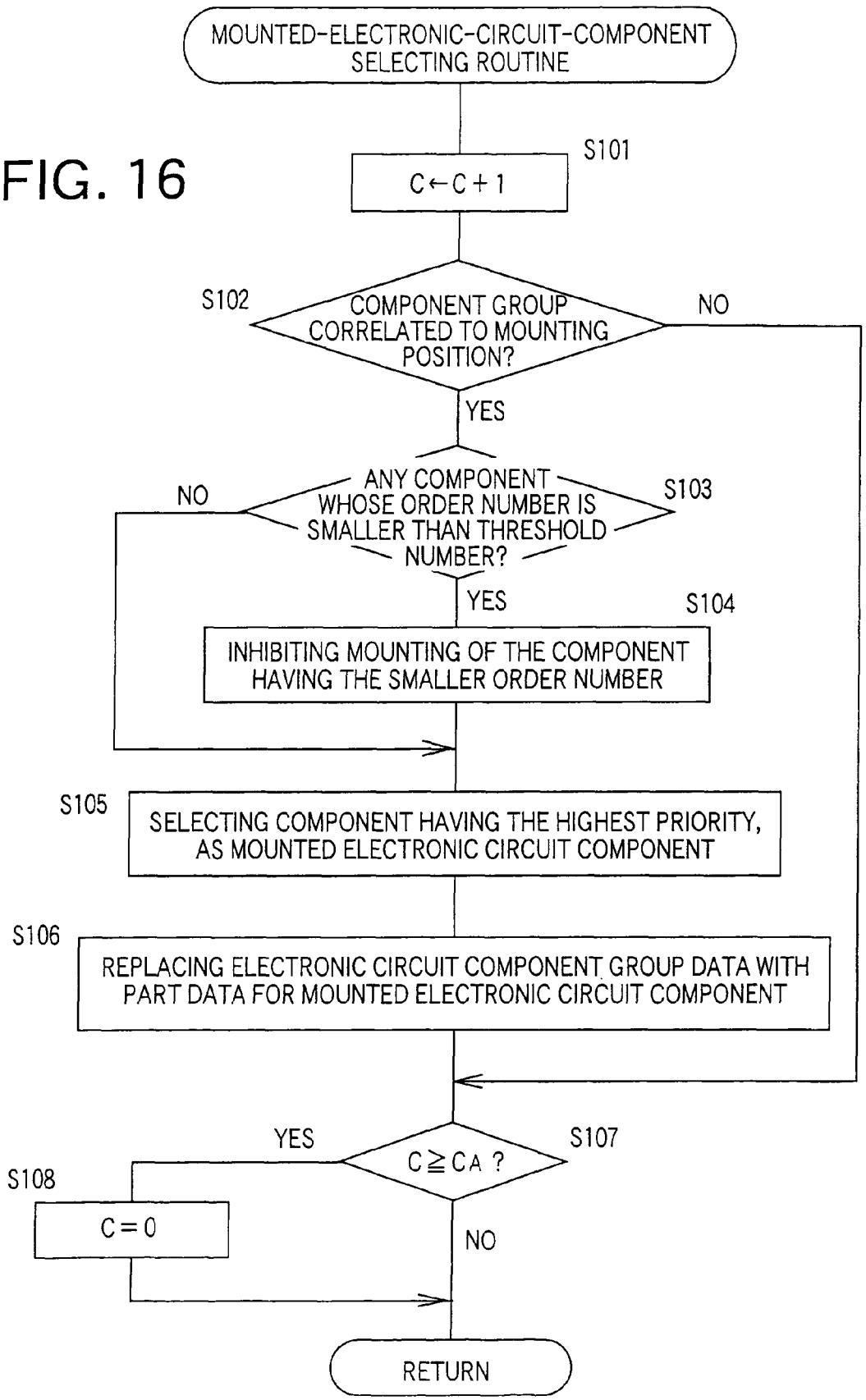
FIG. 16 is a flow chart illustrating a mounted-electronic-circuit-component selecting program executed according to the electronic-circuit-component-group data shown in FIG. 15.

The effective term of use of the electronic circuit components used to select the mounted electronic circuit component may be replaced by the order of use of the components. An embodiment according to this modification will be described by reference to FIGS. 15 and 16.

In the present embodiment, the electronic-circuit-component-group data include data indicative of the order of use of each of the electronic circuit components belonging to each group. The order of use of each component is represented by the order number. The electronic-circuit-component-group data further include data indicative of the priority order of use of each component of each group. The order numbers of the components are determined on the basis of the effective terms of the components such that the order number decreases with a decrease in the effective term. Alternatively, the order numbers are determined on the basis of the cost of the components such that the order number decreases with a decrease in the cost.

For each group of electronic circuit components, a mounting-inhibiting threshold number is set and stored in the part data library 154. This mounting-inhibiting threshold number is determined after the determination of the order of use and the order of priority of use. The mounting-inhibiting threshold number is determined depending upon the situation upon determination of the threshold number, for instance, so as to inhibit the mounting of the components whose effective terms have expired. Where the order numbers of the components are determined on the basis of the effective terms of the components, the order number of a component having a comparatively short effective term is determined to be smaller than that of a component having a comparatively long effective term, so that the mounting of mounting-inhibited components having the order numbers smaller than the mounting-inhibiting threshold number is inhibited. The mounting-inhibiting threshold number once determined for each group of components may be kept unchanged, or may be changed.

S101 and S102 of the mounted-electronic-circuit-component selecting program are similar to S31 and S32 of the above-described mounted-electronic-circuit-component selecting program. S103 is then implemented to determine whether any electronic circuit component belonging to the group in question is the mounting-inhibited component having the order number smaller than the predetermined mounting-inhibiting threshold number set for the group in question. If a negative decision (NO) is obtained in S103, the control flow goes to S105.

If any electronic circuit component of the group has the order number smaller than the threshold number, an affirmative decision (YES) is obtained in S103, and S104 is implemented to inhibit the mounting of the mounting-inhibited component whose order number is smaller than the threshold number, by assigning the mounting-inhibiting data to the part ID data set of the component in question.

Then, S105 is implemented to select, as the mounted electronic circuit component, one of mounting-permitted components having the order numbers not smaller than the mounting-inhibiting threshold number, which one component has the highest priority of use. S105 is followed by S106 similar to S37 described above.

In the present embodiment, the control device includes the mounting program preparing computer 150, and a mounting-inhibiting-number obtaining portion is constituted by a portion of the control device which is assigned to store the operator-entered mounting-inhibiting threshold numbers in relation to the respective electronic-circuit-component groups. Further, a component-mounting inhibiting portion for inhibiting the mounting of the components whose order numbers are smaller than the threshold numbers is constituted by a portion of the control device assigned to implement S104.

The mounting-inhibiting data may be erased when the execution of the mounted-electronic-circuit-component selecting program is terminated. If the mounting-inhibiting threshold numbers are kept unchanged, the mounting-inhibiting data may be retained. If the mounting-inhibiting threshold numbers are changed, the mounting-inhibiting data may be erased when the execution of the mounted-electronic-circuit-component selecting program is terminated, or when the execution is initiated. The mounting-inhibiting data may be manually erased by the operator, or automatically erased.

Figure 17:
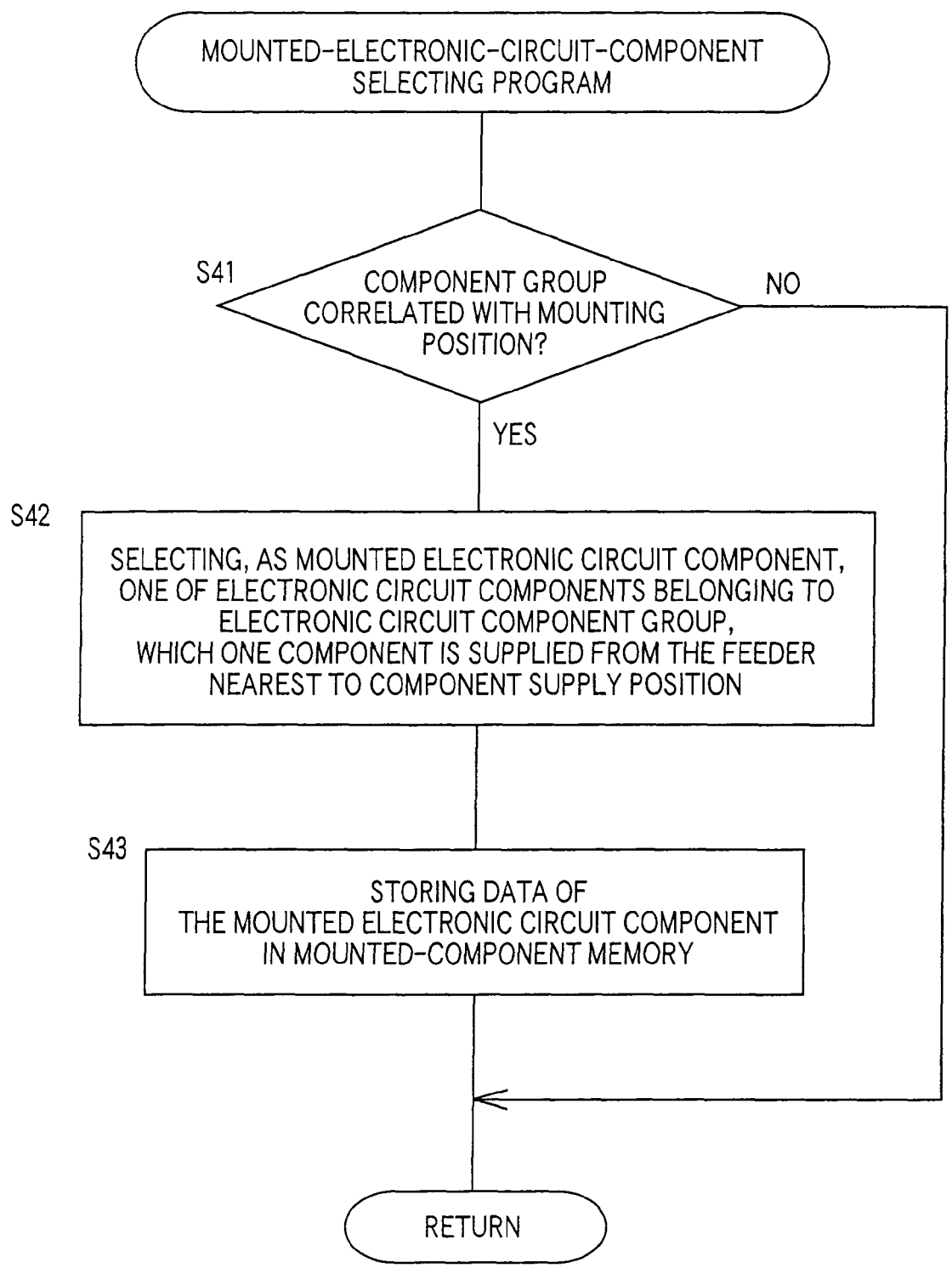
FIG. 17 is a view showing a mounted-electronic-circuit-component selecting program stored in a RAM of a mounting control computer of an electronic circuit component mounting system according to a further embodiment of the present invention.

In the embodiments described above, one of the electronic circuit components belonging to each group is selected as the mounted electronic circuit component prior to initiation of a series of component mounting operation. However, the selection may be made during the component mounting operation, provided the electronic-circuit-component-group data which correlate each group of electronic circuit components with those components of the group are used before mounting of the electronic circuit components on the printed-wiring board, to select the electronic circuit component to be mounted at the mounting position in question before the component mounting head receives the electronic circuit component from the component supply device. Where the mounted electronic circuit component is selected during the component mounting operation, one of the components of a group which is supplied from the feeder presently located nearest to the component supply position is selected as the mounted electronic circuit component. An embodiment according to this embodiment will be described by reference to FIG. 17 illustrating a mounted-electronic-circuit-component selecting program. The mechanical arrangement of the present electronic circuit component mounting system is identical with that of the preceding embodiments, and will not be described.

Like the embodiments shown in FIGS. 1–11, the present embodiment is arranged such that the mounting program and the setting data prepared by the mounting program preparing computer 150 are supplied to the mounting control computer 112, and the setting data are displayed on the display 136, so that the operator can load the feeders 92 with the electronic circuit components, and can set the feeders 92 loaded with the components on the tables 88. The setting data used in the present embodiment are identical with the setting data shown in FIG. 8. The operator selects one of the kinds of electronic circuit components of each group correlated with the corresponding one of the mounting positions, and loads the appropriate feeder 92 with the electronic circuit components of the selected kind. The operator sets the feeder 92 at the specified slot in the table 88.

When the operator loads the feeder 92 with the electronic circuit components of the kind selected for each feeder setting position correlated to a group of components, or when the operator sets the loaded feeder 92 on the table 88, the operator enters the feeder setting position, namely, the slot number, and operates the bar code reader 146 to read the bar code provided for the kind of the electronic component in question, so that the kind of the electronic circuit components to be set at the feeder setting position correlated to the group of electronic circuit components is identified. The electronic-circuit-component-group data in the original setting data are replaced by the part ID data identifying the components actually set on the table 88, so that the original setting data are converted into actual setting data, which are stored. However, the original setting data including the electronic-circuit-component-group data and data correlating the components of each group with the corresponding feeder setting position may be retained. In this case, the actual setting data are prepared so as to correlate all feeder setting positions with the respective electronic circuit components to be mounted at the respective feeder setting positions. In either of those cases, the actual setting data are prepared such that the kinds of the electronic circuit components to be mounted at all of the feeder setting positions can be identified. In the present embodiment, the erroneous setting preventing program is not executed, and the groups of electronic circuit components are merely correlated with the respective mounting positions by the mounting program. The setting data need not include data identifying the kinds of the feeders, and may include only data which correlate the feeder mounting positions and the respective kinds of the electronic circuit components.

In the present embodiment, the electronic circuit component mounting control program is executed by the mounting control computer 112, to sequentially read out the respective portions of the mounting program which correspond to the respective component mounting positions, so that the electronic circuit components are mounted on the printed-wiring board 30, according to the mounting program. The mounted-electronic-circuit-component selecting program illustrated in FIG. 17 is executed when a portion of the mounting program which corresponds to each mounting position is read out. In S41 of this selecting program, a determination is made as to whether the mounting position in question is correlated with any group of electronic circuit components. If the mounting position is not correlated with any group of components, a negative decision (NO) is obtained in S41, and the execution of the selecting program is terminated. For each mounting position correlated to a single electronic circuit component (not correlated to any group of electronic circuit components), the final mounting program is prepared prior to the initiation of a component mounting operation, and the electronic circuit components correlated with the respective mounting positions are received from the component supply device 18, and mounted on the printed-wiring board 30, according to the final mounting program.

If the mounting position in question is correlated with any group of electronic circuit components, an affirmative decision (YES) is obtained in S41, and S42 is implemented to select, as the mounted electronic circuit component, one of a plurality of electronic circuit components of the relevant group, which is to be supplied from the feeder 92 presently located nearest to the component supply position. The feeder 92 presently located at the component supply position can be recognized from the mounting program. On the basis of the electronic-circuit-component-group data in the part data library 154 and the actual setting data, the electronic circuit components to be supplied from the feeders 92 located on the opposite sides of the feeder 92 presently located at the component supply position in the feeding direction of the tables 88 are sequentially checked so as to find one of the plurality of electronic circuit components which belongs to the group in question and which is located nearest to the component supply position. The component thus found is selected as the mounted electronic circuit component. If the two feeders 92 which are located on the opposite sides of the component supply position and spaced from the component supply position by the same distance accommodate the two kinds of electronic circuit components both of which belong to the group in question, one of these two kinds of components is selected as the mounted electronic circuit-component, according to a predetermined rule. For example, one of those two kinds of components which is accommodated in one of the above-indicated two feeder 92 which is located upstream of the component supply position in the positive feeding direction of the tables 88 is selected as the mounted electronic circuit component. Alternatively, one of the two kinds of components which is spaced by a shorter distance from the feeder 92 which supplies the next electronic circuit component is selected as the mounted electronic circuit component. The feeder 92 presently located nearest to the component supply position may accommodate the electronic circuit components of the kind originally assigned to be mounted at the mounting position correlated with the group of electronic circuit components in question, or may accommodate the electronic circuit components of any other kind originally assigned to be mounted at any other mounting position.

Then, S43 is implemented to store in the mounted-component memory data of the electronic circuit component selected as the mounted electronic circuit component, in relation to the mounting position and the group in question. For each mounting position correlated with any group of electronic circuit components, part data identifying the selected electronic circuit component are read out from the part data library 154, to prepare the final mounting program for receiving this electronic circuit component from the appropriate feeder 92 and mounting it on the printed-wiring board. According to this final mounting program, the mounting device 16, etc. are controlled so that the component mounting head 70 receives the selected electronic circuit component from the component supply device 18 and mounts it on the printed-wiring board 30 held by the wiring-board holding device 14.

Where the electronic circuit components are continuously mounted on a plurality of printed-wiring boards of the same kind, the mounting program already prepared for the last printed-wiring board may be used to mount the electronic circuit components on the next printed-wiring board, if the kinds of components to be mounted on the next printed-wiring board at the mounting positions correlated with the respective groups of components are the same as mounted at the same mounting positions on the last printed-wiring board. In this case, the mounting program is stored in the memory, in relation to the mounted positions, but the data of the mounted electronic circuit components need not be stored in the mounted-component memory. Where the electronic circuit components are continuously mounted on a plurality of printed-wiring boards of the same kind, the mounted electronic circuit components are selected for the first printed-wiring board, to prepare and store the final mounting program, which is used for mounting the electronic circuit components on the subsequent printed-wiring boards, without the selection of the mounted electronic circuit components for the subsequent printed-wiring boards.

Where one of the electronic circuit components of any group which is to be supplied from the feeder presently located nearest to the component supply position is selected as the mounted electronic circuit component, as described above, the selected mounted electronic circuit component is not necessarily the component originally assigned to be mounted at the mounting position correlated with the group in question, and may be any other component, or a component to be mounted at a mounting position correlated with any other group.

In the present embodiment, a plurality of setting positions are provided for respective electronic circuit components belonging to each group of electronic circuit components, and the operator sets the electronic circuit components of each group at the respective setting positions selected by the operator, as in the preceding embodiments. However, the operator may set the same kind of components at the different setting positions, or at least two different kinds of components at the setting positions. These different setting positions corresponding to each group of electronic circuit components are usually adjacent to each other, and one of the components which is accommodated in the feeder 92 presently located nearest to the component supply position is selected as the mounted electronic component, irrespective of whether the components set at the different setting positions are the same or different in kind. If any one of the electronic circuit components of a group is out of stock, this component is excluded from the list of components selectable as the mounted electronic circuit component.

In the present embodiment, a proximity-component selecting portion and a processing portion are constituted by a portion of the control device assigned to implement S42, and a mounting program reading step is constituted by a portion of the electronic circuit component mounting control program assigned to implement a step of sequentially reading out portions of the mounting program stored in the program memory which correspond to the respective mounting positions, when the electronic circuit components are mounted on the printed-wiring board 30 in the mounting machine 10. Further, a portion of the electronic circuit component mounting control program assigned to select, receive and mount one of the electronic circuit components of each group correlated to the mounting position corresponding to the read-out portion of the mounting program.

Where the kinds of electronic circuit components of a group which are set at a plurality of setting positions are different from each other, the mounted electronic circuit component may be selected from among only the mutually substitutable electronic circuit components which have been set at the respective setting positions corresponding to the group in question. The electronic circuit components which belong to a group and which have been set on the table are the mutually substitutable components one of which is selected as the component to be mounted at the mounting position correlated with the group in question, when any other component of the group becomes out of stock, during a series of operation to mount the electronic circuit components.

The operator may determine the electronic circuit components of a group which are to be set at the respective setting positions, on the basis of the electronic-circuit-component-group data. Alternatively, a person other than the operator who is responsible for setting the electronic circuit components may determine the components to be set at the setting positions, and the operator may set the determined components at the respective setting positions. In either of these cases, the electronic circuit components set at the setting positions are known, and one of these mutually substitutable components is selected as the mounted electronic circuit component, according to a selected one of predetermined different rules. For example, one of the components which is supplied from the feeder presently located nearest to the component supply position or which has the highest priority of use is selected as the mounted electronic circuit component. The selection of the mounted component is made according to a selected one of a plurality of mounted-electronic-circuit-component selecting programs wherein the selecting step S42 shown in FIG. 17 is formulated differently depending upon the predetermined different rules.

In the electronic circuit component mounting system arranged to select the mounted electronic circuit component to be mounted at the mounting position correlated with each group of components, during the series of component mounting operation, the mounted component may be selected from only the mutually substitutable components which have been set on the table, or may be selected from all of the components to be supplied from the component supply device. In the latter case, too, the selection of the mounted component may be made according to a selected one of a plurality of different selecting programs which corresponds to a selected one of different selecting rules, such as the rules depending upon the distance of the feeders from the component supply position and the order of priority of use of the components. In the electronic circuit component mounting system arranged to select the mounted electronic circuit component to be mounted at the mounting position correlated with each group of components, during the series of component mounting operation, the mutually substitutable electronic circuit components corresponding to each group are determined and set on the table, and one of these mutually substitutable components is selected as the mounted component. Alternatively, such mutually substitutable electronic circuit components are not selectively set on the table, and the mounted component is selected from all of the components to be supplied from the component supply device. One of these two alternative arrangements is selected, and the selection of the mounted component is made according to the corresponding one of different selecting programs that correspond to the two alternative arrangements.

In each of the embodiments described above, the component supply device is arranged such that the tables on which the plurality of feeders are mounted are movable to locate the component supply portion of a selected one of the feeders at the component supply position. However, the component supply device may be fixedly disposed. In this case, the component mounting head is movable to desired positions in a plane parallel to the printed-wiring board, for receiving the electronic circuit components to be mounted. An embodiment according to this modification will be described by reference to FIGS. 18 through 21.

Figure 18:
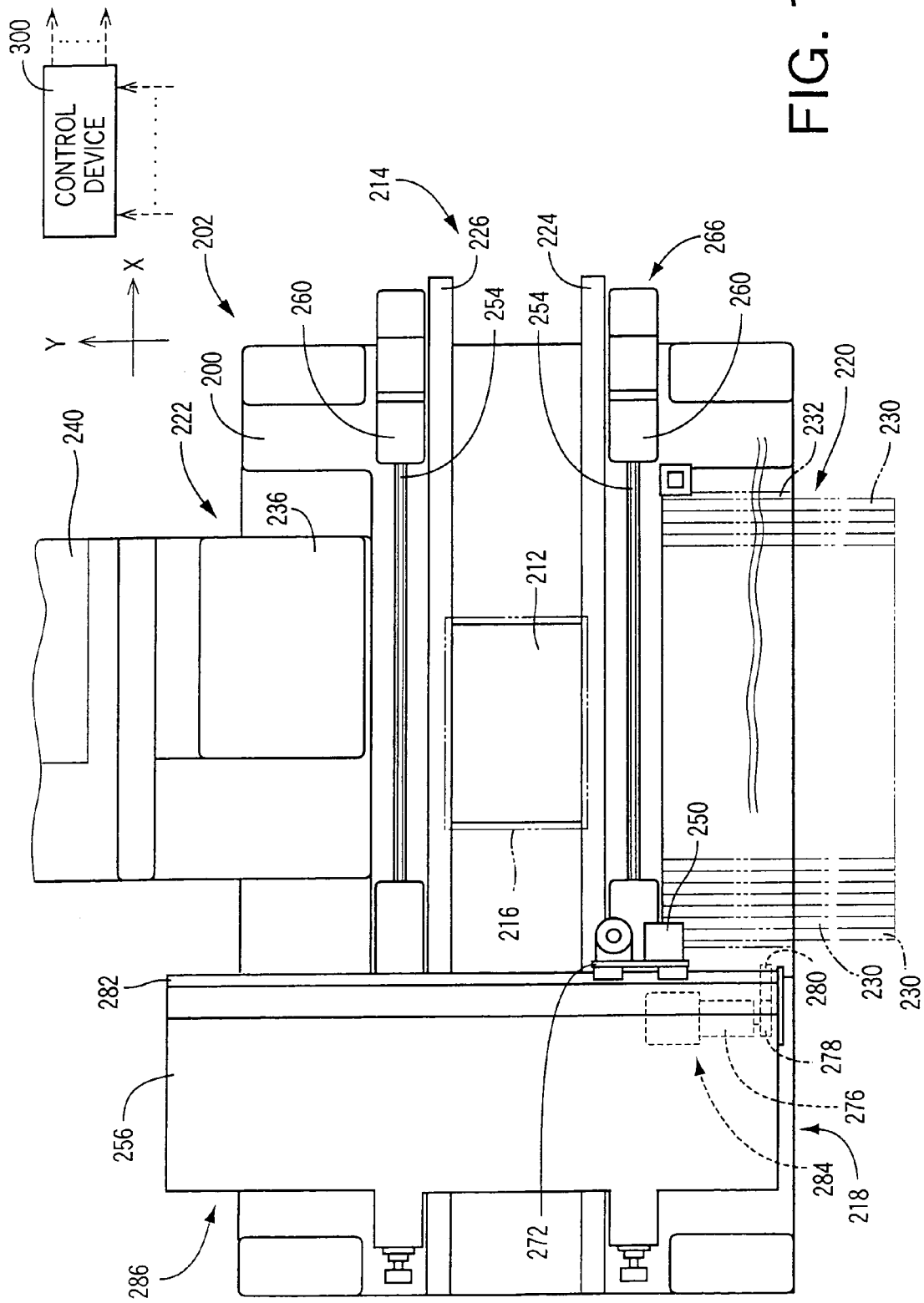
FIG. 18 is a plan view showing an electronic circuit component mounting system according to a further embodiment of the present invention.
Figure 19:
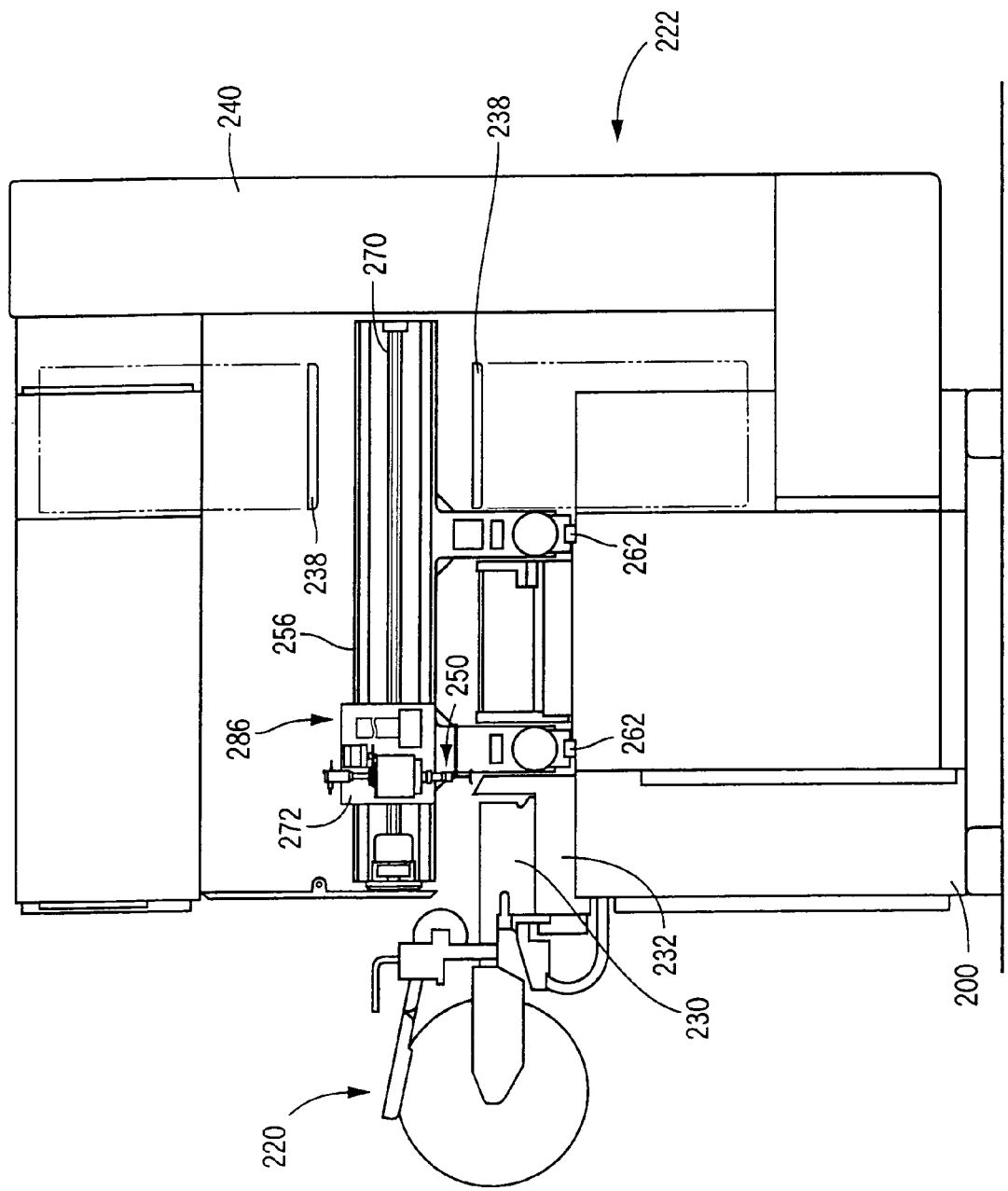
FIG. 19 is a side view showing the electronic circuit component mounting system shown in FIG. 18.
Figure 20:
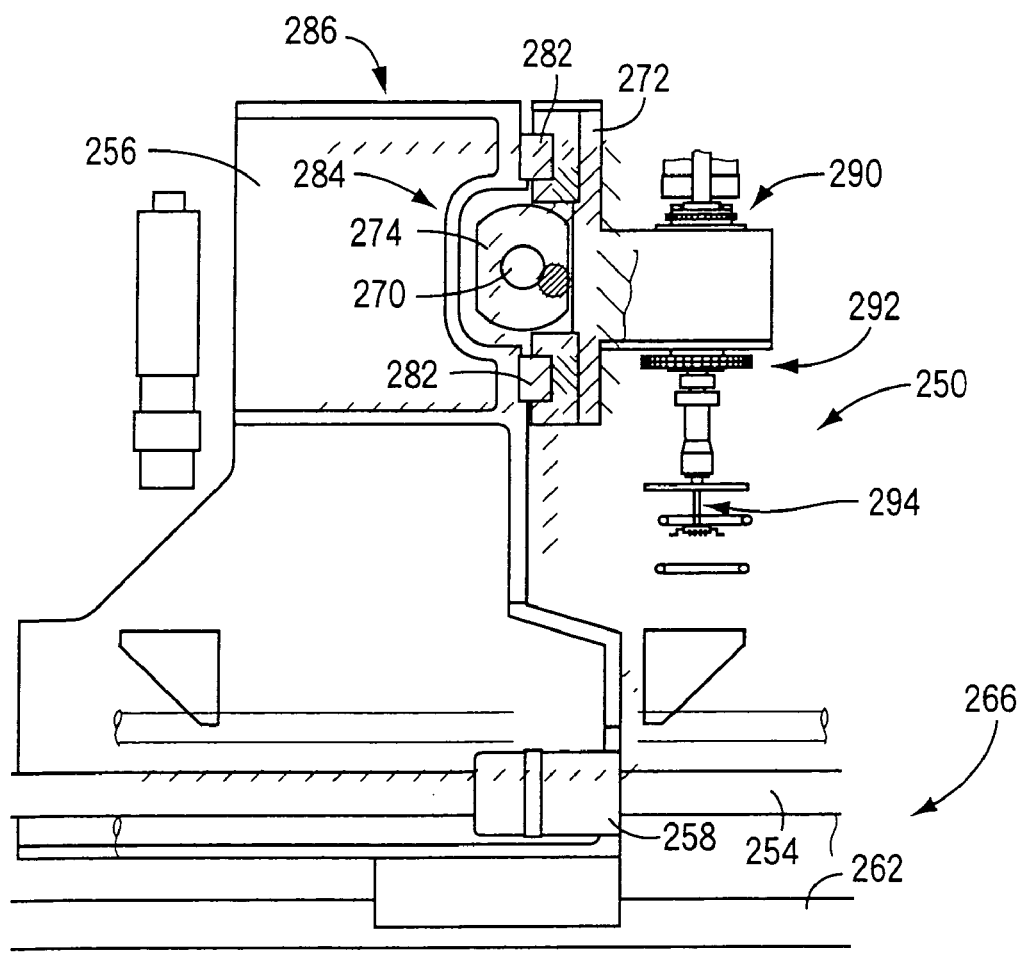
FIG. 20 is a front view (partly in cross section) showing the electronic circuit component mounting system shown in FIG. 18.

In FIG. 18, reference numeral 200 denotes a bed of an electronic circuit component mounting machine 202. On the bed 200, there are disposed a wiring-board conveyor 214, a wiring-board holding device 216, a mounting device 218, component supply devices 220, 222, etc.

The wiring-board conveyor 214 is a belt conveyor provided with a pair of guide rails 224, 226, for example, and is arranged to feed a printed-wiring board 212 in the x-axis direction.

The wiring-board holding device 216 is disposed at a portion corresponding to the component mounting position, to hold the printed-wiring board 212 which has been fed and stopped by the wiring-board conveyor 214.

The component supply devices 220, 222 are spaced apart from each other in the y-axis direction and disposed on the opposite sides of the wiring-board conveyor 214. The component supply device 220 is a component supply device of feeder type, while the component supply device 222 is a component supply device of tray type. The feeder type component supply device 220 has a multiplicity of feeders 230 arranged in the x-axis direction. The tray type component supply device 222 has a multiplicity of tray accommodating boxes 238 in which there are supported respective trays 236 each accommodating electronic circuit components. The tray accommodating boxes 238 are arranged in the vertical direction, and the trays 236 are vertically movable. The mounting device 218 receives an electronic circuit component from the tray 236 raised to the component supply position.

The mounting device 218 is arranged to move a component mounting head 250 in the x-axis and y-axis directions, for thereby moving the electronic circuit component and mounting it on the printed-wiring board 212. The mounting device 218 includes an x-axis slide drive device 266, a y-axis slide drive device 284, the component mounting head 250, an elevating and lower device 290 for elevating and lowering the component mounting head 250, a rotating device for rotating the mounting head 250, etc. The x-axis slide drive device 266 includes an x-axis slide 256, a nut 258, a ballscrew 254 and an x-axis slide drive motor 260, while the y-axis slide drive device 284 includes a y-axis slide 272 disposed on the x-axis slide 256, a nut 274, a ballscrew 270 and an x-axis slide drive motor 276. The component mounting head 250 is disposed on the y-axis slide 272.

The present electronic circuit component mounting machine 202 is also provided with a fiducial-mark imaging system and a component imaging system. The fiducial-mark imaging system is arranged to take images of fiducial marks provided on the printed-wiring board 212, while the component imaging system is arranged to take an image of the electronic circuit component held by the component mounting head 250. These imaging systems, which do not closely relate to the present invention, will not be further described.

Like the mounting machine 10 described above, the mounting machine 202 is controlled by a control device 300 (shown in FIG. 18) which is principally constituted by a computer. Like the mounting control computer 112 described above, this computer is connected to an assembling line administering computer (not shown) and is supplied with a mounting program, etc.

In the present electronic circuit component mounting system, the electronic circuit components are supplied from the feeder 230 and the trays 236, and the packaging data included in the part data stored in the part data library 154 for the individual electronic circuit components indicate whether each electronic circuit component is held in the feeders 236 or in the trays 236. In the present embodiment, the electronic circuit components belonging to the same group are all accommodated in the feeders 230 or in the trays 230, and the part data library 154 stores electronic-circuit-component-group data which are prepared to indicate whether each group of electronic circuit components is accommodated in the feeders 230 or in the trays 236.

The setting data for the feeder type component supply device 220 are prepared in the same manner as in the embodiment shown in FIG. 17. The setting data for the tray type component supply device 222 are prepared so as to correlate each setting position with an electronic circuit component or a group of electronic circuit components. The setting data identify a plurality of electronic circuit components belonging to each group of components. In the tray type component supply device 222, the plurality of trays 236 are arranged so as to be movable in the vertical direction, independently of each other. The setting positions of the trays 236 are the vertical positions of the trays 236. For example, support members supporting the respective trays 236 are given respective serial numbers, which indicate the vertical positions of the trays 236. The mounting program prepared by the mounting program preparing computer 150 are supplied to the mounting machine 202. In the mounting program, the mounting positions are correlated with the respective electronic circuit components or the respective groups of electronic circuit components, which are in turn correlated with the respective setting positions. The mounting program includes not only the data indicative of the setting positions of the components, but also data indicating whether each electronic circuit component is supplied from the feeder type component supply device 220 or the tray type component supply device 222.

According to the setting data, the operator sets the feeders 230 loaded with the electronic circuit components, on the table 232, and sets the trays 236 loaded with the electronic circuit components, on the respective support members. Where a certain setting position is correlated with a group of electronic circuit components, the operator selects one of the kinds of the electronic circuit components of the group, and loads the corresponding feeder 230 or tray 236 with the selected kind of electronic circuit components. At this time, the setting position is entered, and the bar code identifying the kind of the component in question is read. Where the electronic components of the selected kind are accommodated with the tray 236, the tray is provided with the corresponding bar code and part ID, so that the kind of the electronic component selected from the group correlated with the setting position in question can be identified, and the actual setting data can be obtained. In this case, the prevention of erroneous setting of the components is not effected. In the mounting program, the setting position is merely correlated with the group of electronic circuit components.

When the present electronic circuit component mounting system is operated to mount the electronic circuit components on the printed-wiring board 212, the component mounting head 250 is moved by a component-mounting-head moving device 286, to receive the electronic circuit components from the feeder type component supply device 220 or the tray type component supply device 222, and to mount them on the printed-wiring board 212.

Figure 21:
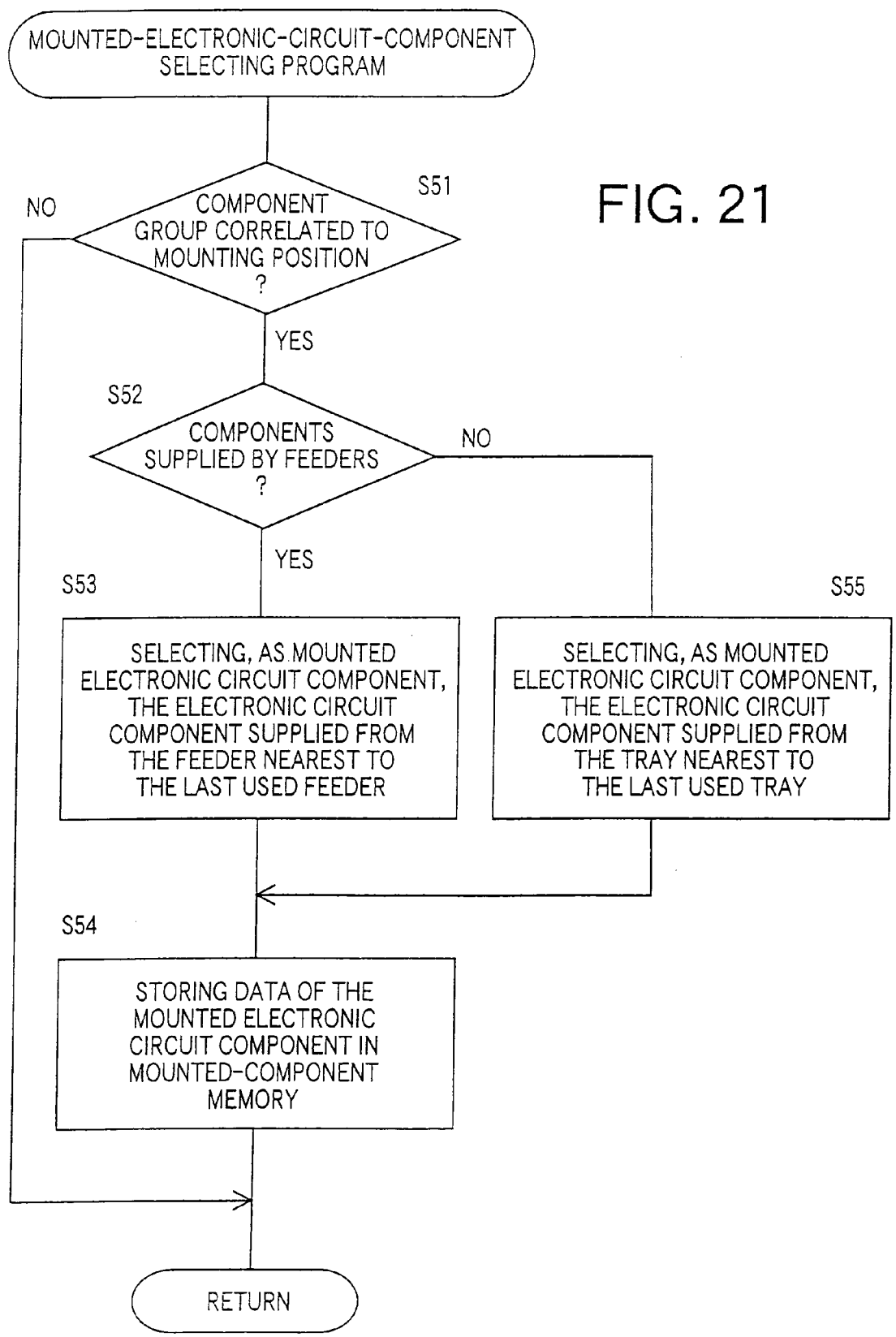
FIG. 21 is a flow chart illustrating a mounted-electronic-circuit-component selecting program executed in a mounting machine of the electronic circuit component mounting system shown in FIGS. 18–20.

During the component mounting operation, the portions of the mounting program which correspond to the respective mounting positions are read out, and a mounted-electronic-circuit-component selecting program shown in FIG. 21 is executed when the portion of the mounting program corresponding to each mounting position is read out. In S51, of this program, a determination as to whether the mounting position in question is correlated to any group of electronic circuit components. If the mounting position is not correlated to any group, a negative decision (NO) is obtained in S51, and the execution of the program is terminated.

If the mounting position is correlated with any group of electronic circuit components, an affirmative decision (YES) is obtained in S51, and the control flow goes to S52 to determine whether the electronic circuit components of the group are supplied from the feeders 230. This determination is made by determining whether the mounting position in question is correlated with the setting positions of the feeder type component supply device or the setting positions of the tray type component supply device 222. If the components are supplied from the feeders 230, an affirmative decision (YES) is obtained in S52, and the control flow goes to S53 to select, as the mounted electronic circuit component, one of the electronic circuit components of the group in question, which is to be supplied from the feeder 230 located nearest to the feeder 230 from which the last electronic circuit component was supplied.

If the electronic circuit component mounted last on the printed-wiring board 212 was supplied from one of the feeders 230, the feeder 230 nearest to that one feeder 230 is used to supply the component to be mounted at the mounting position in question. If the component mounted last on the printed-wiring board 212 was supplied from one of the trays 230, the feeder 230 nearest to the feeder 230 which was used last before the tray or trays 230 was/were used to supply the preceding electronic circuit components is used to supply the component to be mounted at the mounting position in question.

One of the feeders 230 which supplies one of the electronic circuit components of the group in question and which is nearest to the last used feeder 230 is found and selected according to the mounting program actual setting data and electronic-circuit-component-group data in the part data library 154. After the feeder 230 from which the mounted component is supplied is selected, S54 is implemented to store data of the selected component in the mounted-component memory, in relation to the mounting position.

If the electronic circuit components of the group in question are supplied from the trays 236, a negative decision (NO) is obtained in S52, and the control flow goes to S55 to select, as the mounted electronic circuit component, one of the electronic circuit components of the group in question, which is to be supplied from the tray 236 located nearest to the tray 236 from which the last electronic circuit component was supplied. S54 is then implemented. One of the trays 236 which is nearest to the last used tray 236 is found and selected according to the mounting program, actual setting data and electronic-circuit-component-group data, as in S53 implemented to select one of the feeder 230 nearest to the last used feeder 230. One of the trays 236 nearest to the last used tray 236 is selected from all of the trays 236 including those placed in a retracted zone located above the component supply position.

In the present embodiment, a portion of the control device 300 assigned to implement S53 and S55 constitutes a last-supplied-component-dependent selecting portion.

Where the two components selected as the mounted components to be mounted at respective two successive mounting positions are supplied from the respective component supplying devices of the different types, the component to be supplied from the feeder or tray located nearest to the former one of the two successive mounting positions may be selected as the component to be mounted at the latter mounting position.

The mounted component may be selected on the basis of the number of the electronic circuit components accommodated in the component supplying devices. An embodiment according to this modification will be described by reference to FIG. 22. The mechanical arrangement of the present electronic circuit component mounting system is identical with that of the embodiment shown in FIGS. 1–11, and will not be described.

In the present embodiment, the feeders loaded with the electronic circuit components are set on the tables 88 in the same manner as in the embodiment of FIG. 17. Namely, for each mounting position correlated with a group of electronic circuit components, the operator selects one of the kinds of these components belonging to this group, and sets the feeder loaded with the components of the selected kind on the table 88. The operator enters the slot number of the table 88 and the bar code of the selected kind of the components, so that actual setting data are obtained. In the mounting program, the groups of electronic circuit components are correlated with the respective mounting positions.

In the present embodiments, the number of the electronic circuit components left in the plurality of feeders 92 set on the tables 88 are counted, and monitored. For instance, the number of the components of the same kind left in each feeder are stored in the RAM 118 of the mounting control computer 112, in relation to the component identification codes, for example, the part ID data sets, and is decremented when each component has been supplied from that feeder. The number of the components left may be stored as part of the actual setting data, in relation to the part ID data set.

Figure 22:
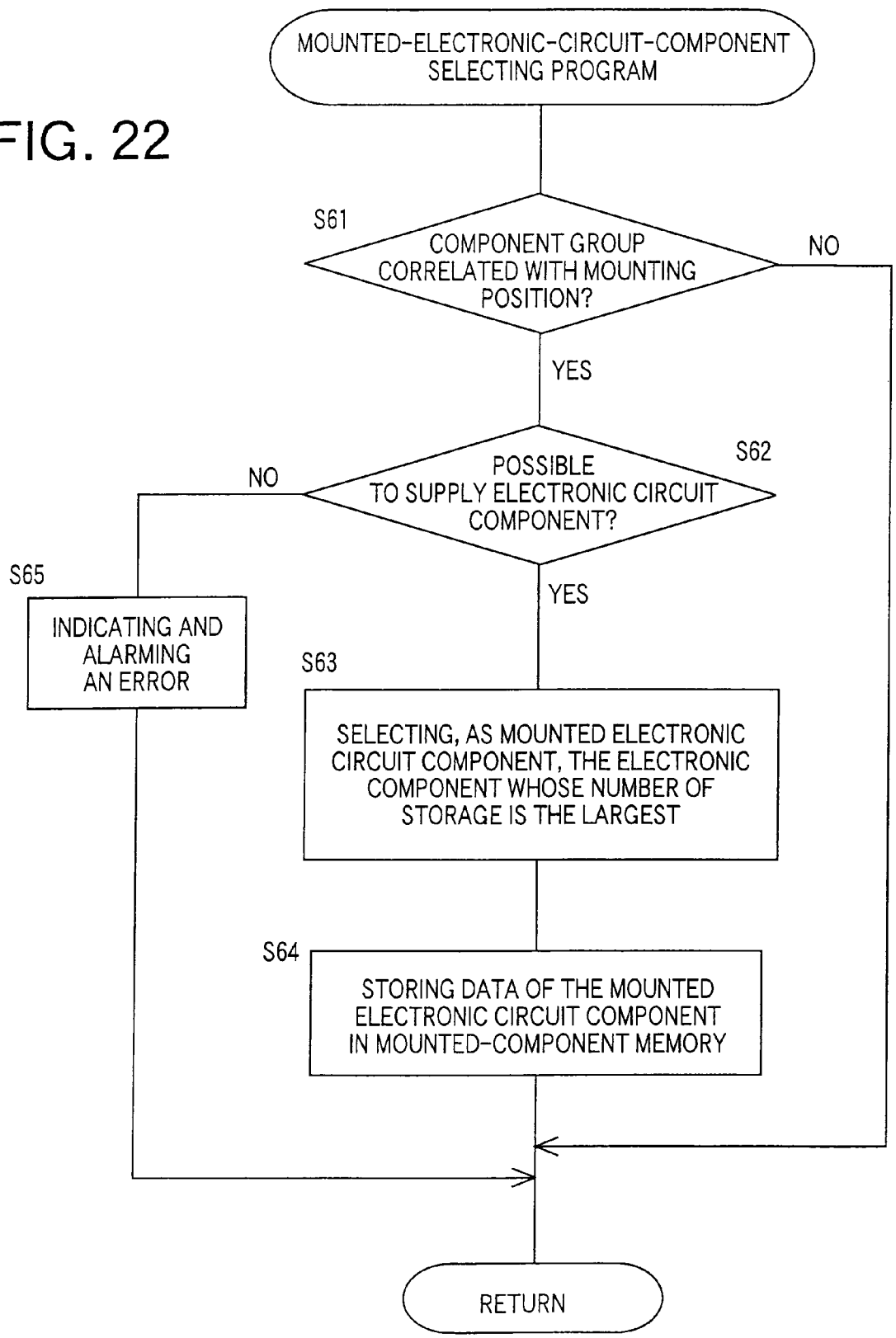
FIG. 22 is a flow chart illustrating a mounted-electronic-circuit-component selecting program executed in a mounting machine of an electronic circuit component mounting system according to a further embodiment of the present invention.

During the series of component mounting operation, portions of the mounting program which correspond to the respective mounting positions are sequentially read out, and a mounted-electronic-circuit-component selecting program shown in FIG. 22 is executed when the portion of the mounting program corresponding to each mounting position is read out. If a group of electronic circuit components is correlated with the mounting position corresponding to the read-out portion of the mounting program, an affirmative decision (YES) is obtained in S61, and the control flow goes to S62 to determine whether any one of the electronic circuit components of the group in question can be supplied from the component supply device 18, more specifically, whether any of the feeders 92 of the component supply device 18 can supply any one of the components of the group. It is determined that each feeder 92 cannot supply the corresponding kind of the components if the number of the components presently stored in that feeder 92 is equal to or smaller than a predetermined value, which may be zero or larger than zero. This determination is effected on the basis of the actual setting data, the electronic-circuit-component-group data and the above-indicated predetermined value of the number of the components left. A negative decision (NO) is obtained in S62, if any one of the feeders 92 of the component supply device 18 cannot supply any one of the components of the group in question, that is, if any one of the feeders 92 each loaded with any one of the components of the group correlated with the mounting position read in S62 is presently set on the table 88, or the number of the components stored in any of those feeders 92 if set on the table 88 is smaller than the predetermined value. In this case, S65 is implemented to indicate and alarm an error.

If at least one of the electronic circuit components belonging to the group in question is available from the feeder or feeders set in the component supply device 18, and if the number of the components stored in any such feeder or feeders is not smaller than the predetermined value, an affirmative decision (YES) is obtained in S62, and the control flow goes to S63 to select, as the mounted electronic circuit component, one of the at least one component of the group, which is set in the component supply device 18 and whose number of storage in the corresponding feeder 92 is the largest. Then, S64 is implemented to store data of the mounted electronic circuit component in the mounted-component memory, in relation to the mounting position in question.

In the present embodiment, a portion of the control device assigned to implement S62 constitutes an available-component selecting portion, while a portion of the control device assigned to implement S63 constitutes a largest-storage-component selecting portion.

The determination as to whether any one of the electronic circuit components belonging to a group can be supplied may be based on only the determination as to whether the component supply device 18 has been loaded with any of those components. This determination based on only the above-indicated determination as to whether any of the components is stored in the component supply device 18 is available where the component supply device 18 is held loaded with all of the components of each group, by replenishing the corresponding feeders with the appropriate kinds of components, during interruption of the component mounting operation, if the number of the components left in each of those feeders has become smaller than the predetermined value, for example.

In the preceding embodiments, the mounting program prepared by the mounting program preparing computer 150 and supplied to the mounting control computer 112 is formulated such that each mounting position is correlated with an electronic circuit component or a group of electronic circuit components. However, all of the mounting positions are correlated with respective electronic circuit components in the mounting program. In this case, the electronic-circuit-component-group data are used when the operation to mount the electronic circuit components on the printed-wiring board is performed. An embodiment according to this modification will be described by reference to FIG. 23. The mechanical arrangement of the present electronic circuit component mounting system is identical with that of the embodiment shown in FIGS. 1-11, and will not be described.

In the present embodiment, the mounting control computer 112 prepares a final mounting program on the basis of the mounting program supplied from the mounting program preparing computer 150 and the part data in the part data library 154. The final mounting program may be prepared by the mounting program preparing computer 150. Further, the setting data are supplied from the mounting program preparing computer 150 to the mounting control computer 112. In the present embodiment, the setting data correlate the setting positions with the respective electronic circuit components (part ID data sets), and the operator sets the feeders 92 loaded with the appropriate components at the predetermined slots on the tables 88.

Figure 23:
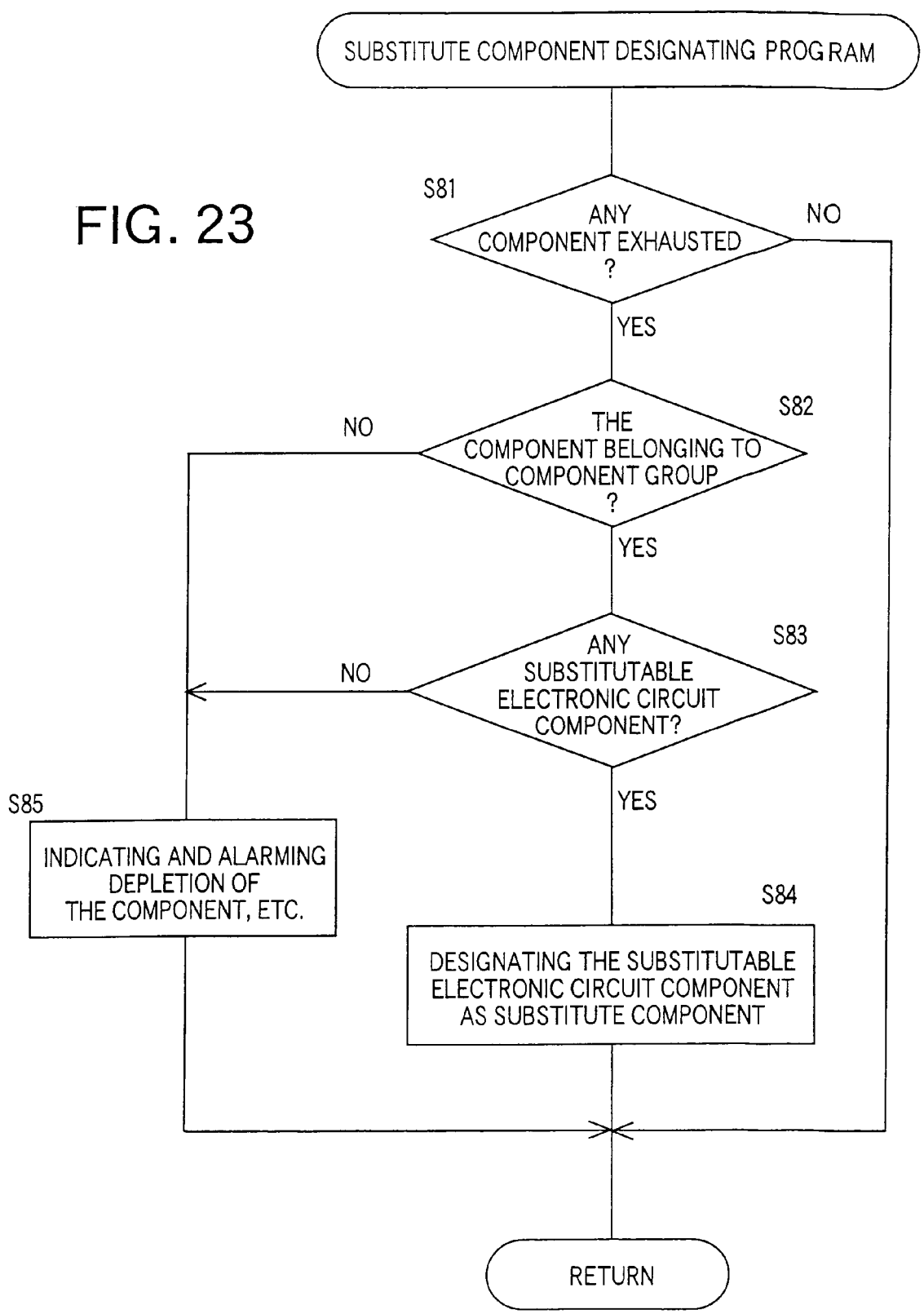
FIG. 23 is a flow chart illustrating a substitute component designating program executed in a mounting machine of an electronic circuit component mounting system according to a further embodiment of the present invention.

During the component mounting operation wherein the electronic circuit component mounting control program is executed by the control device, portions of the mounting program corresponding to the respective mounting positions are sequentially read out, and a substitute component designating program illustrated in FIG. 23 is executed when the portion of the mounting program corresponding to each mounting position is read out. The program is formulated to determine whether the electronic circuit component correlated to the mounting position in question has been exhausted. The exhaustion of the component can be detected in various manners. For example, where the components are supplied from component carrier tapes, each feeder is provided with a leading-end detector for detecting the leading end of the corresponding carrier tape, to determine that the component has been detected when the leading end of the corresponding carrier tape is detected. Alternatively, a failure of the component mounting head to receive the component at the component-receiving position is detected on the basis of an image taken by the component imaging device. If this failure takes place consecutively a predetermined number of times for the same feeder 92, it is determined that the component in question has been exhausted. Alternatively, each feeder 92 is provided, at its component supply portion, with a component detecting device arranged to detect the component located at the component supply portion. If the component at the component supply position is not detected by the component detecting device, it is determined that the component has been exhausted. A further alternative manner of detecting the exhaustion of the component is based on the number of the components left in the relevant feeder. In any case, component exhaustion data are correlated with the exhausted component and the corresponding setting position in the setting data, for example.

In S81 of the substitute component designating program, a determination is made as to whether the electronic circuit component correlated with the mounting position corresponding to the portion of the mounting program which has been read out has been exhausted. This determination is made on the basis of the setting data, depending upon whether the component exhaustion data are correlated with the component correlated with the mounting position in question. In the absence of the component exhaustion data, a negative decision (NO) is obtained in S81, and the execution of the program is terminated. In this case, the electronic circuit component correlated with the mounting position corresponding to the read-out portion of the mounting program is received from the component supply device 18, and mounted on the printed-wiring board 30.

In the presence of the component exhaustion data, an affirmative decision (YES) is obtained in S81, and the control flow goes to S82 to determine whether the electronic circuit component correlated with the mounting position in question belongs to any group of electronic circuit components. This determination is made on the basis of the electronic-circuit-component-group data in the part data library 154. If the component in question does not belong to any group of electronic circuit components, this means that there are no components substitutable for the component which has been exhausted. In this case, a negative decision (NO) is obtained in S82, and the control flow goes to S85 to indicate and alarm the exhaustion of the component in question, and display related data indicative of the exhausted component and the corresponding setting position, etc.

If the component which has been exhausted belongs to any group of electronic circuit components, an affirmative decision (YES) is obtained in S82, and the control flow goes to S83 to determine whether any one of the components of the group is substitutable for the exhausted component. This determination is effected on the basis of the setting data, depending upon whether any component substitutable for the exhausted component is set on the tables 88, more specifically, whether any electronic circuit component which belongs to the group in question and which is substitutable for the exhaust component is set at any setting position on the tables 88 and is presently available. If there exists any component substitutable for the exhausted component, an affirmative decision (YES) is obtained in S83, and the control flow goes to S84 in which the substitutable component is designated as a substitute component to be mounted in place of the exhausted component. If there are a plurality of substitutable components, one of these substitutable components is selected as the substitute component according to a predetermined rule. For example, one of the substitutable components which is supplied from the feeder 92 located nearest to the feeder 92 used for the exhausted component is designated as the substitute component. Alternatively, the selection of the substitute component from the two or more substitutable components may be made according to any other selecting rules on the basis of one or a combination of the effective term, order of priority of use and number of storage of the components, the distance of the corresponding feeders from the component supply position, etc. For instance, the electronic-circuit-component-group data stored in the part data library 154 include data indicative of the effective terms of the electronic circuit components belonging to each group, or the numbers of those components left in the corresponding feeders are monitored.

For example, the RAM of the mounting control computer 112 includes a substitute-component memory which stores data indicative of the substitute component to be substituted for the exhausted component, so that the substitute component is mounted at the mounting position corresponding to the exhausted component. The substitute-component memory also store data indicative of the setting position on the table 88 at which the feeder 92 accommodating the substitute component is set. In this case, the part data for the substitute component are read out from the part data library 154, and the final mounting program is prepared according to the part data, so that the substitute component is received from the component supply device 18 and mounted on the printed-wiring board 30. The original mounting program may be modified to substitute the designated substitute component for the exhausted component. Alternatively, a mounting program for the substitute component may be prepared so that the substitute component is mounted at the corresponding mounting position. Where the electronic circuit components are continuously mounted on a plurality of printed-wiring boards 30 of the same kind, the mounting program prepared for the same substitute components as designated for the same mounting positions on the previous printed-wiring board 30 may be used to receive those substitute components from the component supply device 18 and mount them at the same mounting positions on the present printed-wiring board 30. Further, the mounted-component memory may include data correlating the substitute components and the respective mounting positions.

In the present embodiment, the component detecting device constitutes a component exhaustion detecting portion, and a portion of the control device assigned to implement S84 constitutes a substitute-component designating portion.

In the preceding embodiment, a substitute component is designated for an electronic component which is originally assigned to be mounted at the corresponding mounting position and which has been exhausted or become unavailable from the component supply device, during the series of component mounting operation according to the sequentially read-out portions of the mounting programs which correspond to the respective mounting positions. However, the designation of the substitute components may be implemented prior to the initiation of the component mounting operation. An embodiment according to this modification will be described by reference to FIG. 24. The mechanical arrangement of the electronic circuit component mounting system according to this embodiment is identical with that shown in FIGS. 1–11, and will not be described.

In the present electronic circuit component mounting system, the mounting program is formulated to correlate a plurality of mounting positions on the printed-wiring board 30 with respective electronic circuit components, while the setting data are formulated to correlate the setting positions with respective electronic circuit components, for example. According to the setting data displayed, the operator sets the electronic circuit components on the tables 88. Where the electronic circuit component to be set at a certain setting position on the table 88 is out of stock, the operator checks to see whether the component out of stock belongs to any group of electronic circuit components. If the component out of stock belongs to any group, the operator selects one of the electronic circuit components of the group, and sets the selected component on the table 88. Thus, the operator sets on the table 88 a substitute component in place of the electronic circuit component which is originally assigned to be mounted at the predetermined setting position and which is not available or out of stock and is different in kind from the substitute component. In this case, the operator enters the slot number into the mounting control computer 112, and operates the bar code reader 146 to read the bar code of the electronic circuit component in question, so that the part ID data obtained from the bar code are stored in the mounting control computer 112, in relation to the slot number. Thus, actual setting data are obtained.

Alternatively, a person responsible for administering a production process prepares setting data on the basis of inventory data of the electronic circuit components, the numbers of the components left on the table, and electronic-circuit-component-group data, for example, and the operator is provided with the prepared setting data. The operator sets the electronic components on the tables 88, according to the setting data, so that the electronic circuit components designated by the setting data are set on the tables 88, at the respective setting positions designated by the setting data. In this case, the prepared setting data are actual setting data, and the bar codes of the components are not read. According to the actual setting data, substitute components are set on the table, in place of the electronic circuit components which are originally assigned to be mounted at the corresponding mounting positions according to the mounting program and which are out of stock.

Figure 24:
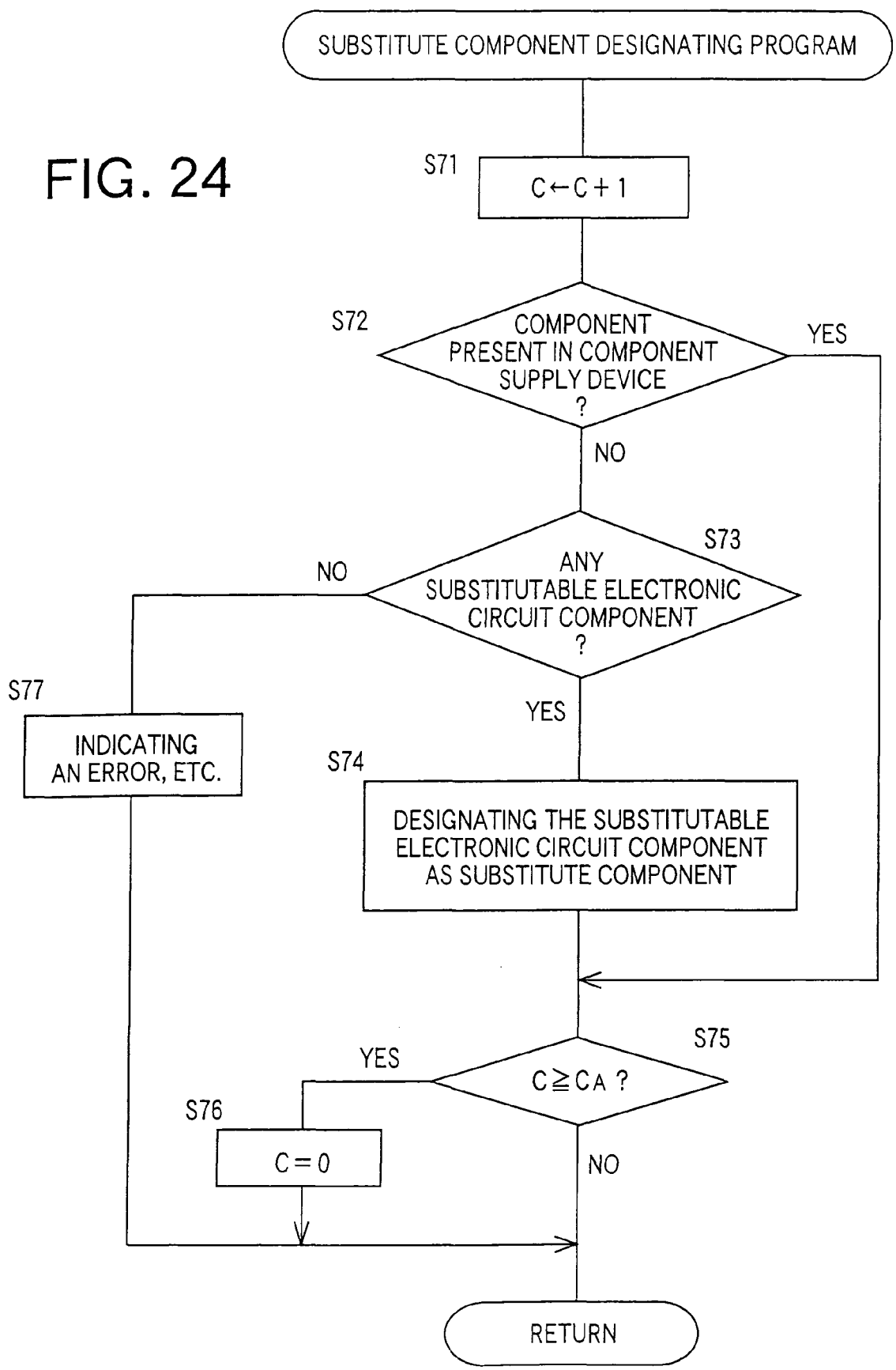
FIG. 24 is a flow chart illustrating a substitute component designating program executed in a mounting machine of an electronic circuit component mounting system according to a further embodiment of this invention.

Prior to initiation of a series of component mounting operation on a plurality of printed-wiring boards 30, a substitute component designating program illustrated in FIG. 24 is executed. This program is stored in the RAM of the mounting control computer 112. In S71 of the program, a count C of a counter provided to count the number of the mounting positions specified by the mounting program is incremented by "1". S72 is then implemented to read a portion of the mounting program which is correlated with the mounting position designated by the count C, and to determine whether the electronic circuit component correlated with the mounting position in question is present in the component supply device 18. This determination is made on the basis of the actual setting data. If the component in question is present in the component supply device, an affirmative decision (YES) is obtained in S72, and S75 is implemented to determine whether the present routine is executed for all of the mounting positions. A negative decision (NO) is obtained in S75 until the routine is executed for all of the mounting positions. One cycle of execution of the routine is terminated when the negative decision is obtained in S75.

If the electronic circuit component correlated with the mounting position in question is not present in the component supply device 18, a negative decision (NO) is obtained in S72, and S73 is implemented to determine whether there is any substitute component substitutable for the electronic circuit component in question. Since the present substitute component designating program is executed prior to the initiation of the operation to mount the electronic circuit components on the printed-wiring board, and since the component supply device 18 has been loaded with the electronic circuit components according to the setting data, a negative decision (NO) is obtained in S72 if the component in question belongs to a group of electronic circuit components and is out of stock, that is, if the substitute component has been set in the component supply device 18, in place of the component in question which is originally assigned to be mounted at the mounting position specified by the mounting program.

When the negative decision is obtained in S72, the control flow goes to S73 to determine whether any substitute component substitutable for the component in question is present, namely, whether any one of the electronic circuit components presently set on the tables belongs to the group to which the component in question belongs and is substitutable for the component in question which was found absent in the component supply device 18. This determination is based on the actual setting data and the electronic-circuit-component-group data. To this end, all of the electronic circuit components actually set on the tables 88 are checked to find any substitute component. If any substitute component is not present, a negative decision (NO) is obtained in S73, and S77 is implemented to indicate and alarm an error.

If any component substitutable for the component in question is present, an affirmative decision (YES) is obtained in S73, and S74 is implemented to designate the substitutable component as the substitute component. If a plurality of substitutable components are present, one of these substitutable components is selected as the substitute component, according to a predetermined rule, as in S84 described above. For example, S74 is formulated to select, as the substitute component, one of the substitutable components which is supplied from the feeder 92 located nearest to the feeder 92 which is used to supply the component to be mounted at the mounting position preceding the mounting position correlated with the component that was found absent. In the present embodiment, the component absent on the tables and the substitute component are stored in the substitute-component memory, in relation to each other, so that the substitute component is mounted at the mounting position correlated with the component absent on the tables. The substitute-component memory also store the setting position on the table 88 at which the feeder 92 accommodating the substitute component is set.

After the present substitute component designating program is executed, the part data sets identifying the substitute components are read out from the part data library 154, on the basis of the data stored in the substitute-component memory, prior to the initiation of the series of operation to mount the electronic circuit components on the printed-wiring boards. The final mounting program is prepared according to the part data sets for the substitute components, so as to replace the substitute components for the respective components which are not present on the tables, so that the substitute components are received from the appropriate feeders 92 of the component supply device 18, and mounted at the corresponding mounting positions on the printed-wiring board 30. The final mounting program may be prepared for all of the mounting positions, after the substitute component designating program is executed. Alternatively, the mounting program is prepared before the execution of the substitute component designating program, and the portions of the prepared mounting program which correspond to the mounting positions at which the substitute components are to be mounted are changed. In the latter case, modifying data sets corresponding to the substitute components may be stored together with the original mounting program prepared before the execution of the substitute component designating program, such that the modifying data sets are correlated with the respective mounting positions, or alternatively, the portions of the original mounting program which correspond to those mounting positions may be changed into modifying data sets.

In the present embodiment, a portion of the control device assigned to implement S74 constitutes the substitute-component designating portion.

In the embodiment described above, one of the electronic circuit components which are actually set in the component supply device and which are assigned to be mounted at the respective mounting positions according to the mounting program may be selected as the substitute component, on the basis of the actual setting data.

In each of the preceding embodiments, the mounting-program-related data and the mounting program are prepared by the mounting program preparing computer 150. However, at least one of the mounting-program-related data and the mounting program may be prepared by the assembling line administering computer 140, or by the mounting control computer 112 of the electronic circuit component mounting system 12. The assembling line administering computer 140 may function as the mounting program preparing computer 150. Where only one electronic circuit component mounting system is provided and does not constitutes an assembling line, it is not necessary to allocate the mounting positions on the circuit substrate and the corresponding electronic circuit components, to a plurality of component mounting systems, so that the original data are used as the design data and the original mounting program, and the substitution design data and actual mounting program are prepared by the mounting program preparing computer. The mounting control computer may be arranged to perform all operations including the preparation of the mounting-program-related data, the preparation and processing of the mounting program, and the control of the component mounting operation.

The mounting-program-related data may be prepared by reading the entirety of the part data and electronic-circuit-component-group data stored in the part data library 154, into a memory of the RAM of the mounting program preparing computer 150, and the part data thus stored in the RAM are scanned to replace the appropriate part data sets with the corresponding electronic-circuit-component-group data sets. In this case, the memory of the RAM of the computer 150 in which the electronic-circuit-component-group data are stored constitutes a component-group memory.

It is also possible to store the entirety or a necessary portion of the data stored in the part data library 154, into a component-data memory of the RAM of the mounting control computer 112, for preparing the mounting-program-related data. In this case, the RAM of the mounting control computer 112 constitutes the component-group memory.

The order of mounting and the order of setting of the electronic circuit components may be determined by each of a plurality of mounting machines which constitutes an assembling line. In this case, the mounting program is prepared such that the mounting positions are allocated to the mounting machines.

Where one of a plurality of electronic circuit components belonging to a group of components is automatically selected as the mounted electronic circuit component according to a predetermined rule, the selection may be made on the basis of only one of the order of priority of use, effective term and order number, rather than a combination of those conditions of use. Where the mounted electronic circuit components are selected upon preparation of the mounting program, the selection may be made on the basis of the numbers of the components left in the component supply device.

The automatic selection of the mounted electronic circuit components may be made by the assembling line administering computer 140 or the mounting control computer 112 of the electronic circuit component mounting system 12. In this case, the data necessary to make the selection are read out from the part data library 154. The part data and electronic-circuit-component-group data may be read out from the part data library 154 and stored in the RAM of the computer prior to the selection.

Where one of a plurality of electronic circuit components belonging to a group correlated to a mounting position is selected as the mounted electronic circuit component, a determination as to whether any of the components of the group can be actually supplied from any one of a plurality of supplying devices of the component supply device may be made as an additional condition to be satisfied to select one of the components of the group as the mounted electronic circuit component. This determination may be the only condition to be satisfied to select one of the components as the mounted component, or may be combined with any other condition. The determination as to whether an electronic circuit component can be actually supplied from any component supply device may be made by determining whether that component is set in the component supply device, or whether the component is set in the component supply device and has not been exhausted.

Where a setting position is correlated with a group of electronic circuit components, it is not essential to display the setting data which correlate the electronic circuit components of the group and the setting positions of the feeders 92 to be loaded with the respective components. For instance, the operator may be provided with a component setting check list indicating the plurality of electronic circuit components of each group and the kinds of the feeders 92 to be loaded with those components, so that the operator can load the feeders with the electronic circuit components of the group, while the mounting control computer 112 which stores component-feeder setting data correlating the components and the kinds of the feeders to be loaded with the components is operating to prevent erroneous loading of the feeders, referring to the setting data, the part data library 154 and the component-feeder setting data.

The substitution data may be prepared by manual data entry by the operator. For instance, the operator manually enters the coordinate values of the mounting positions on the printing-wiring board, for giving a component identification code to each of the mounting positions, correlating each component identification code with an appropriate part data set, and substituting an electronic-circuit-component-group data set for each part data set which identifies an electronic circuit component belonging to any group of components.

In the illustrated embodiments, each electronic-circuit-component group and a plurality of electronic circuit components belonging to that group are identified by respective identification codes. However, part data sets identifying the respective electronic circuit components may be stored in relation to the identification code of the electronic-circuit-component group.

It is also noted that the present invention may be embodied so as to combine some of the features of the plurality of embodiments described above. Further, the electronic circuit component mounting system, the system for processing the mounting-program-related data, and the erroneous setting preventing system may be arranged such that each of the programs described above can be executed in a selected one of a plurality of modes. In this case, the selection of the mode of execution of each program may be made by the operator or according to a command generated from a host computer.

The features of the present invention are equally applicable to an electronic circuit component mounting system, irrespective of the type of the electronic circuit component mounting machine, that is, whether the mounting machine has component mounting heads which are turned about an axis to receive and mount the electronic circuit components, or a component mounting head which is moved to desired positions in the XY coordinate system to receive and mount the electronic circuit components.

While the several embodiments of the present invention have been described in detail, for illustrative purpose only, it is to be understood that the present invention may be embodied with various changes, modifications and improvements, such as those described in the SUMMARY OF THE INVENTION, which may occur to those skilled in the art.

The invention claimed is:

1. An electronic circuit component mounting system comprising:
   a substrate holding device for holding a circuit substrate;
   a component supply device for supplying electronic circuit components;
   a mounting device for receiving the electronic circuit components from the component supply device and mounting the electronic circuit components at a plurality of mounting positions on the circuit substrate held by said substrate holding device;
   a component-group memory for storing group data indicative of at least one electronic-circuit-component group each consisting of a plurality of different electronic circuit components;
   a program memory for storing a mounting program which correlates selected ones of said plurality of mounting positions on said circuit substrate, with respective ones of the electronic circuit components to be respectively mounted at the mounting positions, and which correlates each of at least one of said plurality of mounting positions which is other than said selected ones, with one of said at least one electronic-circuit-component group; and
   a control device for controlling said mounting device, according to said mounting program, to mount said respective ones of the electronic circuit components at said selected ones of the mounting positions correlated with said respective electronic circuit components, and to mount one of the electronic circuit components belonging to said one electronic-circuit-component group, at each mounting position correlated with said one electronic-circuit-component group.

2. The electronic circuit component mounting system according to claim 1, wherein said control device includes a mounted-component selecting portion operable when each one of said plurality of mounting positions is correlated with one of said at least one electronic-circuit-component group, said mounted-component selecting portion selecting, as a mounted electronic circuit component to be mounted at said one mounting position, one of the plurality of different electronic circuit components belonging to said one electronic-circuit-component group, according to a predetermined rule.

3. The electronic circuit component mounting system according to claim 2, wherein said component-group memory stores data indicative of an order of priority of the plurality of different electronic circuit components belonging to each of said at least one electronic-circuit-component group, and said mounted-component selecting portion selects the electronic circuit components of each group, as said mounted electronic circuit component, in said order of priority.

4. The electronic circuit component mounting system according to claim 2, wherein said component-group memory stores data indicative of an effective term of use of each of the plurality of different electronic circuit components which belong to each of said at least one electronic-circuit-component group, and said mounted-component selecting portion includes:
  a present-time obtaining portion for obtaining a present time; and
  a component-mounting inhibiting portion for inhibiting mounting of any one of the different electronic circuit components of said each electronic-circuit component group the effective term of which has expired prior to the present time obtained by said present-time obtaining portion.

5. The electronic circuit component mounting system according to claim 2, wherein said component-group memory stores data indicative of identification numbers of the plurality of different electronic circuit components belonging to each of said at least one electronic-circuit-component group, and said mounted-component selecting portion includes:
  a mounting-inhibiting-number obtaining portion for obtaining a mounting-inhibiting number which is the identification number of each electronic circuit component of said each electronic-circuit component group, which is not presently permitted to be mounted at the corresponding mounting position; and
  a component-mounting inhibiting portion for inhibiting mounting of a mounting-inhibited component of said each electronic-circuit component group which has the mounting-inhibiting number obtained by said mounting-inhibiting-number obtaining portion.

6. The electronic circuit component mounting system according to claim 2, wherein said component supply device includes:
  a plurality of feeders each accommodating a multiplicity of electronic circuit components of one kind and arranged to feed these electronic circuit components to a predetermined fixed component supply portion;
  a table on which the feeders are set such that the component supply portions of the feeders are arranged along a line; and
  a table drive device for moving the table in a direction parallel to said line, to position the component supply portion of each of said plurality of feeders to a predetermined component supply position,
  and wherein said mounted-component selecting portion includes a proximity-component selecting portion for selecting, as said mounted electronic circuit component, one of the plurality of different electronic circuit components belonging to said one electronic-circuit-component group, which is to be supplied from the feeder that is presently located nearest to said component supply position.

7. The electronic circuit component mounting system according to claim 2, wherein said component supply device includes:
  a plurality of feeders each accommodating a multiplicity of electronic circuit components of one kind and arranged to feed these electronic circuit components to a predetermined fixed component supply portion; and
  a table which is fixedly disposed and on which the feeders are set such that the component supply portions of the feeders are arranged along a line,
  and wherein said mounted-component selecting portion includes a last-supplied-component-dependent selecting portion for selecting, as said mounted electronic circuit component, one of the plurality of different electronic circuit components belonging to said one electronic-circuit-component group, which is to be supplied from the feeder that is presently located nearest to the feeder from which the last electronic component was supplied.

8. The electronic circuit component mounting system according to claim 2, wherein said component supply device includes a plurality of component supplying devices each accommodating a multiplicity of electronic circuit components of one kind and arranged to feed these electronic circuit components one after another, and said mounted-component selecting portion includes an available-component selecting portion for selecting, as said mounted electronic circuit component, one of the plurality of different electronic circuit components belonging to each of said at least one electronic-circuit-component group, which can be actually supplied from a corresponding one of said plurality of component supplying devices.

9. The electronic circuit component mounting system according to claim 2, wherein said component supply device includes a plurality of component supplying devices each accommodating a multiplicity of electronic circuit components of one kind and arranged to feed these electronic circuit components one after another, and said mounted-component selecting portion includes a largest-storage-component selecting portion for selecting, as said mounted electronic circuit component, one of the plurality of different electronic circuit components belonging to each of said at least one electronic-circuit-component group, which is actually accommodated by a largest number in a corresponding one of said plurality of component supplying devices.

10. The electronic circuit component mounting system according to claim 1, wherein said control device includes a mounted-component memory for storing data indicative of a mounted electronic circuit component which is a selected one of the electronic circuit components belonging to each of said at least one electronic-circuit-component group and which is to be actually mounted by said mounting device.

11. An electronic circuit component mounting control program executed by a computer constituting a principal part of a control device of an electronic circuit component mounting system including a substrate holding device for holding a circuit substrate, a component supply device for supplying electronic circuit components, and a mounting device controlled by said control device to receive the electronic circuit components from the component supply device and mount the electronic circuit components at a plurality of mounting positions on the circuit substrate held by said substrate holding device, said control program comprising:
  a mounting-program reading step of sequentially reading out, one after another from a program memory, portions of a mounting program respectively corresponding to a plurality of mounting positions on the circuit substrate, said mounting program correlating selected ones of the mounting positions with respective ones of the electronic circuit components to be respectively mounted at the mounting positions, and correlating each of at least one of said mounting positions which is other than said selected ones, with one of at least one electronic-circuit-component group each consisting of a plurality of different electronic circuit components; and a mounting control step implemented when the mounting position corresponding to one of said portions of the mounting program which has been read out in said mounting-program reading step is correlated with said one electronic-circuit-component group, to refer to a component-group memory storing data of said at least one electronic-circuit-component group, and control said mounting device to receive from said component supply device one of the plurality of different electronic circuit components belonging to said one electronic-circuit-component group in the component-group memory, and mount said one electronic circuit component on the circuit substrate held by said substrate holding device.

12. An electronic-circuit-component-mounting-program-related-data processing system for processing a mounting-program-related data relating to a mounting program for controlling an operation of an electronic circuit component mounting system wherein electronic circuit components supplied from a component supply device are received by a mounting device, and mounted by said mounting device at a plurality of mounting positions on a circuit substrate held by a substrate holding device, said electronic-circuit-component-mounting-program-related-data processing system comprising:

a component-group memory for storing group data indicative of at least one electronic-circuit-component group each consisting of a plurality of different electronic circuit components;

a related-data memory for storing mounting-program-related data which correlate selected ones of said plurality of mounting positions on said circuit substrate, with respective ones of the electronic circuit components to be respectively mounted at the mounting positions, and which correlate each of at least one of said plurality of mounting positions which is other than said selected ones, with one of said at least one electronic-circuit-component group; and a processing portion for processing said mounting-program-related data, such that said respective ones of the electronic circuit components, are mounted at said selected ones of the mounting positions correlated with said respective electronic circuit components and one of the different electronic circuit components belonging to said one electronic-circuit-component group is mounted at each mounting position correlated with said one electronic-circuit-component group.

13. A mounting-program-related-data preparing method for preparing a mounting-program-related data relating to a mounting program executed by a computer which constitutes a principal part of a control device of an electronic circuit component mounting system including a substrate holding device for holding a circuit substrate, a component supply device for supplying electronic circuit components, and a mounting device controlled by said control device to receive the electronic circuit components from the component supply device and mount the electronic circuit components on the circuit substrate held by said substrate holding device, said mounting-program-related-data preparing method comprising:

an original-data storing step of storing in an original-data memory original data which correlate each of a plurality of mounting positions on said circuit substrate, with a corresponding one of the electronic circuit components of a plurality of kinds to be respectively mounted at the mounting positions;

an electronic-circuit-component-group-data storing step of storing in a component-group memory group data indicative of at least one electronic-circuit-component group each consisting of a plurality of mutually substitutable different electronic circuit components; and a replacing step of determining whether each of the electronic circuit components of said original data stored in said original-data memory belongs to any one of said at least one electronic-circuit-component group of the group data stored in said component-group memory, and when said each of the electronic circuit components belongs to any one of said at least one electronic-circuit-component group, replacing said each electronic circuit component with said one electronic-circuit-component group to which said each electronic circuit component belongs, whereby said original data are replaced by substitution data wherein data of each electronic circuit component of said original data which belongs to any one of said at least one electronic circuit component group of said group data are replaced with the electronic-circuit-component group to which said each electronic circuit component belongs.

14. The mounting-program-related-data preparing method according to claim 13, wherein said replacing step is implemented to replace said each electronic circuit component with the electronic-circuit-component group to which said each electronic circuit component belongs, when said each electronic circuit component has been exhausted in said component supply device, during an operation of said mounting device to mount the electronic circuit components on said circuit substrate under the control of said control device.

15. The mounting-program-related-data preparing method according to claim 13, wherein said replacing step comprises selecting, as a mounted component to be mounted on said circuit substrate, one of said plurality of mutually substitutable different electronic circuit components of said one electronic-circuit-component group, according to a predetermined rule, and replacing said electronic circuit component with said mounted component.

16. The mounting-program-related-data preparing method according to claim 15, further comprising a step of storing in said component-group memory data indicative of an order of priority of said plurality of mutually substitutable different electronic circuit components of each electronic-circuit-component group, and wherein said replacing step comprises selecting one of the plurality of mutually substitutable different electronic circuit components of said one electronic-circuit-component group, as said mounted component, in said order of priority.

17. The mounting-program-related-data preparing method according to claim 15, further comprising a step of storing in said component-group memory data indicative of an effective term of use of each of said plurality of mutually substitutable different electronic circuit components of each electronic-circuit-component group, and wherein said replacing step comprises inhibiting selection, as said mounted component, of any one of the plurality of mutually substitutable different electronic circuit components of said each electronic-circuit-component group the effective term of use of which is expired.

18. The mounting-program-related-data preparing method according to claim 15, further comprising a step of storing in said component-group memory data indicative of identification numbers of said plurality of mutually substitutable different electronic circuit components of each electronic-circuit-component group, and a step of obtaining a mounting-inhibiting number which is the identification number of each electronic circuit component of said each electronic-circuit-component group, which is not permitted to be mounted on said circuit substrate, and wherein said replacing step comprises inhibiting selection, as said mounted component, of any one of the plurality of mutually substitutable different electronic circuit components of said each electronic-circuit-component group which has the obtained mounting-inhibiting number.

19. The mounting-program related data preparing method according to claim 15, wherein said component supply device includes: a plurality of feeders each accommodating a multiplicity of electronic circuit components of one kind and arranged to feed these electronic components to a predetermined fixed component supply portion; a table on which the feeders are set such that the component supply portions of the feeders are arranged along a line; and a table drive device for moving the table in a direction parallel to said line, to position the component supply portion of each of said plurality of feeders to a predetermined component supply position, and wherein said replacing step comprises selecting, as said mounted component, one of said plurality of mutually substitutable different electronic circuit components of said each electronic-circuit-component group, which one component is to be supplied from the feeder that is presently located nearest to said component supply position.

20. The mounting-program-related-data preparing method according to claim 15, wherein said component supply device includes: a plurality of feeders each accommodating a multiplicity of electronic circuit components of one kind and arranged to feed these electronic circuit components to a predetermined fixed component supply portion; and a table which is fixedly disposed and on which the feeders are set such that the component supply portion of the feeders are arranged along a line, and wherein said replacing step comprises selecting, as said mounted component, one of said plurality of mutually substitutable different electronic circuit components of said each electronic-circuit-component group, which one component is to be supplied from the feeder that is presently located nearest to the feeder from which the last electronic component was supplied.

21. The mounting-program-related-data preparing method according to claim 15, wherein said component supply device includes a plurality of component supplying devices each accommodating a multiplicity of electronic circuit components of one kind and arranged to feed these electronic circuit components one after another, and said replacing step compromises selecting, as said mounted component, one of said plurality of mutually substitutable different electronic circuit components of said each electronic-circuit-component group, which one component can be actually supplied from a corresponding one of said plurality of component supplying devices.

22. The mounting-program-related-data preparing method according to claim 15, wherein said component supply device includes a plurality of component supplying devices each accommodating a multiplicity of electronic circuit components of one kind and arranged to feed these electronic circuit components one after another, and said replacing step comprises selecting, as said mounted component, one of said plurality of mutually substitutable different electronic circuit components of said each electronic-circuit-component group, which one component is actually accommodated by a largest number in a corresponding one of said plurality of component supplying devices.

23. The mounting-program-related-data preparing method according to claim 15, further comprising a step of storing in a mounted-component memory data indicative of said mounted component which is to be mounted on said circuit substrate by said mounting device.

24. Mounting-program-related data stored in a memory such that the stored mounting-program-related data are readable by a computer, wherein data sets indicative of selected ones of a plurality of mounting positions on a circuit substrate are correlated with respective data sets indicative of a plurality of kinds of electronic circuit components to be mounted at said selected ones of said mounting positions, and wherein each of at least one data set indicative of at least one of said plurality of mounting positions which is other than said selected ones is correlated with a data set indicative of an electronic-circuit-component group consisting of a plurality of electronic circuit components that are permitted to be mounted at a corresponding one of said at least one mounting position.

25. An electronic circuit component mounting method of mounting electronic circuit components on a circuit substrate by an electronic circuit component mounting system including a substrate holding device for holding a circuit substrate, a component supply device for supplying electronic circuit components, a control device, and a mounting device controlled by said control device to receive the electronic circuit components from the component supply device and mount the electronic circuit components on the circuit substrate held by said substrate holding device, said electronic circuit component mounting method comprising:

an original-data storing step of storing step of storing in an original-data memory original data which correlate each of a plurality of mounting positions on said circuit substrate, with a corresponding one of the electronic circuit components of a plurality of kinds to be respectively mounted at the mounting positions;

an electronic-circuit-component-group-data storing in a component-group data memory group data indicative of at least one electronic-circuit-component group each consisting of a plurality of mutually substitutable different electronic circuit components;

a replacing step of determining whether each of the electronic circuit components of said original data stored in said original-data memory belongs to any one of said at least one electronic-circuit-component group of the group data stored in said component-group data memory, and when said each of the electronic circuit components belongs to any one of said at least one electronic-circuit-component group, replacing said each electronic circuit component with one of said plurality of mutually substitutable different electronic circuit components of said one electronic-circuit-component group, which is other than said each electronic circuit component of said original data; and a mounting step of mounting the electronic components on said circuit substrate, according to said original data, and substitution data which are substituted for said original data in said replacing step.

* * * * *